United States Patent [19]
Gallagher et al.

[11] Patent Number: 5,971,804
[45] Date of Patent: Oct. 26, 1999

[54] BACKPLANE HAVING STRIP TRANSMISSION LINE ETHERNET BUS

[75] Inventors: Brian Gallagher, Marlboro; Nikolai Markovich, Hopkinton, both of Mass.

[73] Assignee: EMC Corporation, Hopkinton, Mass.

[21] Appl. No.: 08/885,381

[22] Filed: Jun. 30, 1997

[51] Int. Cl.$^6$ .................................. H01R 9/05; H01P 3/08
[52] U.S. Cl. ........................ 439/581; 333/238; 333/246
[58] Field of Search .................................. 361/788, 792, 361/794, 795, 784, 785; 333/104, 116, 123, 124, 160, 161, 206, 243, 246, 247, 238; 439/63, 578, 581, 607, 608, 944; 174/28, 102 C, 102 SP; 395/280–284, 287, 821; 364/240, 240.1, 240.2, 240.3, 240.4, 240.5, 240.6, 240.7

[56] References Cited

U.S. PATENT DOCUMENTS

| | | | |
|---|---|---|---|
| 5,351,019 | 9/1994 | McHugh et al. | 333/24 R |
| 5,546,378 | 8/1996 | Wirth et al. | 370/223 |
| 5,676,553 | 10/1997 | Leung | 439/74 |

*Primary Examiner*—Leo P. Picard
*Assistant Examiner*—John B. Vigushin

*Attorney, Agent, or Firm*—Fish & Richardson P.C.

[57] ABSTRACT

A data server having a plurality of hot replaceable processing unit modules. Each module includes a motherboard having plugged therein: a CPU; a main memory; an I/O adapter card, and an interconnect printed board, electrically connected to the motherboard. A backplane has a first connector adapted for coupling to a DC power supply. The interconnect printed circuit board has a DC to DC converter connected to a second connector adapted to mate with the first connector to enable the processing unit module to be hot plugged into, or removed from, the backplane. The backplane has formed thereon a strip transmission line adapted to provide an Ethernet bus for interconnecting a plurality of the modules. A cable management system for a cabinet used to house the module includes at least one vertically extending channel disposed in the cabinet and a fastener adapted to open and enable the a cable to be inserted into the channel and close to retain such cable within the channel. A chassis having a plurality of shelves for supporting electrical modules with a partitioning member adapted for removable insertion onto one of the shelves to accommodate modules with different widths. An I/O adapter card mounting plate, with captive hardware, adapted for securing an array of I/O adapted cards, and honey-combed I/O adapter card filler plate to a case. A method for booting operating system software into a main memory of a processing unit.

5 Claims, 44 Drawing Sheets

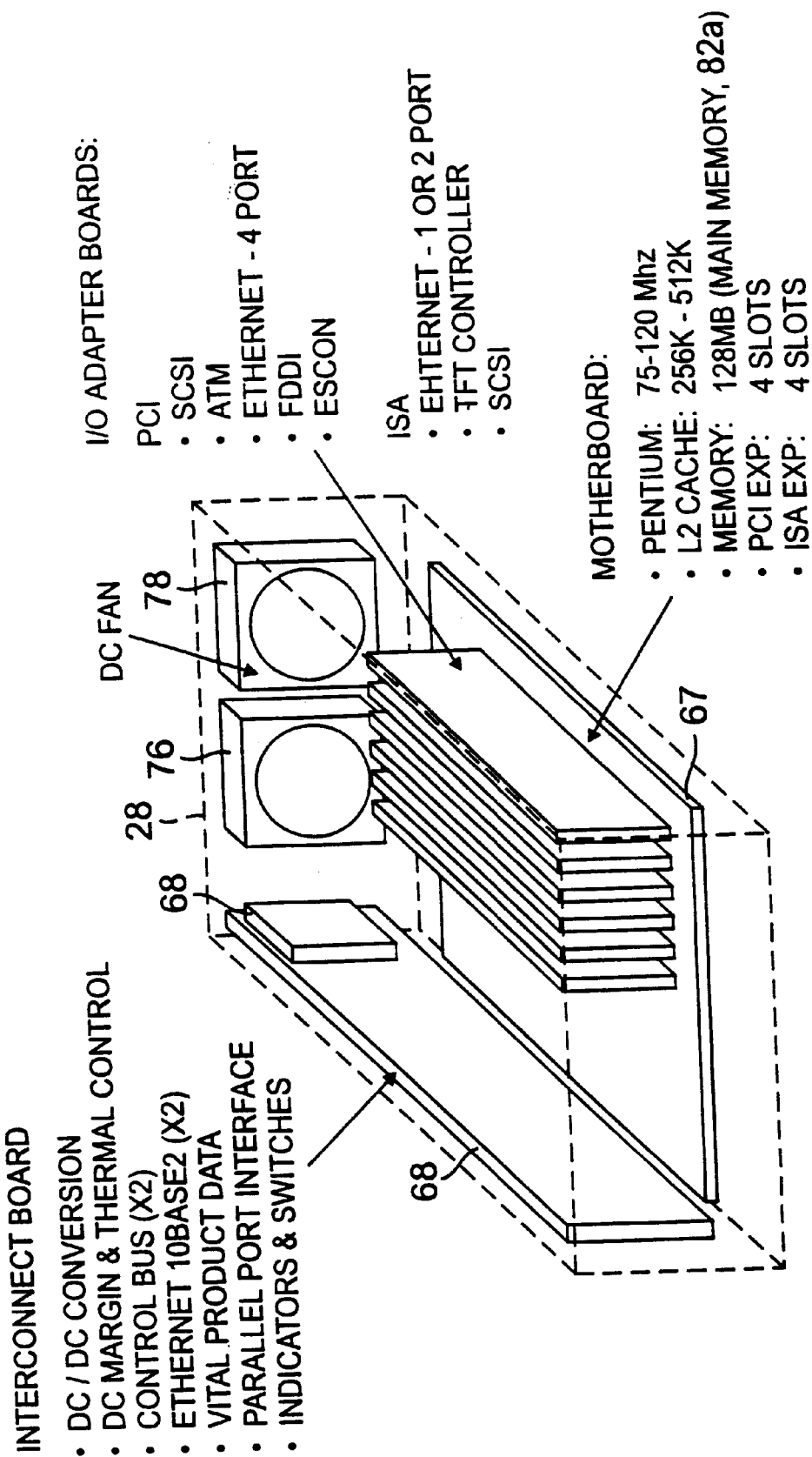

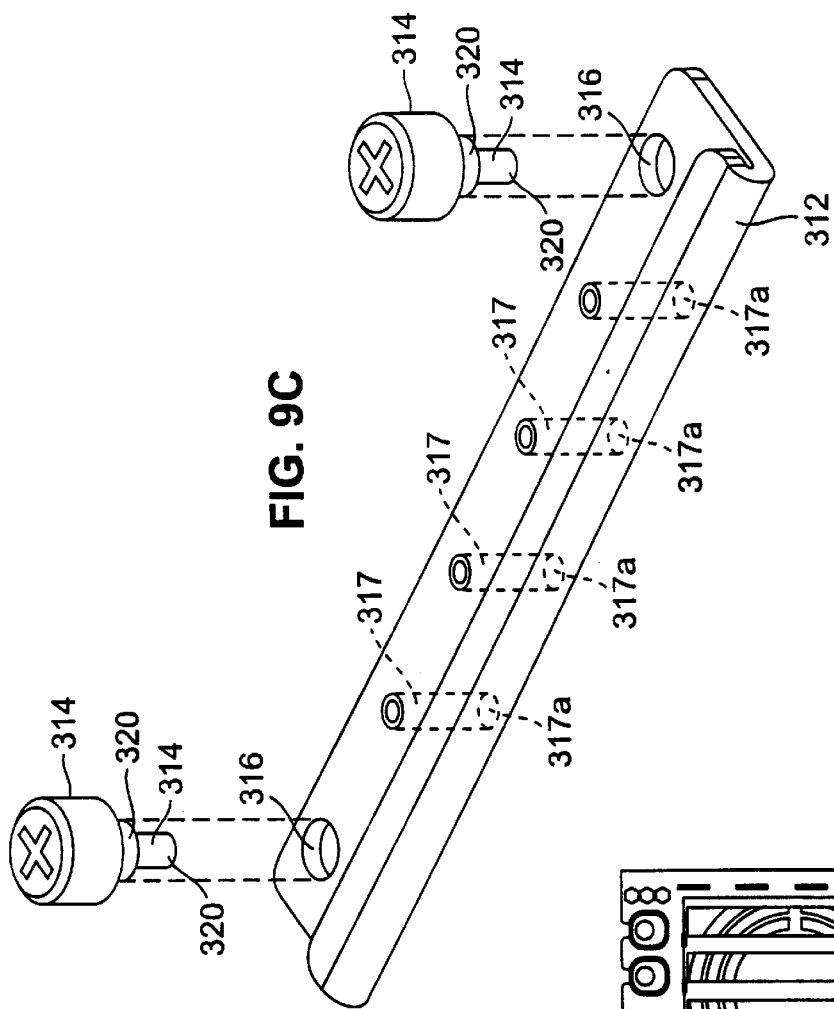
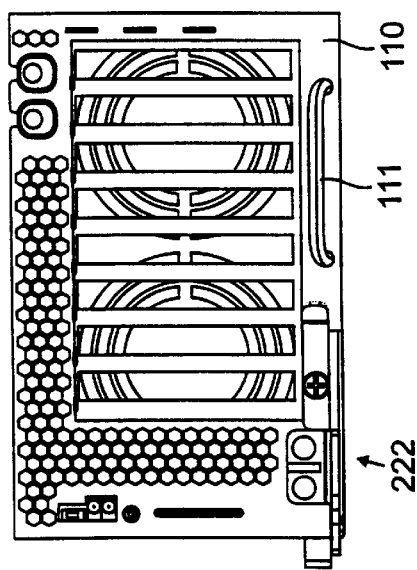

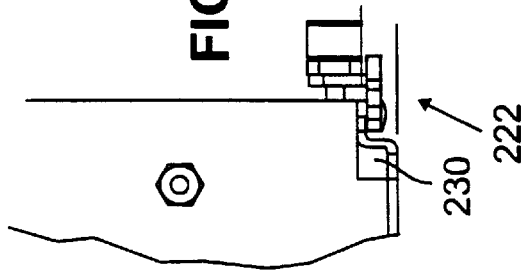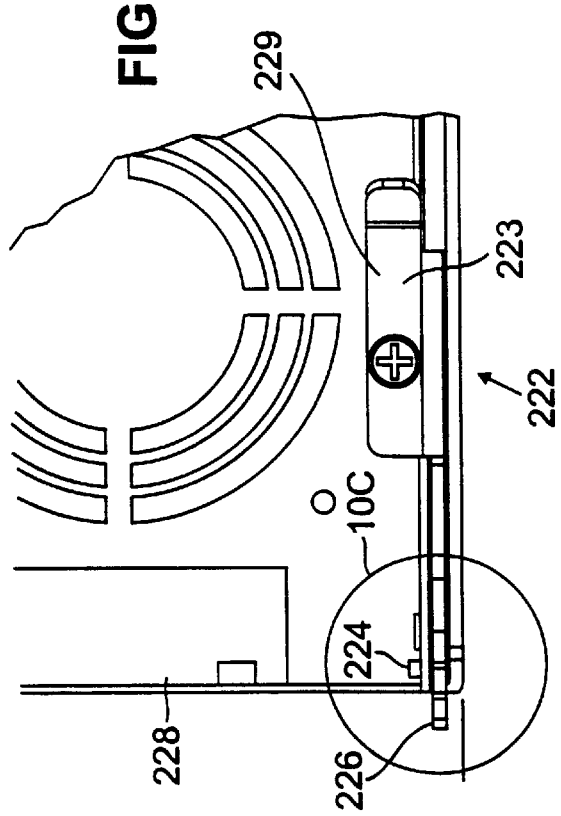

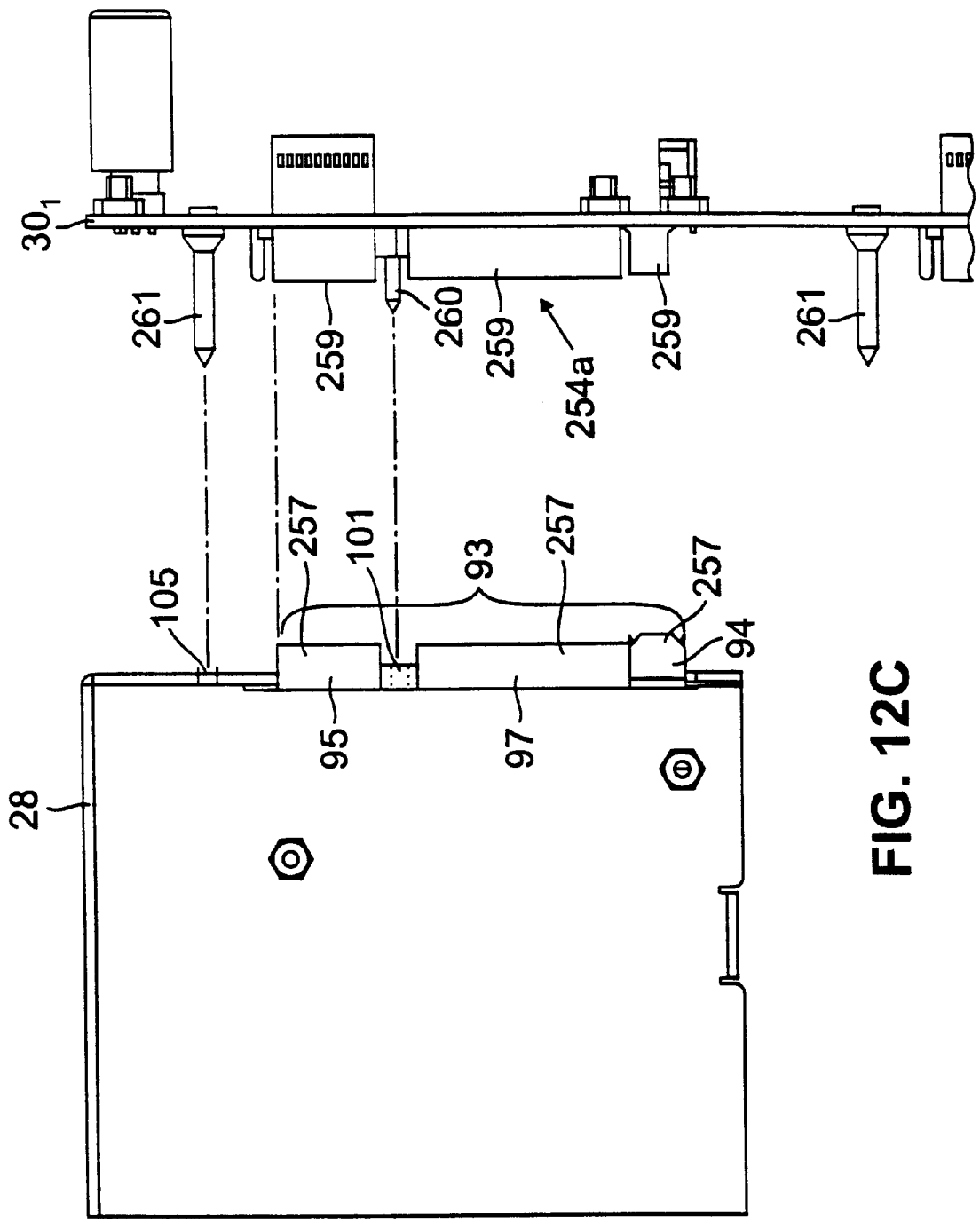

BACKPLANE HAVING STRIP TRANSMISSION LINE ETHERNET BUS

BACKGROUND OF THE INVENTION

This invention relates generally to data servers and more particularly to data servers adapted to move data between a network and a data storage system.

As is known in the art, data servers are used to move data between a storage system, such as between a Symmetrix Integrated Cached Disk Array storage system and a network.

The data server typically includes a set AC powered processing unit modules each of which includes a central processing unit (CPU), input/output (I/O) adapter cards, and a main memory programmed to run a variety of software application programs for subscribers to the network. These applications include file access, video access and/or network backup. In one such data server, a set of five, AC powered, personal computers (PCs) are packaged inside a standard 19 inch cabinet. The five PCs are connected together via a twisted pair cable to an Ethernet hub. A laptop PC is used as a control station for the other PCs. A keyboard/monitor multiplexer (mux) was used to pass each PC's boot sequence with a single keyboard and monitor.

SUMMARY OF THE INVENTION

In accordance with one feature of the invention, a data server is provided having a plurality of hot replaceable processing unit modules. Each one of the processing unit modules includes a CPU, main memory and I/O adapter card.

In a preferred embodiment of the invention, the data server includes a backplane having a first electrical connector adapted for coupling to a DC power supply. Each one of the processing unit modules is DC powered. The module includes a motherboard having plugged therein: the CPU; the main memory; and the I/O adapter card. The module includes an interconnect printed board, electrically connected to the motherboard. The interconnect printed circuit board has mounted to it a second electrical connector and a DC to DC converter electrically connected to the second electrical connector. The second electrical connector is adapted to mate with the first electrical connector to enable the processing unit module to be hot plugged into, or removed from, the backplane.

In accordance with another feature of the invention, a data server is provided having a cabinet with a plurality of slots, or compartments therein. Each one of the slots has a backplane disposed at the rear thereof. A plurality of hot replaceable, DC powered processing unit modules is provided. Each one of the modules is adapted to be inserted in, or removed from, a corresponding one of the slots as such one of the processing unit modules is plugged into, or unplugged from the backplane.

In accordance with another feature of the invention a printed circuit board is provided with a pair of overlying strip conductors forming a strip transmission line. The strip transmission line is configured with electrical characteristics of a coaxial transmission line.

In a preferred embodiment of the invention, the AC impedance and DC resistance of the strip transmission line are selected to configure the strip transmission line as an Ethernet coaxial transmission line.

In accordance with another feature of the invention, a printed circuit backplane is provided having an electrical connector adapted to mate with, and electrically connect to, an electrical connector of a daughterboard. The backplane has a pair of overlying strip conductors forming a strip transmission line. The strip transmission line is configured with electrical characteristics of a coaxial transmission line. In a preferred embodiment of the invention, the AC impedance and DC resistance of the strip transmission line are selected to configure the strip transmission line as an Ethernet coaxial transmission line.

In accordance with another feature of the invention, a backplane is provided having a first electrical connector mounted thereto adapted to have plugged therein a daughterboard. The daughterboard has a second electrical connector adapted to mate with, and electrically connect to, the first electrical connector. The backplane has a first strip conductor disposed on one a surface of a dielectric substrate thereof and a second strip conductor on an opposite surface of the dielectric substrate. The first and second strip conductors are in overlaying relationship to provide a strip transmission line from a coaxial connector mounted to the backplane to the first electrical connector.

In a preferred embodiment, the strip transmission line provides an Ethernet bus on the backplane.

In accordance with another feature of the invention, a cable management system is provided for a cabinet adapted to house electrical components. The cable management system includes at least one longitudinally extending channel disposed in the cabinet. A fastener is provided adapted to open and enable the a cable to be inserted into the channel and close to retain such cable within the channel.

In a preferred embodiment, the channel includes a portion of a frame of the cabinet.

In accordance with still another feature of the invention, a chassis is provided having a plurality of shelves for supporting electrical modules. A partitioning member is provided having captive, manually operable hardware adapted for removable insertion onto one of the shelves. The shelf has a pair of slots adapted to receive a pair of modules when the partitioning member is fastened to the shelf. Such shelf has a single slot adapted to receive one module with width greater than the width of one of the pair of modules when the partitioning member is removed from the shelf. The partitioning members of one of the shelves may be removed from, or inserted onto, the shelf without interrupting operation of the modules on the other shelves.

In accordance with yet another feature of the invention, a power management system is provided. The system includes a cabinet having stored therein: a battery; a plurality of redundant, independently replaceable battery chargers. One of the pair of battery chargers may be replaced if defective without effecting the operation of the other one of the battery chargers in charging the battery.

In accordance with still another feature of the invention, an I/O adapter card mounting plate is provided for securing an array of I/O adapter cards to a case. Each one of the I/O adapter cards has mounted thereto a mounting bracket. A motherboard is disposed in the case and is adapted to have plugged therein the array of I/O adapter cards. The mounting plate has captive fastening hardware and is adapted to be placed over the mounting bracket as a single piece. The captive hardware is adapted to enable manual fastening of the mounting member to secure the mounting bracket between the mounting plate and the case after the array of I/O adapter cards has been plugged into the motherboard.

In accordance with yet another feature of the invention, an adapter card filler plate is provided. The filler plate has a plurality of holes formed therethrough to provide a honey-combed structure. If an I/O adapter card is not needed, an adapted card filler plate is substituted for it. The filler plate is fastened to a mounting bracket by the mounting plate. The honey-combed, adapted card filler plate improves air-flow through the case.

In accordance with still another feature of the invention, a method is provided for booting operating system software into a main memory of a processing unit module. The method includes the step of executing a program stored in the processing unit module to sequentially search a plurality of possible sources of the operating system software during a boot-up phase. When a possible source of the operating system software is detected, the CPU checks to determine whether such detected source is operational and has a valid boot format. If the detected source is operational and has a valid boot format, the CPU boots the detected operating system software source into the main memory. If the detected source is either non-operational or does not have a valid boot format, the CPU checks another one of the possible operating system software sources. If all sources are checked and none are operational nor have a valid boot format, the CPU repeats the aforementioned sequential search of the possible operating system software sources.

With such a method, the processing unit module is able to successfully boot-up when the operating system software is stored in a relatively large memory system which may take a substantially long time to be operational compared to the relatively short boot-up time of the processing unit.

BRIEF DESCRIPTION OF THE DRAWING

Other features of the invention, as well as the invention itself, will become more readily apparent from the following detailed description taken together with the accompanying drawings, in which:

FIG. 3C is a rear view of the cabinet when a rear door thereof is open.

FIG. 4A being a rear perspective view of the data server with the rear door open; and FIG. 4B being a front perspective view of the data server with the front door open.

FIGS. 5A–5H are drawings of a processing unit module used as either a data mover or control station in the data server of FIG. 2; an exemplary one of the data movers and control stations being shown in FIGS. 5A–5G; FIGS. 5A, 5B, 5G showing an exemplary one of the data mover module; and FIGS. 5F and 5H show an exemplary one of the control station modules; FIGS. 5C and 5E are diagrammatical in nature and represent either a data mover or control station modules; FIG. 5D shows a processing unit module case prior to being configured as either a data mover or control station processing unit module;

FIG. 9A is a sketch of an array of such I/O adapter cards; FIG. 9C is an isometric, exploded drawing of the I/O adapter plate mounting member according to the invention;

FIGS. 10A–10F are drawing useful in understanding a the operation of a locking mechanism used by the modules; FIGS. 10A–10D showing the locking mechanism in the locked position and FIGS. 10E and 10F showing the locking mechanism in the unlocked position;

FIG. 11A showing the chassis with partitioning members; FIG. 11B and 11C being perspective views of front and rear partitioning members, respectively, adapted for use with the chassis of FIG. 11A; FIG. 11D being a perspective, exploded view of the chassis with the partitioning members of FIG. 11B and 11C; FIG. 11E is a sketch showing the chassis of FIG. 11A with the partitioning members of FIGS. 11A and 11B mounted therein to provide such chassis with four slots to receive four modules as shown in FIG. 11F; and FIG. 11G is a rear perspective view of the cabinet of FIG. 11A;

FIGS. 12A–12D are drawings useful in understanding "blind mating" between a module of FIG. 5B and its mating backplane of FIG. 4C;

DESCRIPTION OF THE PREFERRED EMBODIMENTS

GENERAL OVERVIEW

Figure 1:
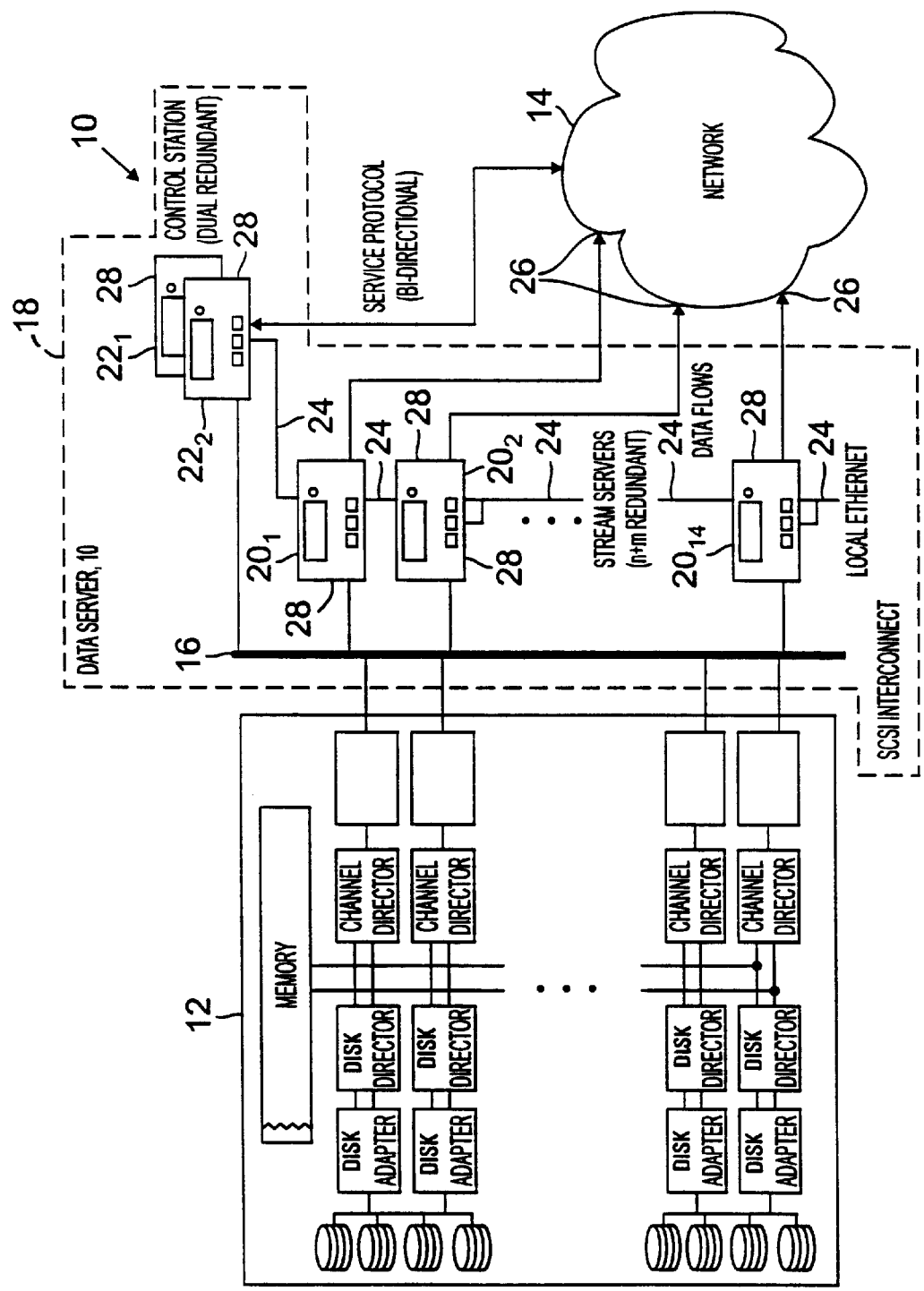
FIG. 1 is a diagram of a data server according to the invention coupled between a memory system and a network.

Referring now to FIG. 1, a data server 10 is shown coupled between a storage system 12 and a network 14. The storage system 12 is here a Symmetrix 3500 Integrated Cache Disk Array system manufactured and sold by EMC Corporation, Hopkington, Mass., assignee of the present patent application. The storage system 12 is coupled to the data server 10 through a Fast Wide Differential (FWD) SCSI interconnect 16, as shown.

The data server 10 includes, in a single cabinet 18 shown in FIGS. 2, 3A–3E, a plurality of, here up to sixteen hot replaceable processing unit modules 28. Up to fourteen of the processing unit modules 28 are data movers 20, here labelled $20_1$–$20_{14}$ and up to two of the processing unit modules 28 are control stations 22 here labelled $22_1$–$22_2$.

The processing unit modules 28 are all interconnected through a local bus, here an Ethernet bus 24 (FIG. 1). (Hot replaceable means that a component can be removed and/or replaced without an interruption to the system's, here server's, operation.) It should also be noted that the modules 28 are configured so that no cables need to be physically removed from the module 28 in order to remove it from the cabinet 18.

There are sixteen slots, or compartments (FIG. 3B) in the cabinet 18 into which the processing unit modules 28 (i.e., data movers $20_1$–$20_{14}$ or control stations $22_1$, $22_2$) can be slidably inserted or removed. The slots are arranged in longitudinally, here vertically, extending pairs; the top seven pairs being configured to receive data movers $20_1$–$20_{14}$, and the bottom pair being configured to receive the control stations $22_1$, $22_2$. One of the slots in the bottom pair can be configured as a fifteenth data mover 20 or it may be configured as a redundant control station 22. The data movers and control stations $20_1$–$20_{14}$, $22_1$–$22_2$ are connected to the storage system 12 through the SCSI interconnect 16, as noted above, and to the network 14 though bi-directional busses 26, as shown in FIG. 1.

Figure 4A:
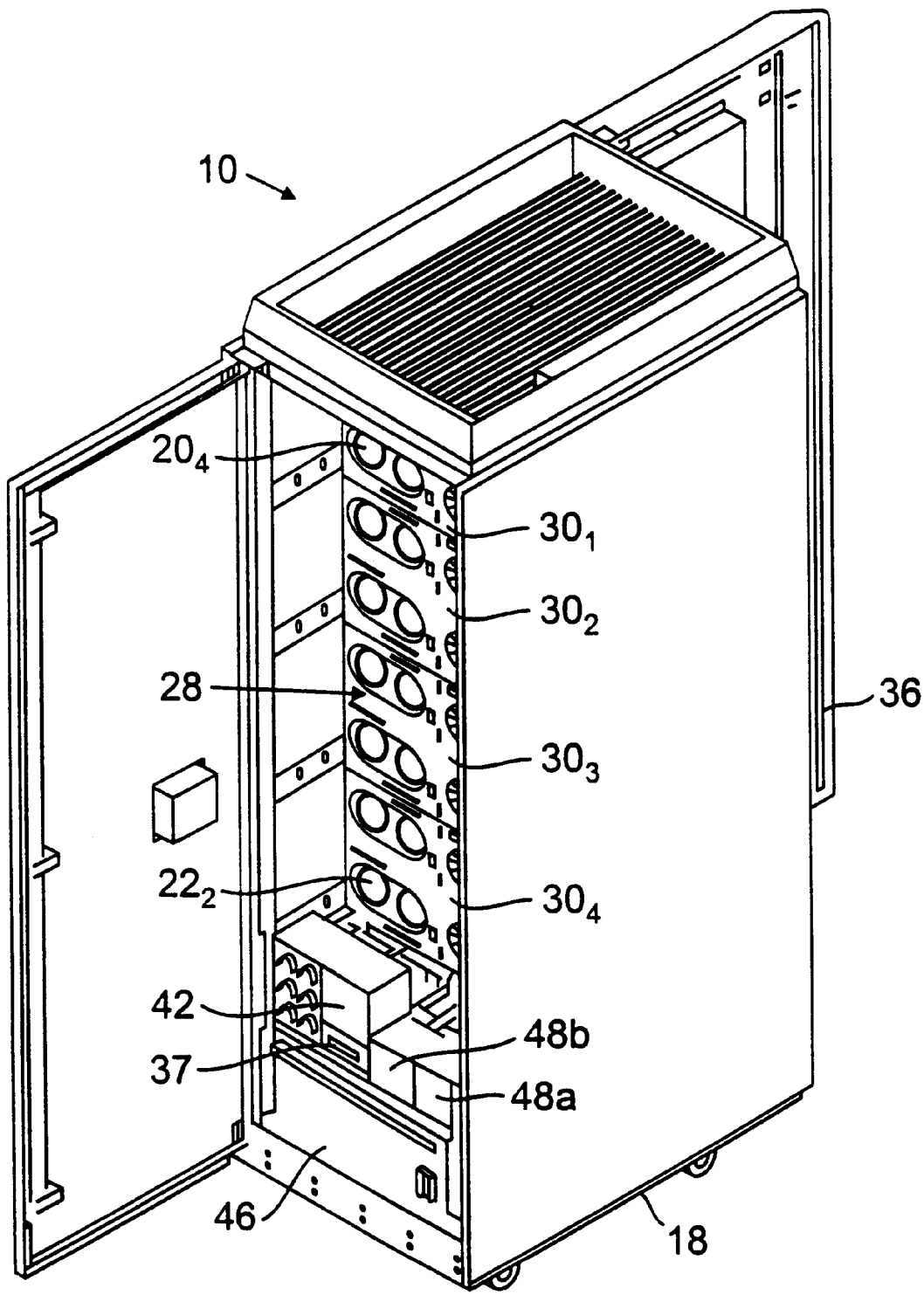
FIGS. 4A and 4B are perspective views of the data server of FIG. 2.
Figure 4B:
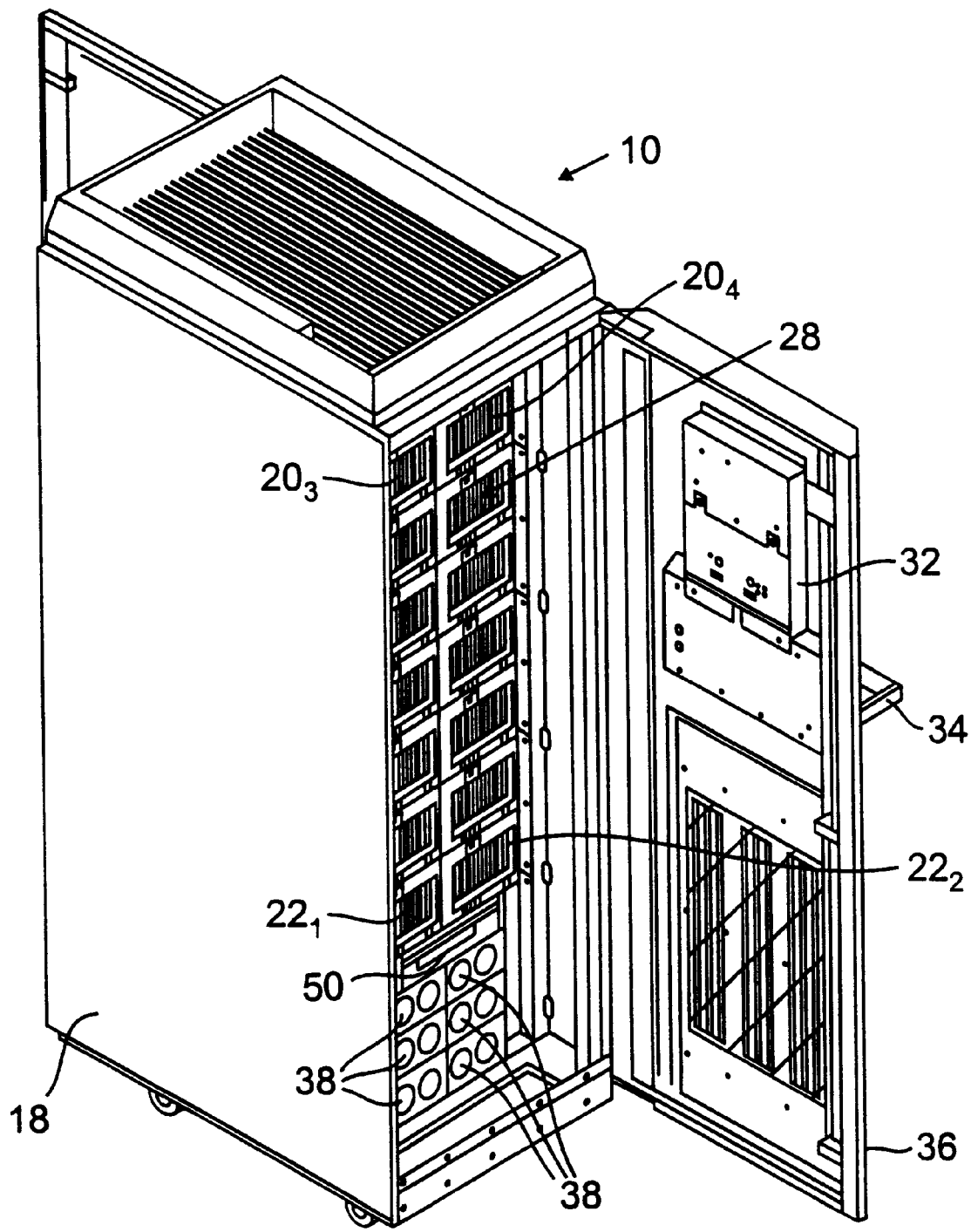
Figure 4C:
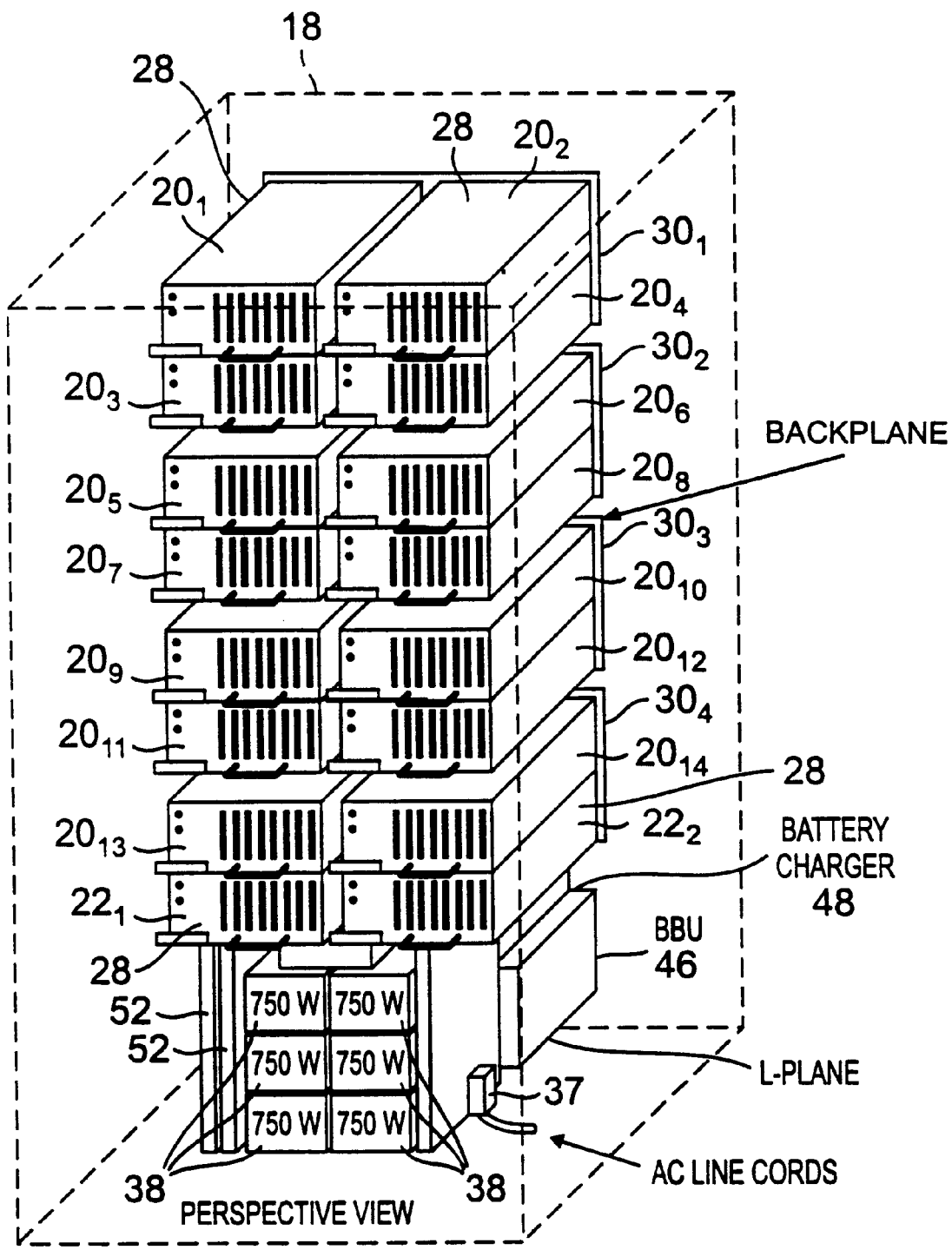
FIGS. 4C and 4D are front perspective and top diagrammatic drawings of the data server of FIG. 2 with the cabinet thereof being shown in phantom.
Figure 4D:
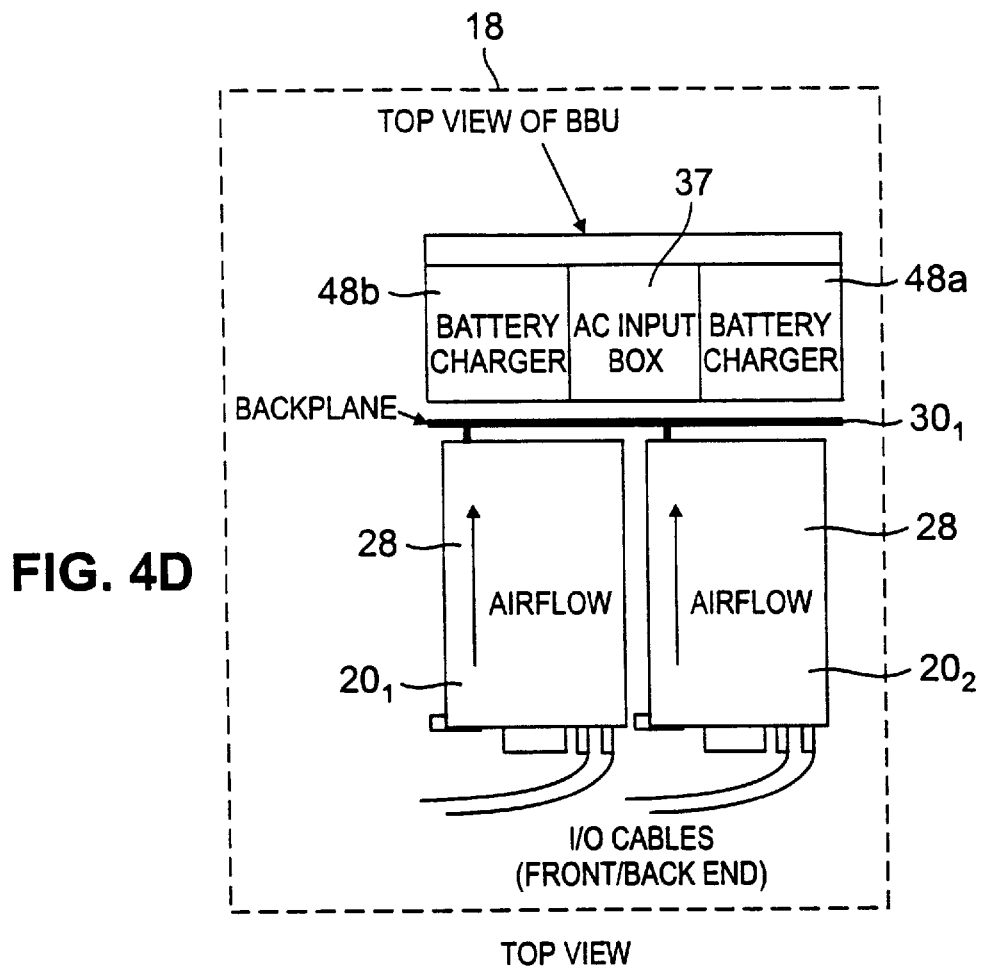
Figure 4E:
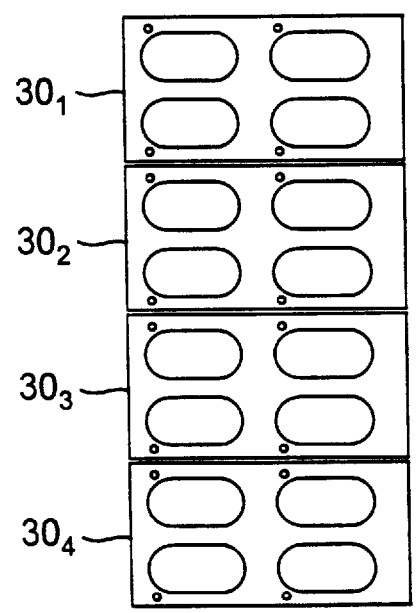
FIG. 4E is a rear view of a set of four backplanes used by the server of FIG. 2.
Figure 5A:
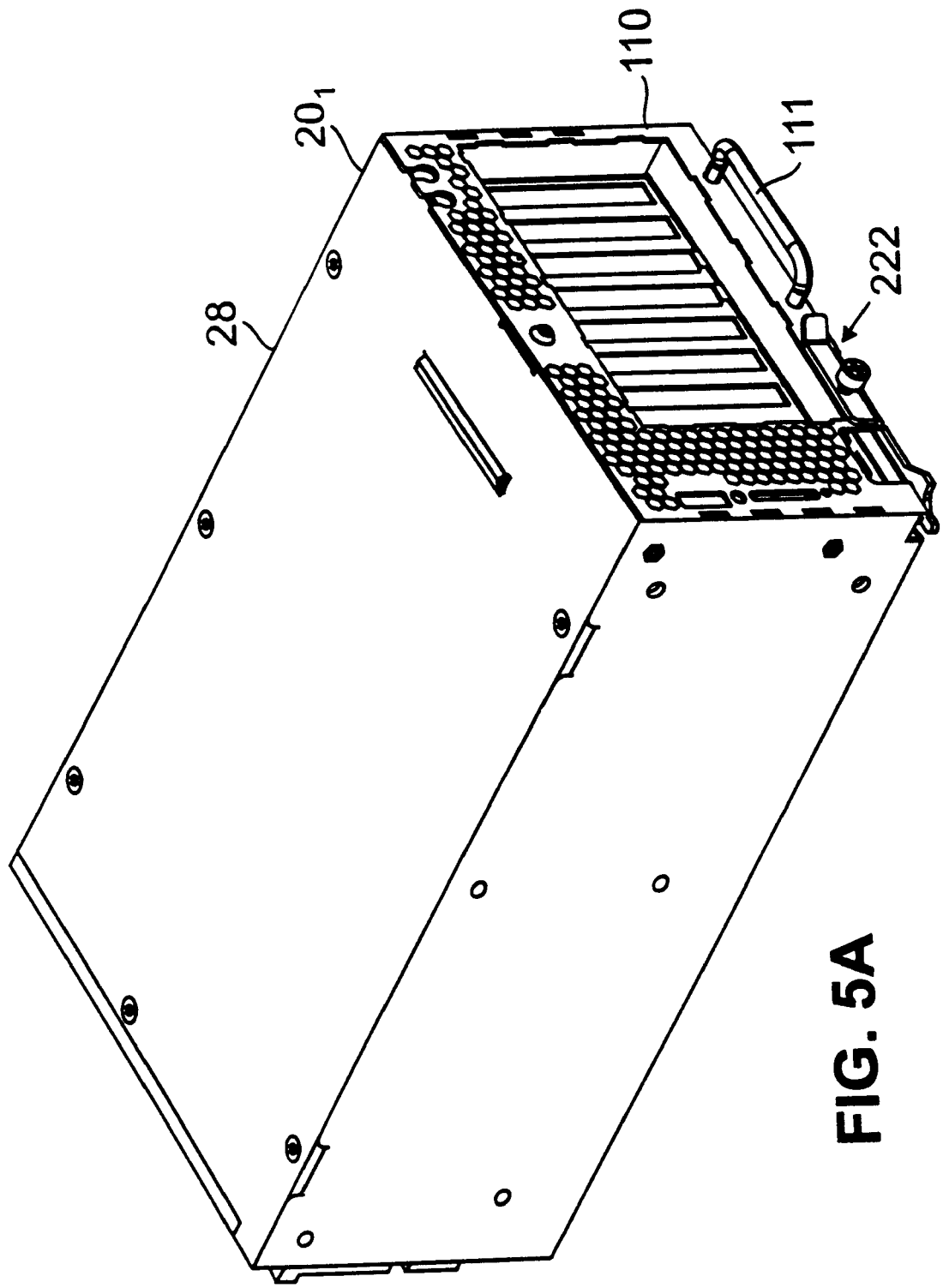
Figure 5B:
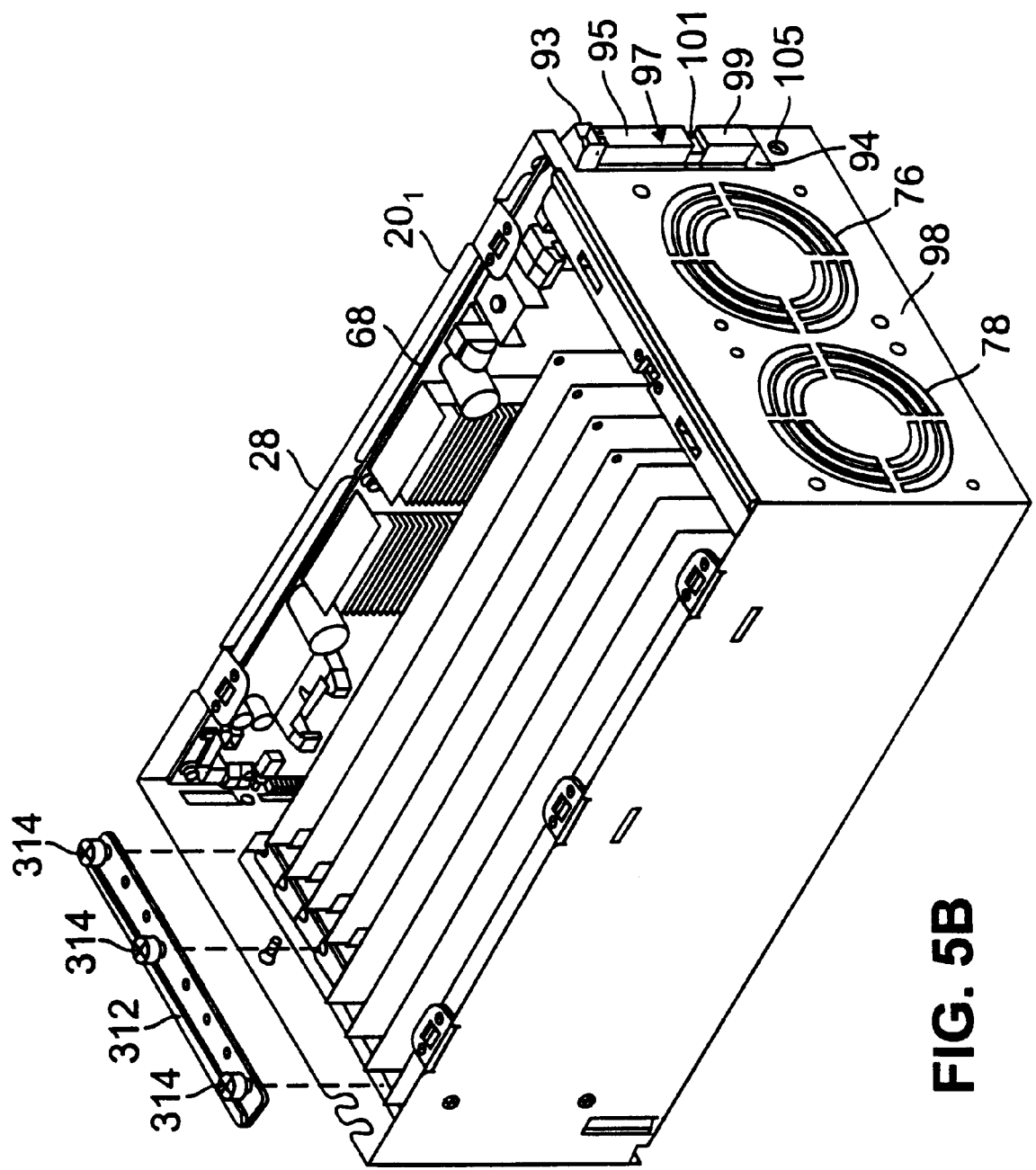
Figure 5D:
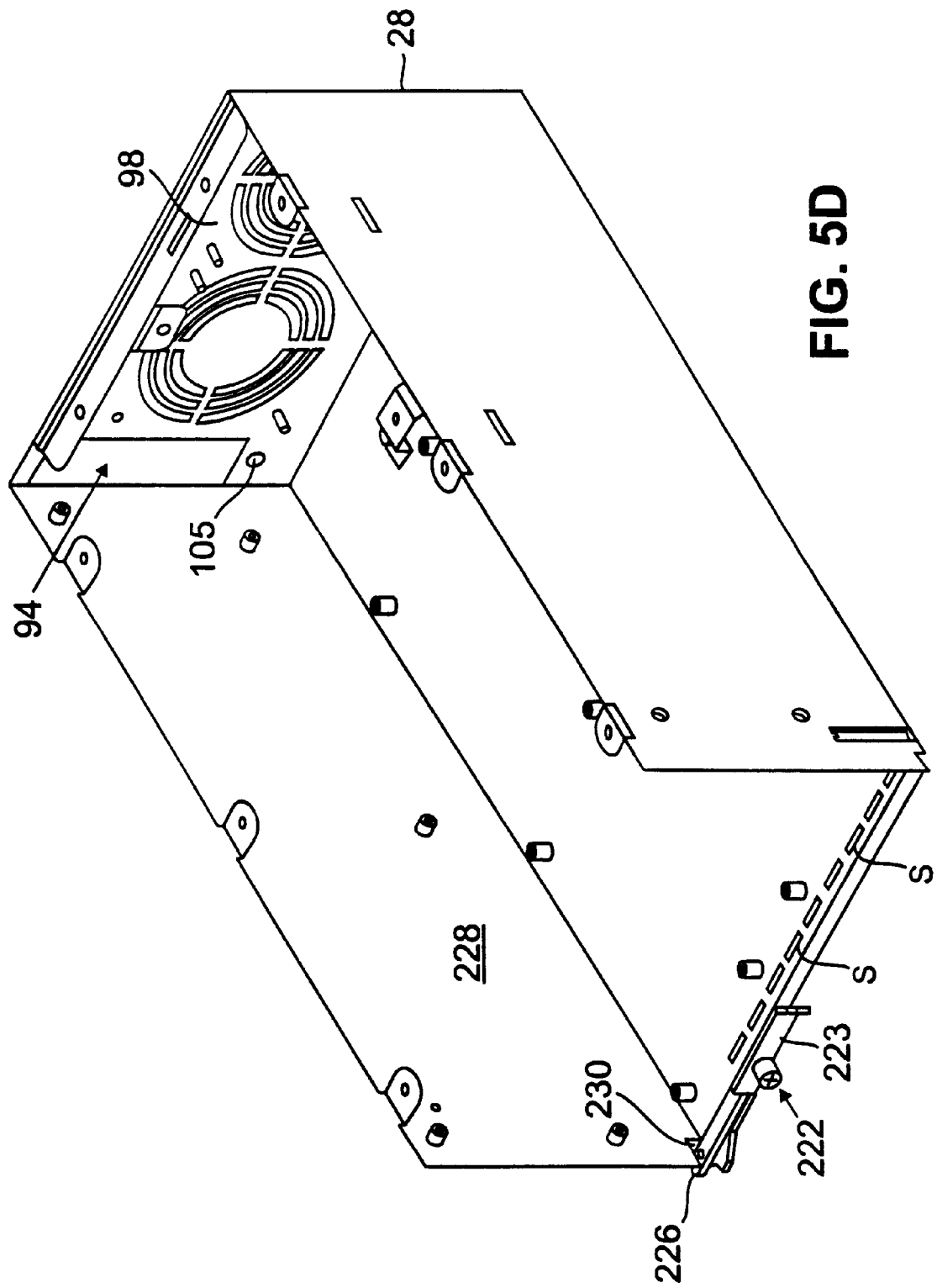
Figure 5E:
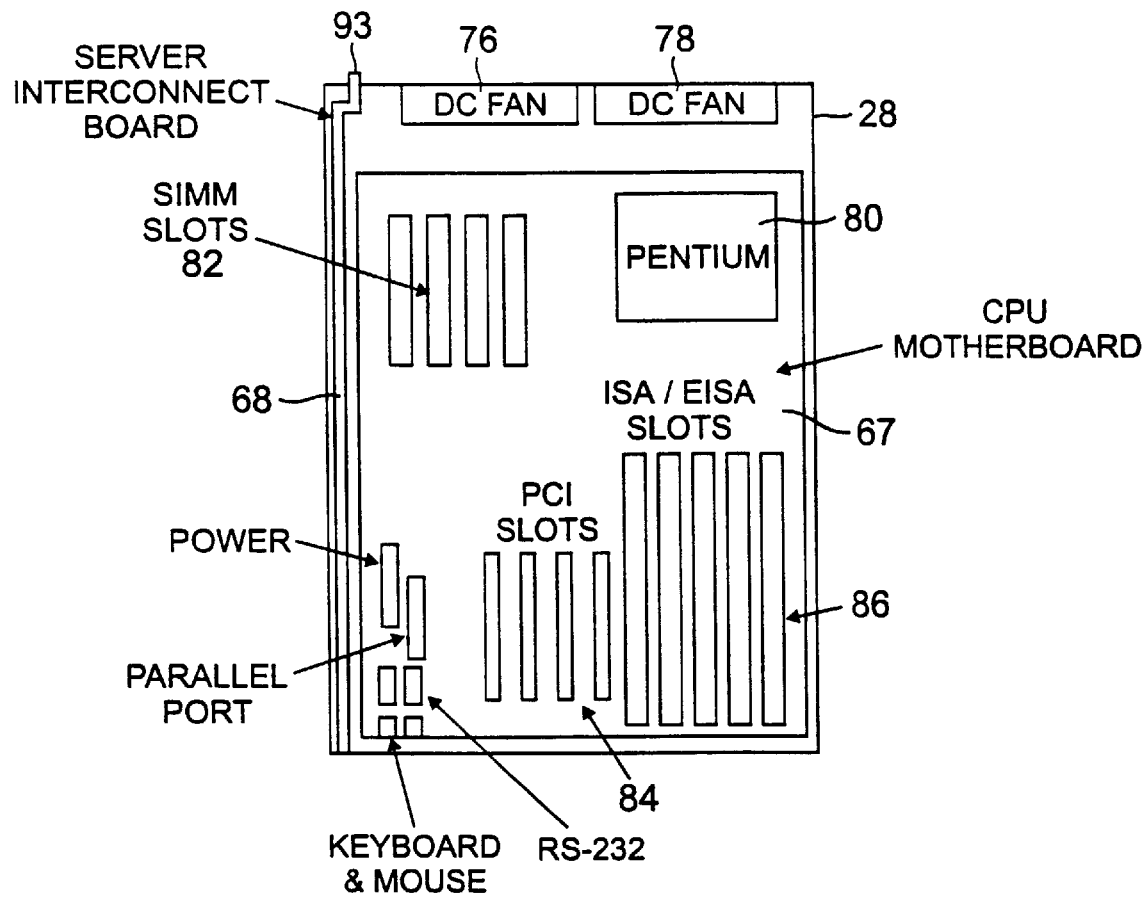
Figure 5F:
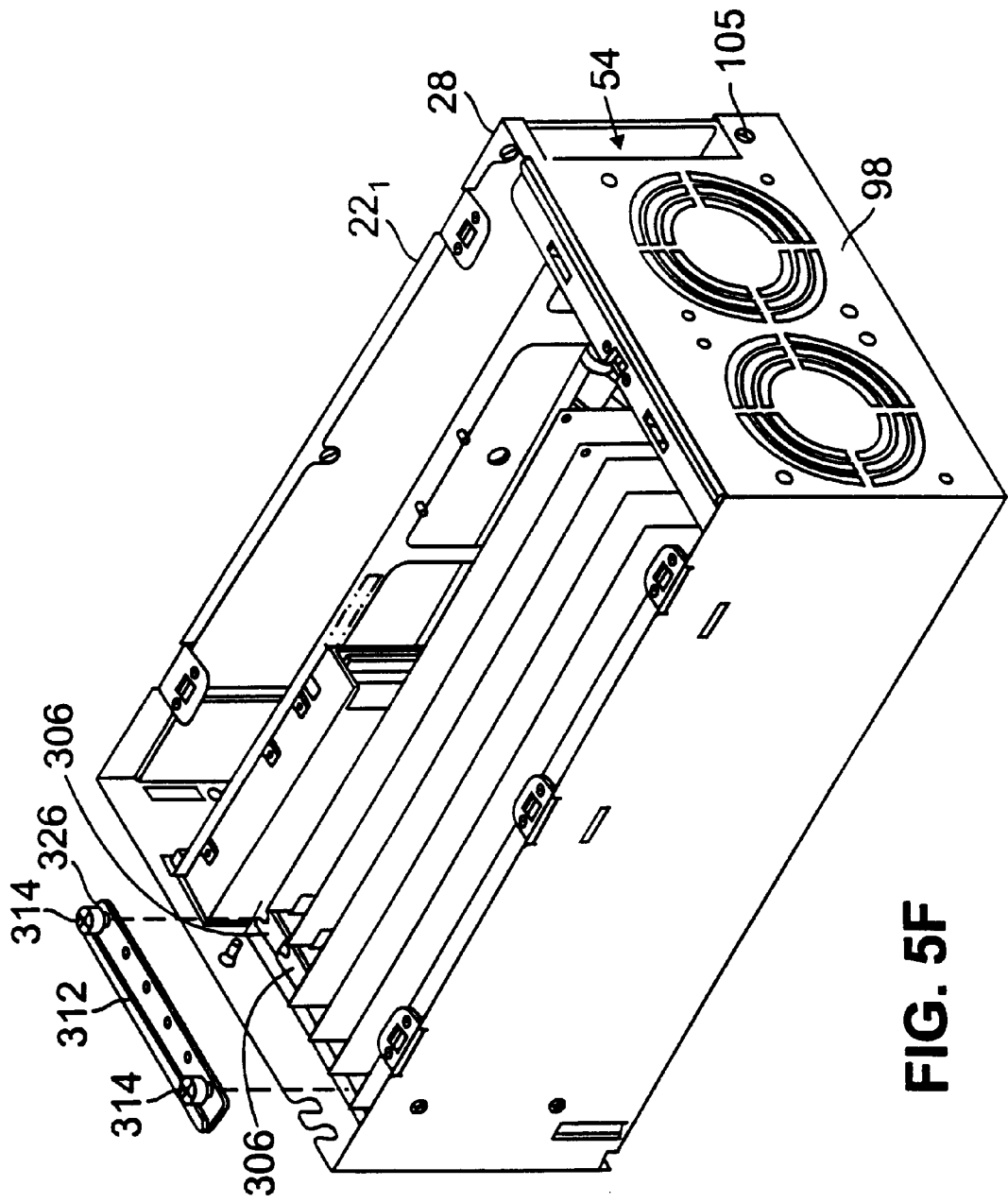
Figure 5G:
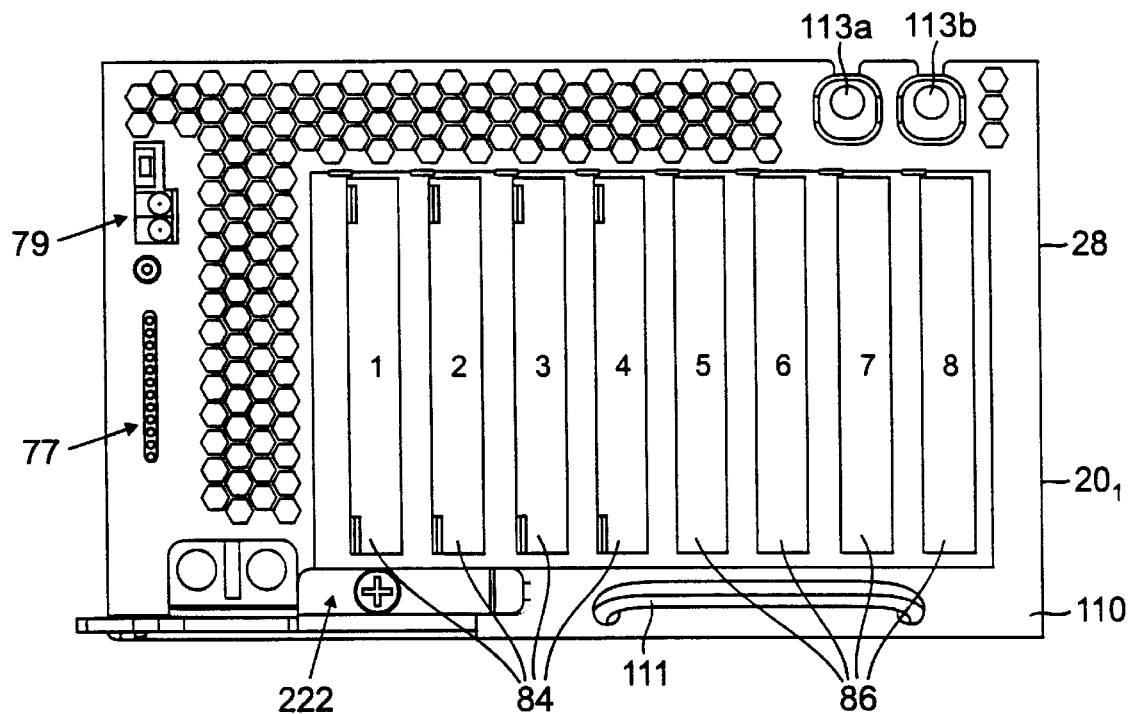
Figure 5H:
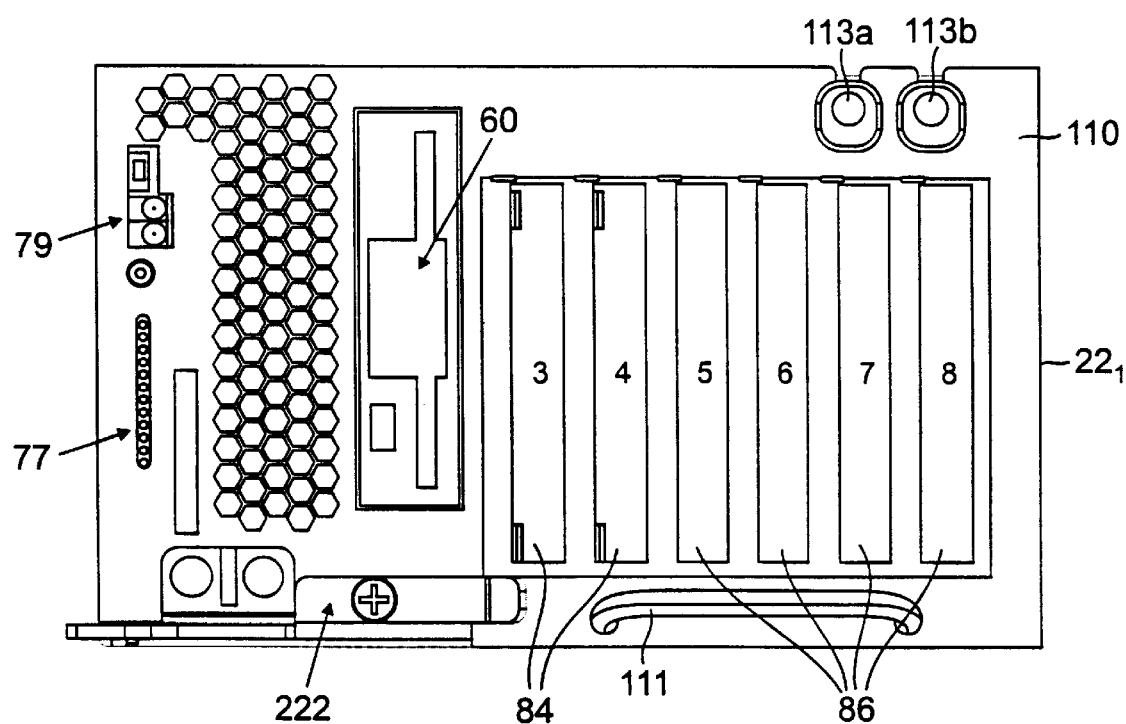

The control stations $22_1$, $22_2$ have different functions depending on the software application that is running on the data server 10 for a subscriber to the network 14, for example. Each data mover $20_1$–$20_{14}$ or control station $22_1$, $22_2$ is disposed within a sheet metal case to provide an enclosure for the processing unit module 28, as shown in FIGS. 4A and 4B. An exemplary one of the data movers and control station processing unit modules 28 is shown in FIGS. 5A–5G. It is noted that FIGS. 5A, 5B, 5G show an exemplary one of the data mover 20 processing unit modules 28, here data mover 20, while FIGS. 5F and 5H show an exemplary one of the control station 22 processing unit modules 28, here control station processing unit module 28. FIGS. 5C and 5E are diagrammatical in nature and represent either a data mover 20 or control station 22. FIG. 5D shows a processing unit module 28, here an empty case, prior to being configured as either a data mover or control station. Each processing unit module 28 is DC powered, environmentally controlled processing unit module. The processing unit module 28 includes a motherboard having plugged therein a CPU, main memory, and I/O adapter cards, to be described in detail hereinafter. Suffice it to say here, however, is that the processing unit modules 28 are hot replaceable into, or from, the server 10 via four backplanes $30_1$–$30_4$ (FIG. 3C 3D and 3E). More particularly, the processing unit modules 28 for data movers $20_1$–$20_4$ are hot replaceable via backplane $30_1$; the processing unit modules 28 for data movers $20_5$–$20_8$ are hot replaceable via backplane $30_2$; the processing unit modules 28 for data movers $20_9$–$20_{10}$ are hot replaceable via backplane $30_3$; and, the processing unit modules 28 for data movers $20_{11}$–$20_{14}$ and for control stations $22_1$, $22_2$ are hot replaceable via backplane $30_4$.

Referring again also to FIG. 3B, the data server 10 also includes a CD ROM drive 50, accessible when the front door 36 of cabinet 18 is opened, and a multiplexer board (MUX) 53.

Figure 3A:
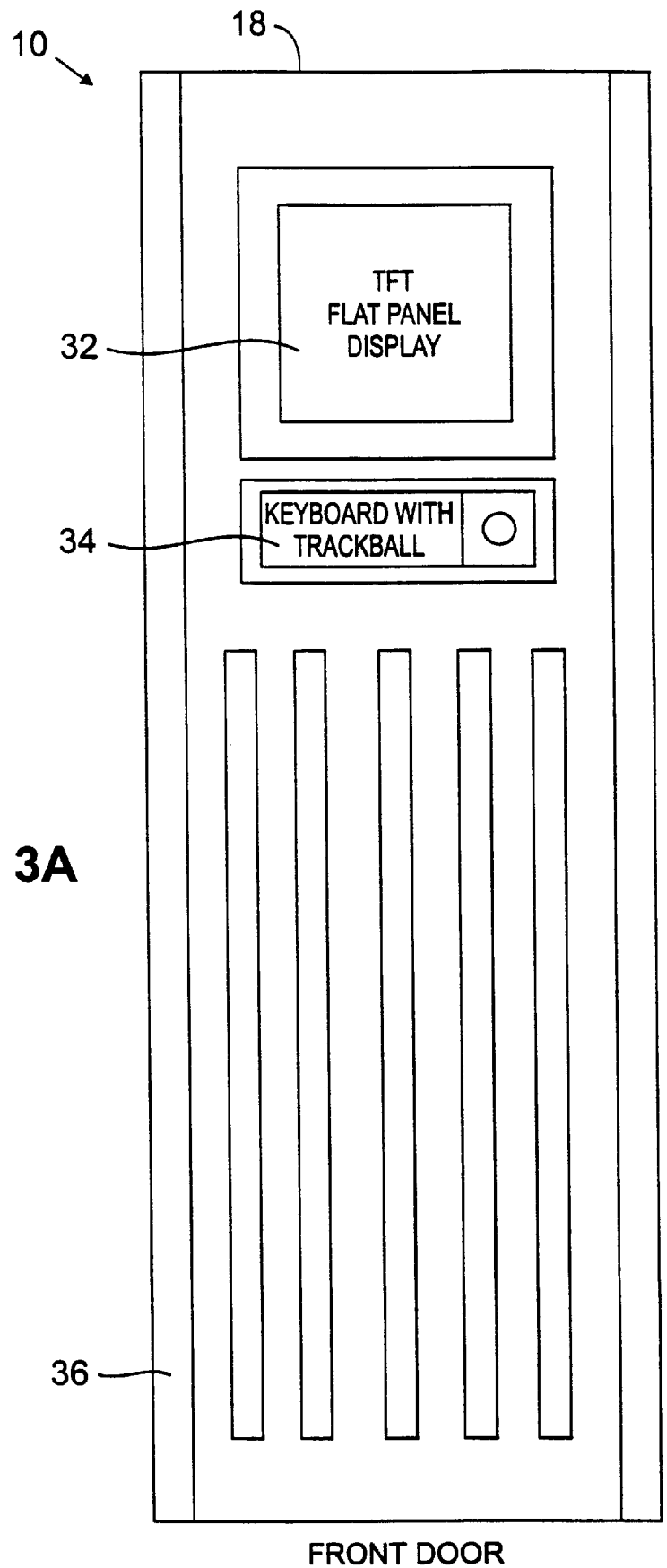
FIGS. 3A–3C are simplified, diagrammatical sketches of the data server of FIG. 1, FIG. 3A showing the front door of a cabinet used to store the components of the data server of FIG. 2, FIG. 3B showing the front of the cabinet when the front door of FIG. 3A is open.
Figure 3B:
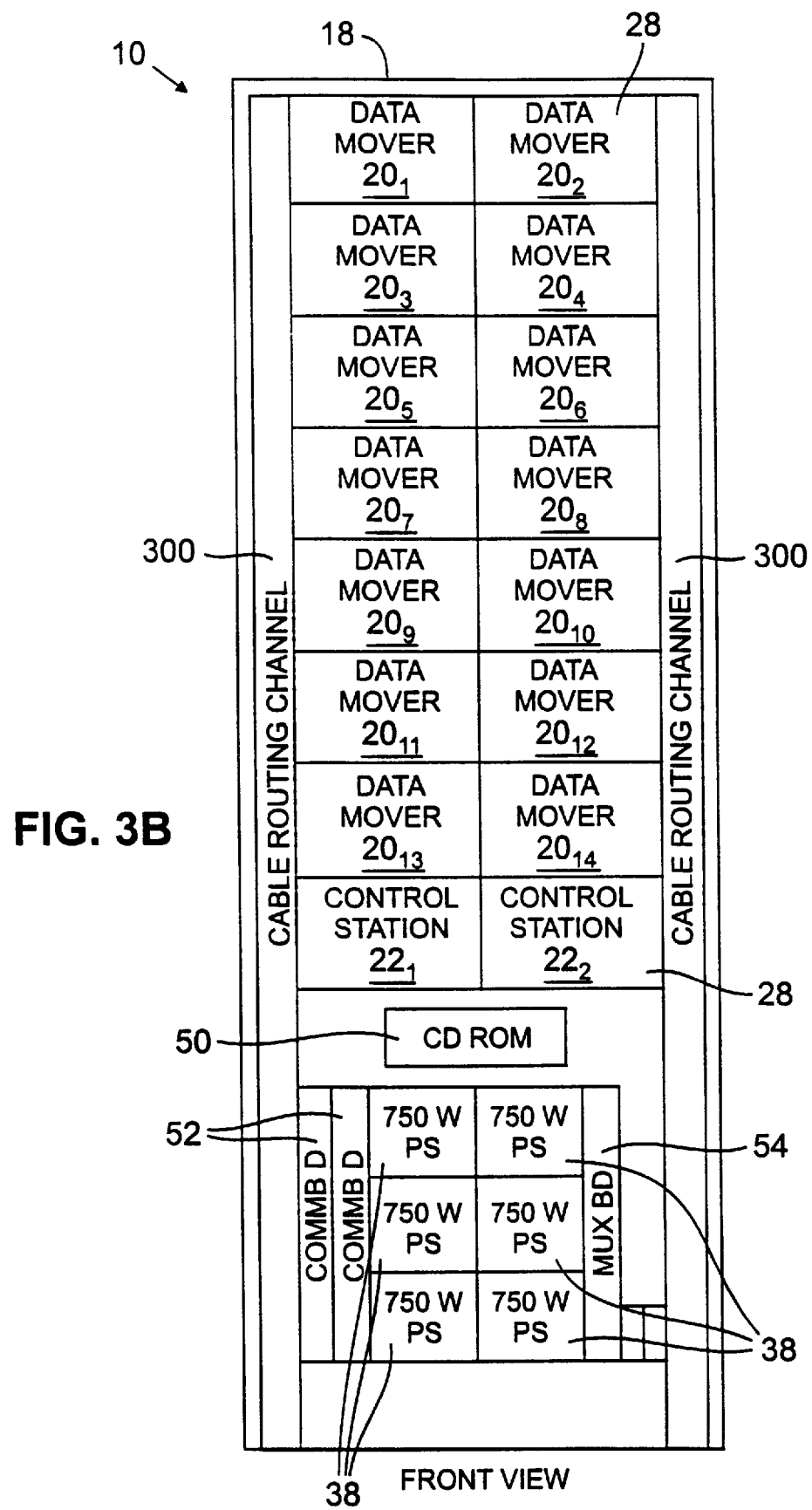
Figure 3C:
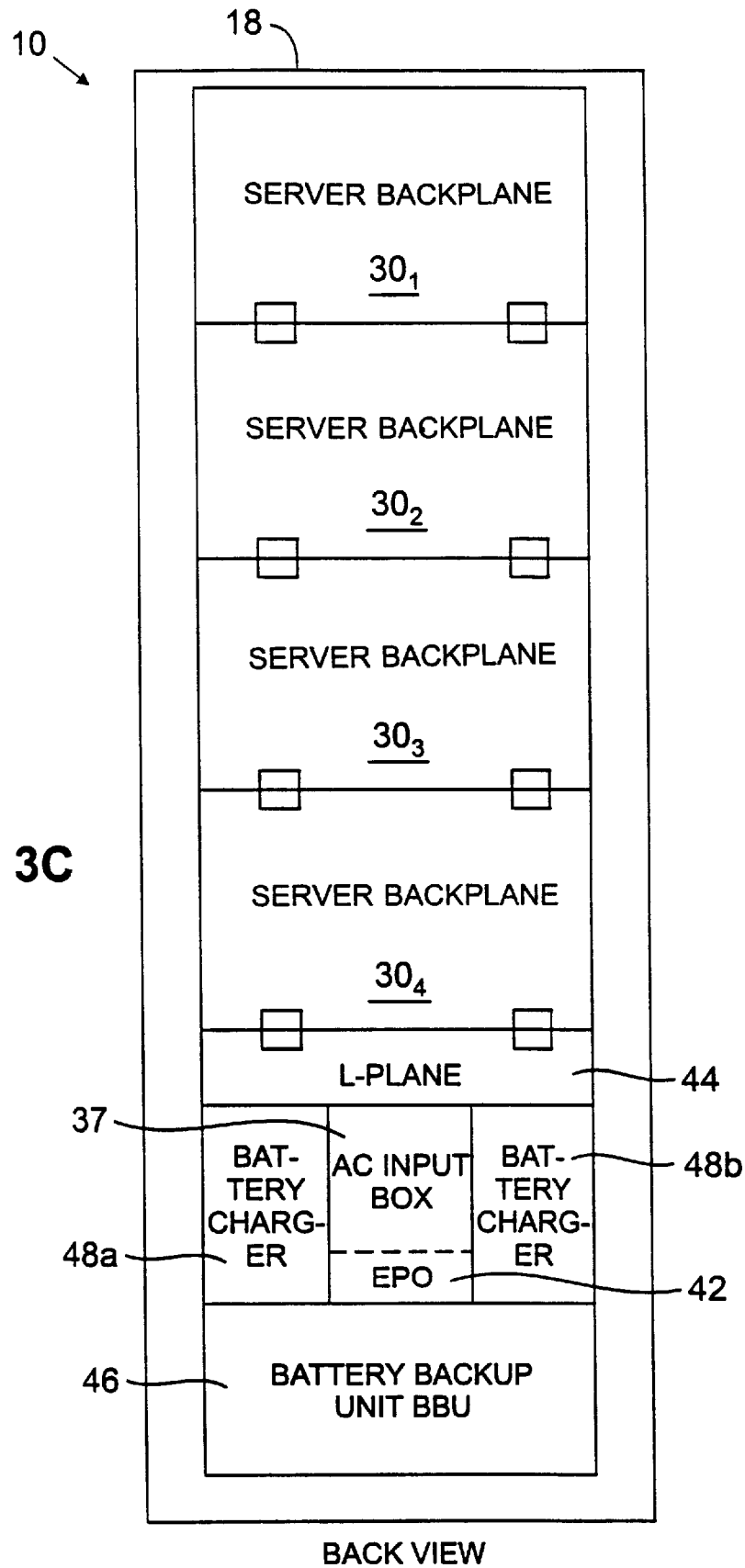

Referring to FIGS. 3A–3C, the data server 10 includes a flat panel display 32 and keyboard with trackball mounted on the front door 36 of the cabinet 18.

Figure 6:
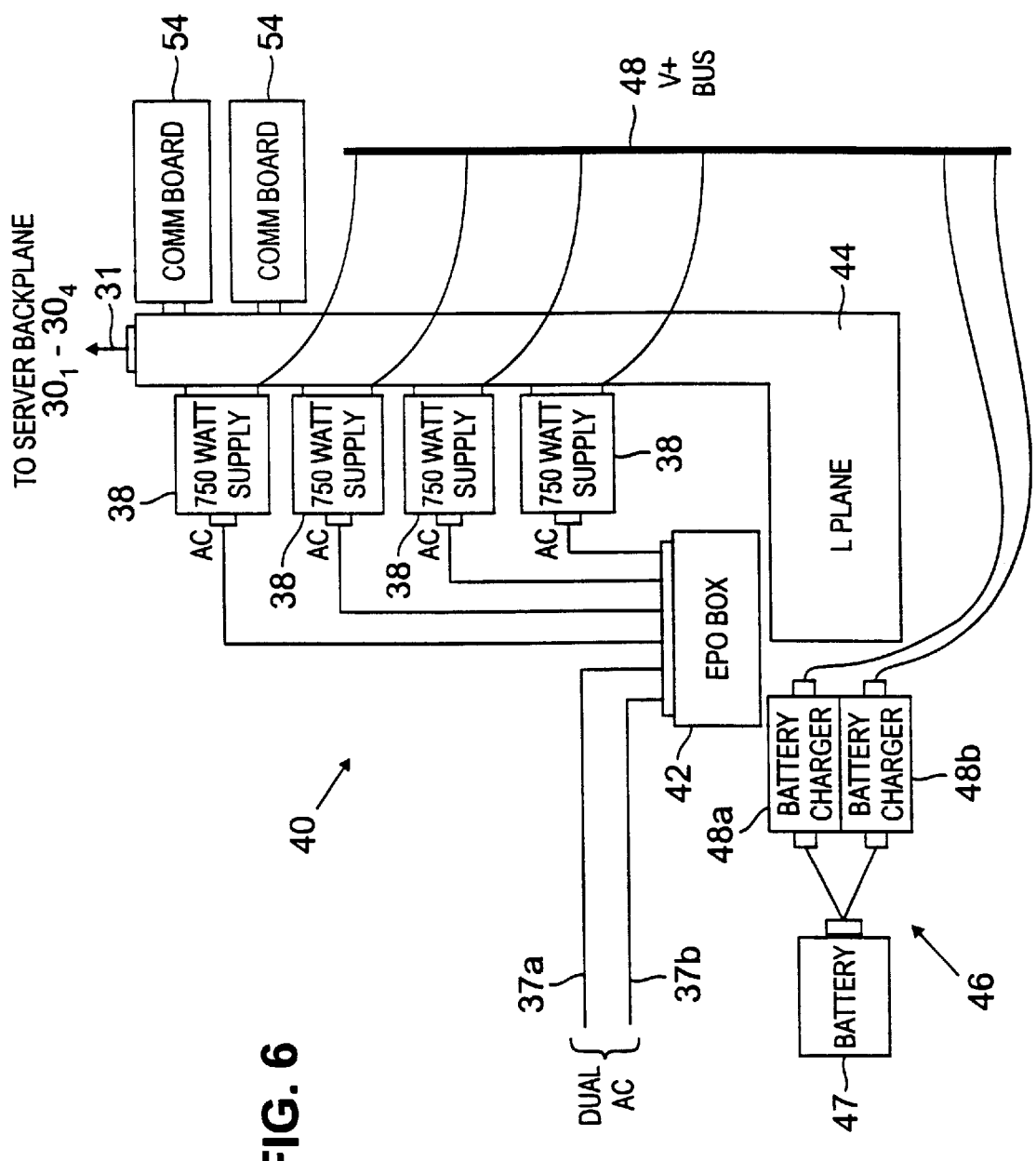
FIG. 6 is a block diagram of a power management system, according to the invention, used in the server of FIG. 2.

The data server 10 also includes a power management system 40, to be described in more detail in connection with FIG. 6. Suffice it to say, here, however that the data server 10 includes an Emergency Power Off (EPO) box 42 (i.e., a circuit breaker, line filters, controller and switches to enable switch over from primary AC main line 37a power feed to auxiliary AC main line power feed 37b), a plurality of power supplies (e.g., AC to DC converters) 38, one thereof being provided for redundancy. The AC to DC converters 38 are modular, redundant, and independently hot replaceable via a connector plate, not shown, mounted to an L-shaped printed circuit board 44 (FIGS. 3C and 6). In order to protect against power failure a battery back up (BBU) unit 46 is provided. The battery back up unit (BBU) 46, which includes battery 47, is charged by a pair of redundant battery chargers 48a, 48b each independently hot replaceable via the connector plate, not shown, mounted to the L-shaped printed circuit board 44, for charging the battery 47. Also provided are a pair of power control boards (COMMBDs) 52. The COMMBDs 52 will be described in more detail below in connection with FIG. 6 and the power management system 46. Suffice it to say here, however, that the COMMBDs 54 are coupled to the server backplanes $30_1$–$30_4$ though the L-shaped printed circuit board 44, as shown in FIG. 6. Each COMMBD 54 is adapted to sense a variety of conditions, including: which data movers $20_1$–$20_{14}$ are present in each data mover backplane $30_1$–$30_4$; which backplanes $30_1$–$30_4$ are present; whether there are Ethernet bus 50 ohm terminator resistors 56, to be described in more detail in FIG. 7 in connection with the internal Ethernet bus 34, a portion of which is formed as a strip transmission line 58 on the backplanes $30_1$–$30_4$; how many battery chargers 48a, 48b there are and whether their cables are plugged in; whether the EPO 42 is present or absent; the number of power supplies 38 (i.e., one to six); mux board 53 present or absent; and, CDROM 50 present or absent.

The L-shaped printed circuit board 44 is the wiring backbone of the data server 10. There are two facets to the L-shaped printed circuit board 44: there are connections on the L-shaped printed circuit board itself to enable its connection to the backplanes $30_1$–$30_4$ by a ribbon cables 31; and, there is a connector plate, not shown, mounted to the L-shaped printed circuit board 44 for plugging in the EPO box 42 and battery chargers 48a, 48b allowing for "quick-disconnect" of the batteries chargers 48a, 48b.

SERVER 10 SYSTEM BLOCK DIAGRAM

Figure 8:
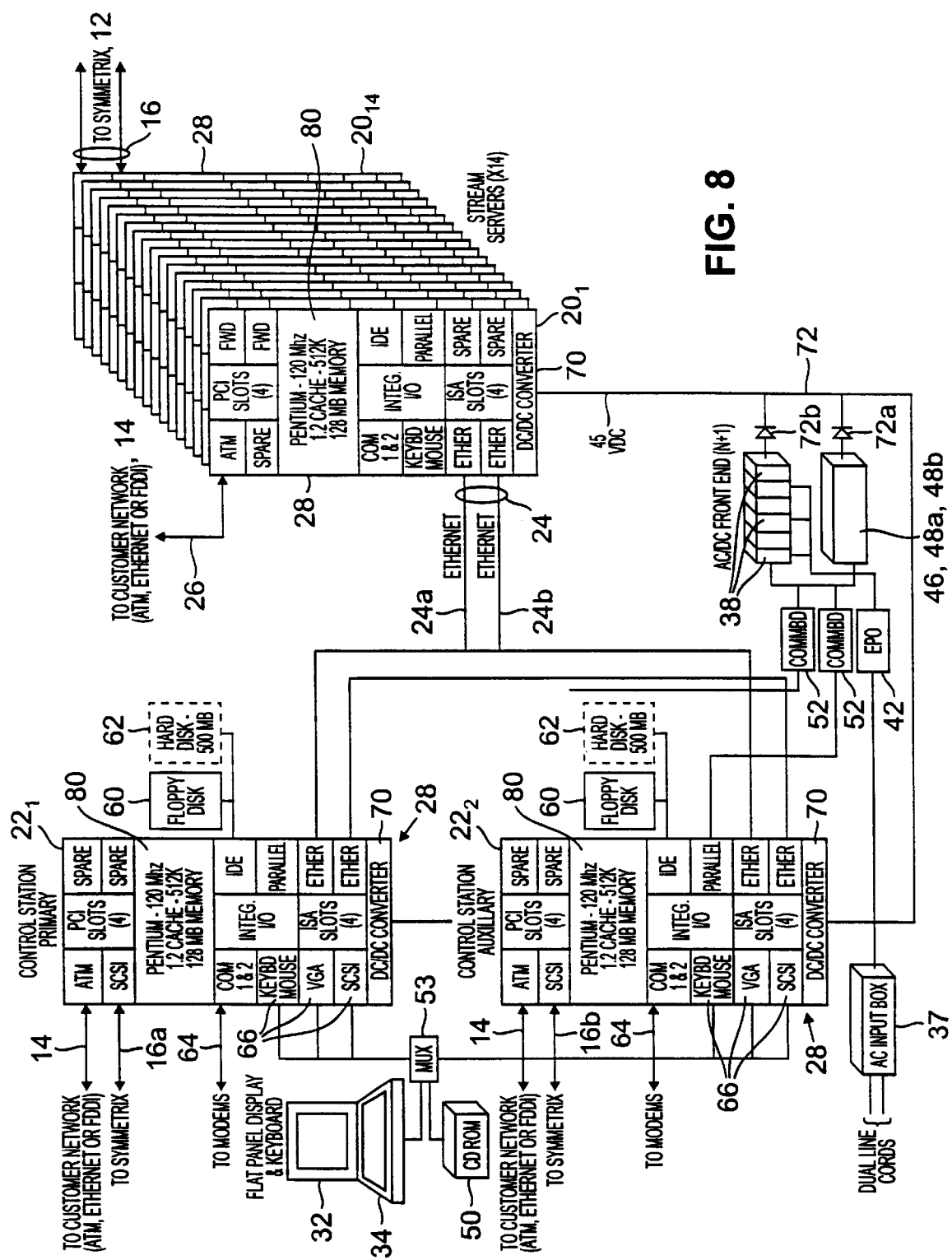
FIG. 8 is a block diagram of the data server system of FIG. 1.

Referring now to FIG. 8, a system block diagram of the data server 10 is shown. As noted above, the processing unit modules 28 (i.e., data movers $20_1$–$20_{14}$ and control stations $22_1$, $22_2$) communicate with each other through an Ethernet bus 24, here a pair of redundant Ethernet busses 24a, 24b, as shown, to the network 14 via an ATM, Ethernet or FDDI bi-directional buses 26 (FIG. 1), for example, and to storage system 12 via the FWD SCSI, or Fibre channel interconnect 16 (FIG. 1).

It is noted that the control stations $22_1$, $22_2$ each includes a floppy disk 60 and optional hard drive 62. The control stations $22_1$, $22_2$ are also here shown connected to the network 14 with ATM buses, however, it should be understood that other buses may be used such as Ethernet or FDDI, for example. As noted above, here the control stations $22_1$, $22_2$ are connected to the storage system 12 through SCSI channels 16, here a pair of redundant SCSI channels. The control stations $22_1$, $22_2$ are adapted for coupling to modems, not shown, via communication, or COMM ports 64, as indicated.

The control station $22_1$, $22_2$ motherboards 67, to be described in connection with FIGS. 5C, 5E, are provided with keyboard, mouse, VGA and IDE interface cards 66 for enabling connection to a flat panel display 32, keyboard 34, mouse and CDROM drive 50 via multiplexer 53, as indicated. Thus, the control stations $22_1$, $22_2$ have access thereto though the multiplexer 74. Therefore, the two control stations $22_1$, $22_2$ share a common display 32, keyboard 34, mouse and CDROM 50. One of these control stations $22_1$, $22_2$ can act as a redundant control station so that if one of the two control stations $22_1$, $22_2$ fails, the other one is still operational. Likewise, if one of the pair of Ethernets 24a, 24b (FIG. 6) fails, the data server 10 can operate with the other one. If one of the storage channels, here FWD SCSI channels 16a, 16b, fails, the other one still enables communication with the storage system 14. As noted above, there is redundancy in AC-DC converters 38 and battery chargers 48a, 48b.

The control stations $22_1$, $22_2$ are responsible for communications interconnect between themselves and the data movers $20_1$–$20_{14}$, via server interconnect printed circuit boards 68 in each control station $22_1$, $22_2$ and data mover $20_1$–$20_{14}$. The system interfaces (e.g., environmental, internal Ethernet communications, modem, and network and storage) are all available to the control stations $22_1$–$22_2$. The particular functions of the control stations $22_1$, $22_2$ may vary depending upon the application in use, but generally include: management of the individual data movers $20_1$–$20_{14}$, power management and cooling (i.e., environmental) management. The control stations $22_1$, $22_2$ include, in addition to the motherboard 67 (FIG. SE) with six I/O adapter card slots, a 3.5 inch high density floppy disk drive 60, as shown in FIG. 5H.

The processing unit modules 28 are powered by AC-to-DC converters, i.e. power supplies) 38 which are fed by the dual line AC through the EPO box 42 to the AC-to-DC converters 38. The output of the AC-to-DC converters is here 48 volts DC and is fed to each of the DC to DC converters 70 mounted to each of the server interconnect printed circuit boards 68 (FIG. 5E) included within each one of the processing unit modules 28, described above. There is a battery backup unit (BBU) 46. There are two redundant, hot replaceable, battery chargers 48a, 48b (FIG. 6) external to the battery backup unit 46. AC power may be lost up to several minutes, during which time the battery 47 in the BBU 46 will power the server 10. Charge is maintained in the BBU 46 by one of the two, independently hot replaceable battery chargers 48a, 48b. It was recognized that what typically fails in a system having a backup battery 47 (FIG. 6) is the battery charger. Thus, here, the battery chargers 48a, 48b are external to the battery 47 and each of the chargers 48a, 48b, one being redundant, is hot replaceable, as shown in FIGS. 4A, 4B, 6. Thus, rather than embedding the chargers 48a, 48b in the BBU 46 and thereby having to replace an entire, relatively heavy, typically 50 pounds BBU 47 in the event of a battery charger failure, here the technician merely hot un-plugs the failed one of the two battery chargers 48a, 48b and replaces it with an operational battery charger while the server 10 continues to operate without interruption. When AC power is present from either the main AC line 37a or the auxiliary AC line 37b, the AC-DC converters 38 provide power to the processing unit modules 28 via a 48 volt bus system (i.e., a +48 volt bus and a ground bus) and one of the battery chargers 48a, 48b supplies a trickle charge to the battery 47. It is noted that when there is AC power present, the output voltage of the AC/DC converters 48 is slightly above 48 volts to back bias diode 72a (FIG. 8) while diode 72b (one diode being included in each converter 48) is forward biased. When there is a complete failure of AC power, power to the processing unit modules 28 is supplied by the battery 47 via the 48 volt bus to the backplanes $30_1$–$30_4$. The one of the two battery chargers 48a, 48b producing the highest potential is selected as the one to charge the battery 47. As noted above, the data server 10 has n plus one AC-to-DC converters 38 (i.e., power supplies 38); here, n is five. Each processing unit module 28 includes an interconnect printed board 68, electrically connected to (i.e., plugged into) the motherboard 67. The interconnect printed circuit board 68 (i.e., a daughterboard for the backplane 30) has mounted to it an electrical connector 93, to be described, and a DC to DC converter 70 electrically connected to the electrical connector 93. The electrical connector 93 of the interconnect printed circuit board 68 is adapted to mate with, and electrically connects to, one of the backplane $30_1$–$30_4$ electrical connectors 254a, 254b, 254c, or 254d (FIG. 12B). DC power from the 48 volt bus system is connected to pins of the backplane $30_1$–$30_4$ connectors 254a–254d. The DC to DC converter 70 electrically connected to the electrical connectors 254a–254d then distributes the 48 volts to other components of the processing unit module 28 and enables the processing unit module 28 to be hot plugged into, or removed from, the backplane $30_1$–$30_4$.

More particularly, each one of the processing unit modules 28 includes a server interconnect printed circuit boards 68. As noted above, each one of the boards 68 has mounted to it a DC-to-DC converter 70. The DC to DC converter 70 creates the required DC voltages (i.e., here +3.3, +5 volts, +12 volts, etc.) from a bulk 48 volt on the 48 volt bus that is distributed throughout the cabinet 18. More particularly, the 48 volts is then converted by the DC to DC converter 70 mounted to the server interconnect printed circuit board 68 to the voltages required by components, i.e., fans, CPU, optional disk drive, etc. in the processing unit module 28. These required voltages may be, for example, 5 volts DC, 12 or 3.3 volts DC. The server interconnect printed circuit boards 68 each have mounted to them a pair of redundant Ethernet transceivers (XCVRs).

DATA MOVER/CONTROL STATION PROCESSING UNIT MODULE 28

As noted above, each data mover $20_1$–$20_{14}$ or control station $22_1$, $22_2$ is disposed within a sheet metal case to provide a processing unit module 28, an exemplary one being shown in FIGS. 5A–5H. Each case houses a DC powered, environmentally controlled processing unit module 28. The processing unit module 28 includes the motherboard 67 (FIG. SE) disposed on the bottom of the processing unit module 28, the data server interconnect printed circuit board 68 mounted along one side of the processing unit module 28, and a pair of DC fans 76, 78 disposed on the back of the processing unit module 28. Referring also to FIGS. 5B and 5C, the server interconnect printed circuit board 68 has mounted to it the DC to DC converter 70 (FIG. 8), a DC margin and thermal control unit module, a pair of control busses, a pair of Ethernet 10 Base2 busses, a parallel port interface and various indicators 77 and switches 79 (FIGS. 5G and 5H) accessible from the front panel of the processing unit module 28. The thermal control unit processing unit module 28 is used to control the fans 76, 78, and hence the environment, of such processing unit module 28. The processing unit module 28 interconnect printed circuit board 68 (i.e., a daughterboard) plugs into the motherboard 67 (FIG. 5E). The DC fans 76, 78 have a tachometer, not shown, and the server interconnect printed board 68 has fan detection logic that determines if the fans 76, 78 are still rotating properly. If a fan failure has occurred a fan_tach fault is presented to the control stations 22 via the backplane $30_1$–$30_4$. The control stations 22 provide the mechanism in which to turn on/off the power to an individual data mover/control station processing unit module 28. Airflow through the data mover/control station processing unit module 28 is from front to back, as shown in FIG. 4B. The DC operated fans 76, 78 pull air from slots in the front panel (FIG. 5B) of the data mover/control station processing unit module 28 and across the motherboard 67.

The motherboard 67 (FIG. 5E) has mounted to it a central processing unit (CPU) 80, here a Pentium processor, a cache memory, main memory 82a (FIG. 5C) (i.e., RAM SIMM modules adapted for insertion into conventional SIMM slots 82), PCI bus slots 84, ISA bus slots 86. The slots 84, 86 are adapted to receive plug-in standard I/O adapter cards, an exemplary array 85 being shown in FIG. 9A. (As will be described, the data movers $20_1$–$20_{14}$ here have four PCI slots 84, 86 and four ISA slots (FIG. 5G) whereas the control stations $22_1$, $22_2$ have two PCI slots 84, four ISA slots 86, and a floppy disk drive 60 (FIG. 5H). The I/O adapter cards 85 may also include SCSI, ATM, Ethernet FDDI and ESCON cards, for example. The motherboard also has mounted to it a flash memory, or ROM having stored therein the CPU 80 self-test program (and BIOS).

It is noted that the processing unit module 28 is configured to enable use of market available processing unit module motherboards and I/O adapter cards 85. Motherboards may range anywhere from five slot machines to eight slot machines, for example. Here, the motherboard 67 is an Intel PBP133ED70NC. As noted above, the data mover or control station processing unit module 28 has eight I/O adapter card slots 84, 86 (i.e., 3 PCI, 4 ISA, and 1 mixed PCI/ISA). It also has 4 SIMM slots 82 (FIG. 5E), uses a Triton Chipset, and is capable of 100 MB sustained throughput between processing unit 28 main memory 82a and the PCI bus. When the motherboard 67 is configured in a data mover, the two leftmost slots 84 house single channel SCSI cards, for example, that interface to the storage devices in the data storage system 12 (FIG. 1). Moving to the right, the next two slots 84 are for connection to the network 14 (FIG. 1) (i.e., combinations of 100 base T Ethernet, FDDI, ATM or other adapters); the following two slots 86 to the right of the network connectors are here reserved for expansion, and the two rightmost slots 86 are 10 baseT Ethernet bus for communications between the data mover and the control stations $22_1$, $22_2$.

Because these motherboards 67 and adapter boards 85 are available in large quantities from a variety of sources, the data server 10 has relatively low cost and high performance. Further, with respect to the use of standard I/O adapter cards, the data server 10 can rapidly deploy new network interfaces to the market. A fully loaded data server 10 has 60 slots 84, 86 that can be configured with network and/or storage I/O adapter cards 85. Each server motherboard 67 has four available full length PCI slots and each control station has two available full length PCI slots. An exemplary data server 10 is configured with four-port Ethernet network adapters and single SCSI adapters would yield a system with one hundred and twenty network 12 connections and thirty data storage system 14 connections.

The server interconnect printed board 68 provides the status, control and communication interfaces for the server 10. In effect, the server interconnect printed circuit boards 68 serve as a bridge between the motherboard 67 and the server 10 via the backplanes $30_1$–$30_4$. The server interconnect printed board 68 performs the following functions: (1) It provides a point of load DC-to-DC conversion for the motherboard 67; (2) It contains a control bus that allows the control station processing unit module 28 to perform numerous environmental operations to the data mover processing unit modules 28; (3) It collects the environmental status that is local to the data mover and/or control station processing unit module 28 and reports on exceptional conditions; (4) It contains an Enhanced Parallel Port (EPP) which allows the motherboard 67 to gather Vital Product Data (VPD) and other configuration information, enables their battery backup functions, solicits on exceptional system conditions, signals the control station via the control bus, and accesses other system interfaces; (5) It contains a Legacy Parallel Port (LGP) that interfaces the control station to the COMM board (COMMBD) which contains other information/control about the system's configuration and environment; (6) It has the pair of the redundant Ethernet XCVRs to provide the means in which the communications Ethernet bus 24 is routed to other server/control stations; and, (7) It provides the physical path for modem access from the control station.

Referring to FIGS. 5B, 5C and 5E, a Teradyne High Density Metric (HDM) connector 93 is mounted to the rear of server interconnect printed circuit board 68. The rear of the HDM connector 93 projects outward from a slot 94 provided in the rear panel 98 of the processing unit module 28 (FIGS. 5D and 5F); FIG. 5F showing processing unit module 28 with the interconnect printed circuit board 68 removed. The upper portion 95 of connector 93 is adapted to receive the 48 volts provided by the AC/DC converters 38 (FIGS. 6 and 8) on the 48 volt bus system. The middle and lower portions 97, 99 of the connector 93 (FIG. 5B) are adapted to receive signals via the backplanes $30_1$–$30_4$. Disposed between the middle and lower portions 97, 99 of connector 93 is a hole 101. The rear panel 98 of the processing unit module 28 (FIG. 5B) is provided with a hole 105, as shown, disposed below the connector 93. As will be described below in connection with the server cabinet 18, this arrangement is used in a three-step "blind mating" arrangement enabling hot replacement of the processing unit module 28 from a backplane $30_1$–$30_4$ into which the processing unit module 28 plugs.

Referring again to FIGS. 5G and 5H, the front panel bezels 110 of the data mover $20_1$ module 28 and control station $22_1$ module 28 are shown, respectively. The front bezels 110 have a handle 111, as shown. On the front bezels 110 of each are several switches 79 and indicators 77. More particularly, a service switch used only for manufacture, power enable LED indicators to indicate that power is enabled within the data mover $20_1$–$20_{14}$, or control station $22_1$–$22_2$; a fault LED to indicate a failure in the control station or data mover module 28, a push button reset switch to perform a hard reset to CPU 80 mounted on the motherboard, and status LEDs. (The reset switch is a mechanical switch which restarts the CPU 80 to initiate a boot of the operating system software into the main memory 82a. As will be described in connection with FIG. 16, a program is stored in the processing unit module 28 (a portion in the flash memory mounted to the motherboard 67, mentioned above, and another portion on the Ethernet adapter cards plugged into the motherboard 67) to automatically reset the CPU 80 until the CPU 80 finds an operational and valid source for the operating system software.) Here, there are twelve small status LEDs 77 (FIGS. 5G, 5H) to provide additional information about the internal state of the data mover and/or control station module. The front bezel 110 of the control station 22 module 28 shows the physical location of the I/O adapter card slots 84, 86. As described above, slot numbers 3 and 4 are PCI slots and slots 5 through 8 are ISA slots. FIG. 5G shows the front bezel 110 of the data mover and the physical location of the I/O adapter card slots 84, 86. As described above, slots 1 through 4 are PCI slots. Slot numbers 5 through 8 are ISA slots. Also, the front bezel 110 is provided with a pair of openings 113a, 113b (FIG. 7) to enable connection of the a pair of redundant Ethernet I/O adapter cards via connectors 113c, 113d (FIG. 7) between the pair of Ethernet I/O adapter cards (EI/O) and a corresponding one of a pair of redundant Ethernet transceivers (XCVRs) mounted to the server interconnect printed circuit boards 68, as shown, and to be described in connection with, FIG. 7.

Thus, in summary, the data movers/control stations comprise of a motherboard 67, a server interconnect printed circuit board 68, I/O adapter cards 85, DC powered fan 76, 78, and a mechanical enclosure, or case for the processing unit module 28. The case has a latching mechanism 222 to be described in connection with FIGS. 10A–10F. Thus, referring again briefly to FIGS. 5G and 5H, the modules 28 include on their front bezels 110 panel, a handle 111 and locking mechanism 222 that is used, as described above, to insert or remove the module 28 from the cabinet 18. The I/O adapter card slots 1–8 for data movers $20_1$–$20_{14}$ and slots 3–8 for control stations $22_1$, $22_2$ are visible from the front bezels 110 of the data mover or control station module 28.

I/O ADAPTER CARD MOUNTING PLATE 312

Figure 9A:
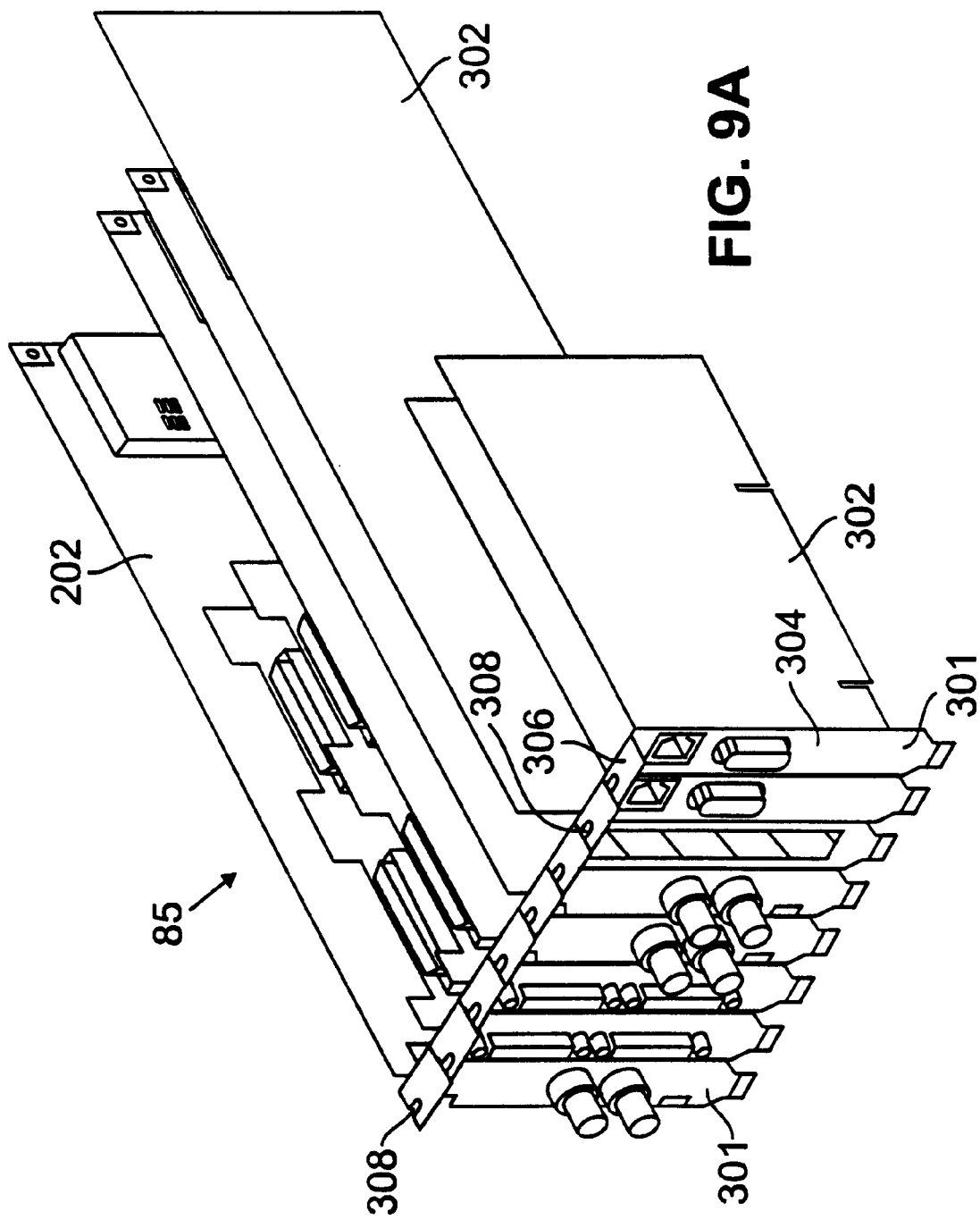
FIGS. 9A though 9C are drawings used to illustrate an I/O adapter card mounting plate according to the invention.
Figure 9B:
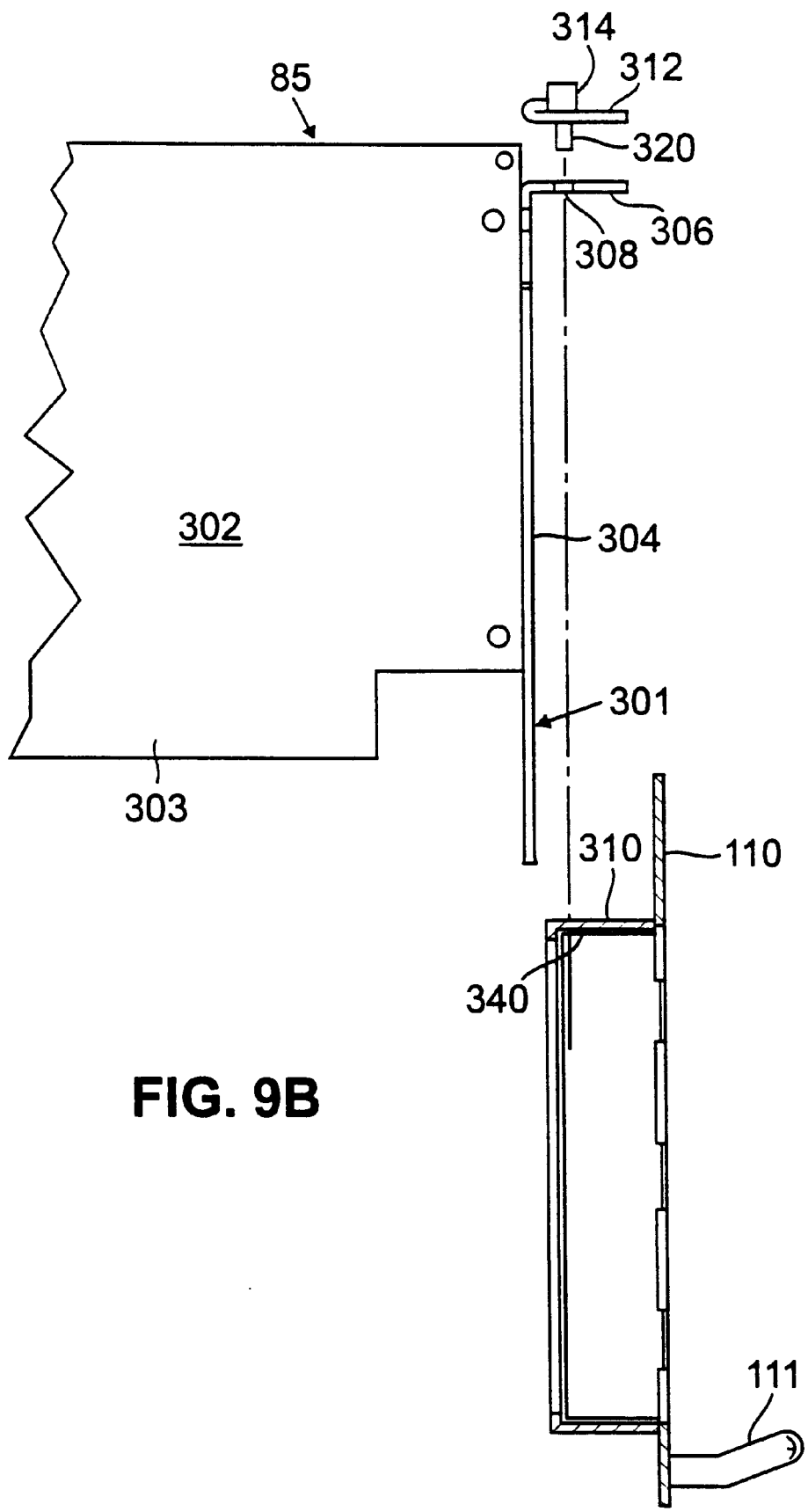
FIG. 9B is an exploded cross-sectional diagrammatical sketch showing the arrangement between the mounting plate, an I/O adapted card and a mounting member provided on a front bezel of a module.

An exemplary array of I/O adapter cards 85 is shown in FIG. 9A. It is noted that the I/O cards 85 are off-the-shelf printed circuit boards having an L-shaped mounting bracket 301. Each one of the L-shaped mounting brackets 301 has a leg portion 304 fastened to a printed circuit board, or card 302 and a foot portion 306 with a U-shaped opening 308 passing through the foot portion 306 normally used to receive a screw, not shown, used to securing the bracket 301 to a mounting member 310 of the case (i.e., module 28 enclosure), for example. The L-shaped mounting bracket 301 is, noted above, affixed to a printed circuit card 302. The printed circuit card 302 is adapted to have its bottom edge 303 plug into one of the slot 84, 86 (FIG. 5E) in the motherboard 67. After the printed circuit card 302 is plugged into the motherboard 67, rather then securing the L-shaped mounting bracket 301 to the front panel 110 mounting member 310 with individual screws, a mounting plate 312 having a plurality of captive screws 314 (FIG. 9C) is used. More particularly, and referring also to FIGS. 5B, 5F and 9B, the mounting plate 312 has press fit into a plurality of holes 316 (FIG. 9C) formed therein a corresponding plurality of screw fixtures 320, here manufactured by Penn Engineering and Manufacturing Company, Danboro, Pa. 18916, and a plurality of press fit pins 317 having tips 317a which project from the bottom of the plate 312 as a single unit to engage the U-shaped openings 308 in place of individual screws. The screw fixtures 320 have an outer collar which is press-fit into the holes 316 in the mounting plate 312 to thereby secure the screw fixtures 320 to the mounting plate 312 as a single unit. The screws 314 are rotatably mounted within the screw fixtures 320. The distal ends 320 of the screws 314, and, as described above, the tips 317a of pins 317, project outwardly from the bottom of the mounting plate 312. After one, or more, of the printed circuit boards 85 are plugged into the motherboard 67, the bottom of the mounting plate 312 is set over the horizontal foot portion 306 of the L-shaped mounting brackets 301, as shown in FIG. 9B. The technician, using his/her thumb and forefinger about the outer periphery of the screws 314, turns the screws 314 within the fixture 320 clockwise to screw the screws 314 into the corresponding, tapped and threaded holes 340 provided in the front panel 110 mounting member 310 thereby mounting the entire mounting plate 312 to the front panel 110 mounting member 310. Thus, the mounting plate 312, when secured to the front panel mounting member 310, fastens the L-shaped brackets 304 to such front panel mounting member 310. Conversely, to remove one or more I/O adapter cards 85, the technician turns the screws 314 counter-clockwise until the mounting plate 312 is released from the front panel mounting member 310. The technician then lifts and removes the mounting plate 312. Once the mounting plate 312 is removed, the technician unplugs the desired I/O adapter card or cards 85. As noted above, the screws are captive to the mounting plate 312 (i.e., the screws 314 in their fixtures 320 are captive hardware to the mounting plate 312). Further, the mounting plate 312 is a relatively large piece. Therefore, instead of having to contend with six or eight individual screws, which are relatively small, difficult to handle individually, and subject to being dropped and difficult to retrieve, the single, relatively large mounting plate with captive hardware greatly facilitates the insertion and/or removal of the I/O adapter cards 85. Still further, a screw driver is not required.

I/O ADAPTER CARD FILLER PLATE

Figure 9E:
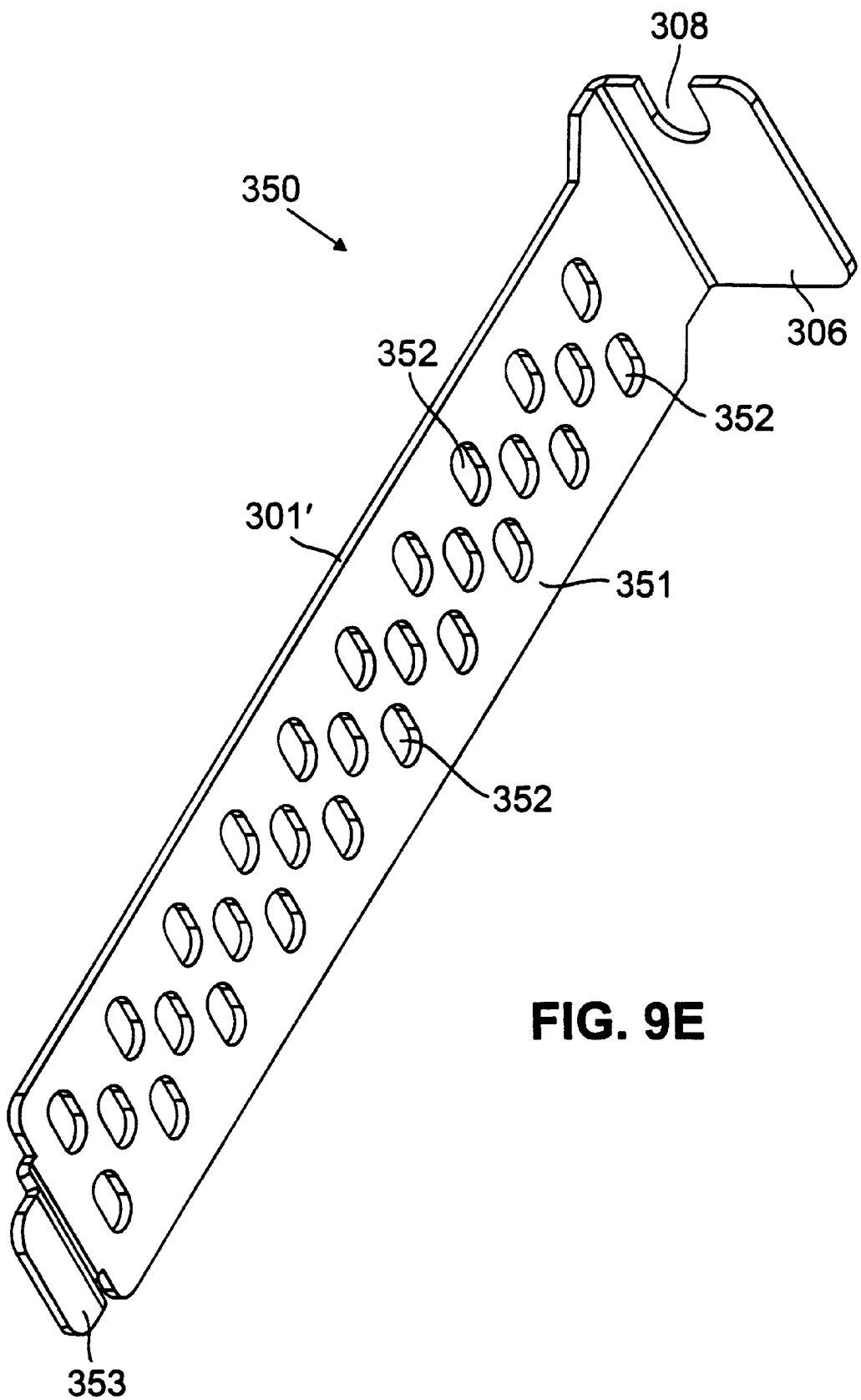
FIGS. 9E–9G are drawings of an I/O adapter card filler plate according to the invention adapted for use in place of an I/O adapter card in FIGS. 9A–9C, FIG. 9E being a perspective view of the filler plate and FIGS. 9F and 9G showing the filler plate of FIG. 9E mounted to the front bezel of a module.
Figure 9F:
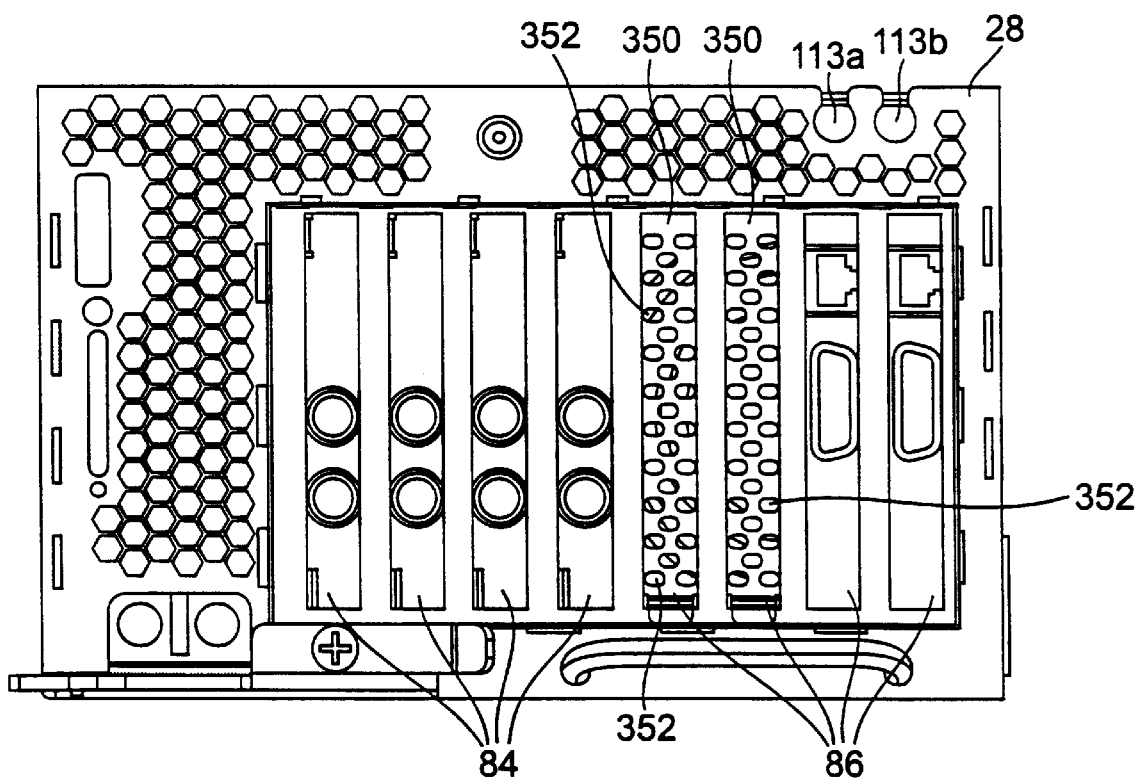
Figure 9G:
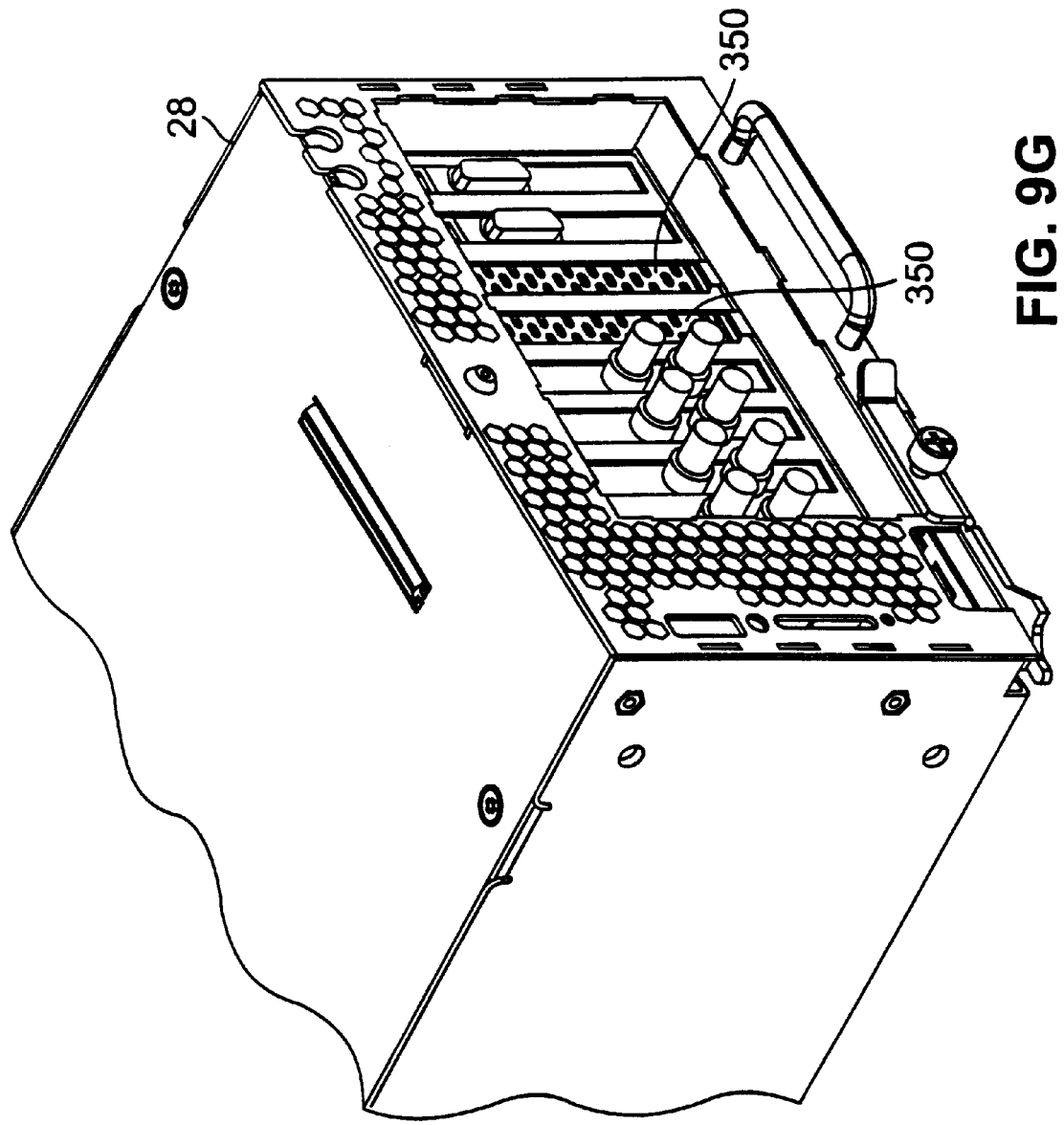

Referring now to FIGS. 9E–9F, an adapter card 85 filler plate 350 is shown. The filler plate 350 has an L-shaped mounting bracket 301' with a foot portion 306. The foot portion 306 has an U-shaped opening 308 similar to that for the I/O adapter card 302 mounting brackets 301, described above. Here, however, the leg portion 351 has a plurality of holes 352 formed therethrough to provide a honey-combed structure. If one of the I/O adapter cards 302 is not needed, one of the adapted card filler plates 350 is substituted for it, as shown in FIGS. 9F and 9G, where the fifth and sixth from the left adapter card filler plates 350 are used in the module 28 to replace a pair of unused I/O adapter cards 302. The filler plates 350 are fastened to the case of the module with the mounting plate 312 (FIG. 9C). Thus, in this example, the tips 317a of pins 317 engage the U-shaped openings 308. This honey-combed, adapted card filler plate 350 improves air-flow through the front panel and across the motherboard 67. It is noted that the distal end 353 is adapted to slip into slot S (FIG. 5D) provided in bottom panel of the case of module 28.

SERVER 10 BACKPLANES $30_1$–$30_2$ WITH PRINTED CIRCUIT ETHERNET BUS

Referring again to FIGS. 3C–3E, the relationship between the server backplanes $30_1$–$30_4$ and the data movers $20_1$–$20_{14}$ processing unit modules 28 and control stations $22_1$–$22_2$ processing unit modules 28, is shown. Thus, four backplanes $30_1$–$30_4$ connect up to fourteen stream servers $20_1$–$20_{14}$ and two control stations $22_1$–$22_2$. More particularly, fastened within in the cabinet 18 (FIG. 1) is a set of four sheet metal chassis 200, an exemplary one thereof being shown in FIG. 11A. Disposed between upper and lower panels 202, 204 is an intermediate shelf 206 fastened to opposing side panels 210. Partitioning members 212a, 212b (FIG. 8B), are adapted for fastening with captive hardware screws 214, to threaded holes 207 provided in the front and rear center of the lower panel 204 (i.e., which serves as a bottom shelf) and the front and rear center of the shelf 206 (which serves as a middle shelf) to divide the lower panel 204 and/or the shelf 206 into right and left slots or compartments 213a, 213b each compartment being adapted to receive a module 28, as shown in FIG. 11F. Thus, when the partitioning members 212a, 212b are fastened to lower panel 204 and the shelf 206, the chassis 200 is adapted to receive four modules 28, as described above, as shown in FIG. 11F. If, however, the width of a module 28 case is increased in the future, the partitioning members 212a, 212b may be removed allowing insertion of a larger module 28 case. The single module 28 case would have its server interconnect printed circuit board connector 93 (FIG. 5B) on the left side of its case so that when the single module 28 case is slide onto the shelf the connector 93 will be able to be plugged into (i.e., mate with) the backplane $30_1$–$30_4$. It is noted that a screw 253 (FIG. 11G) is adapted to pass through holes 253a in the backplane (FIGS. 12B, 13A and 13B) and be threaded into a hole 253d in the rear wall 253c of partitioning member 212b.

Figure 11A:
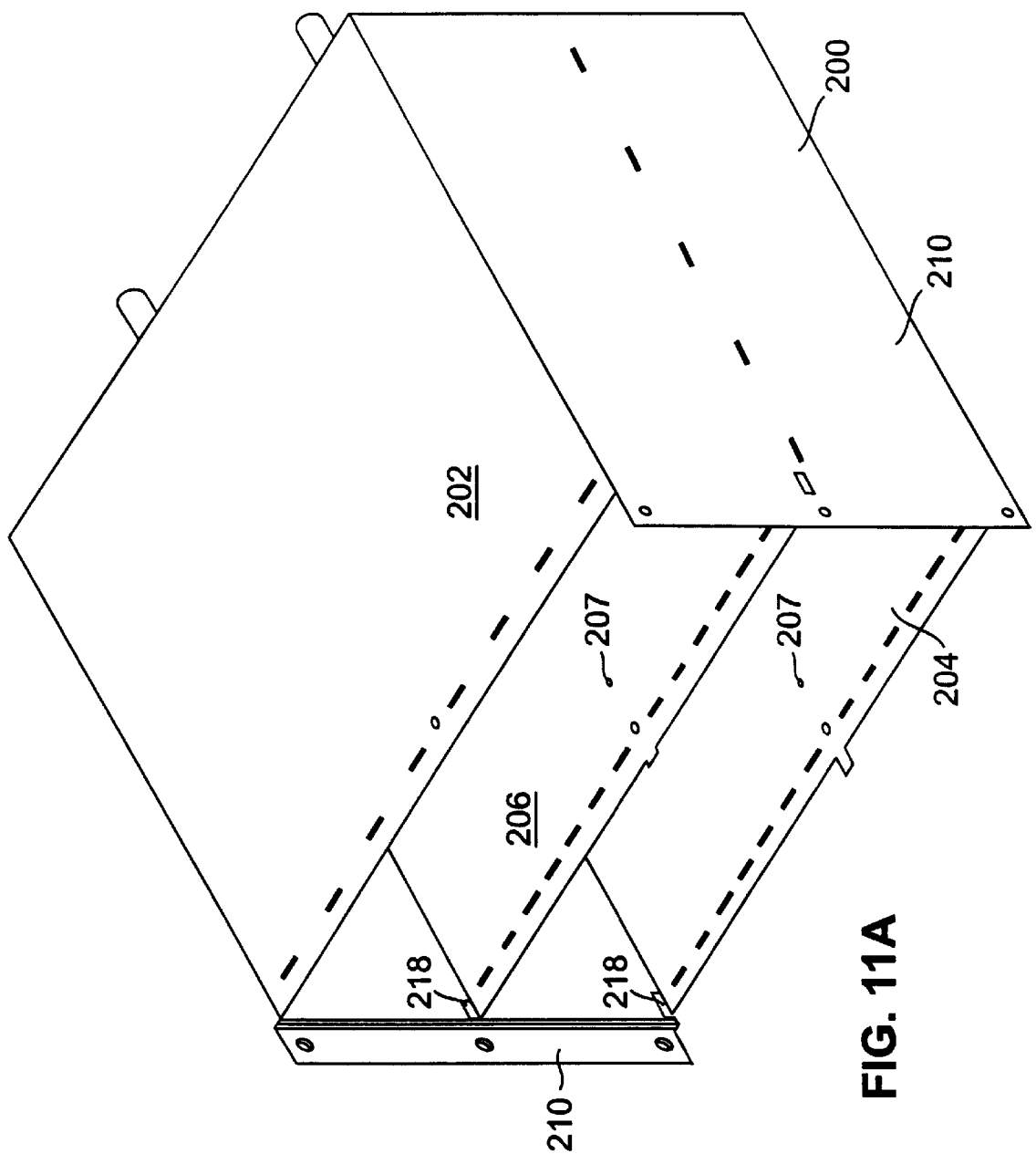
FIGS. 11A–11G are perspective views of a chassis used by the server of FIG. 2 to store up to four processing unit modules shown in FIG. 5A.
Figure 11B:
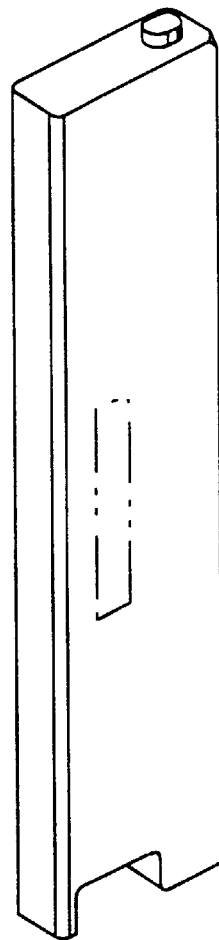
Figure 11B:
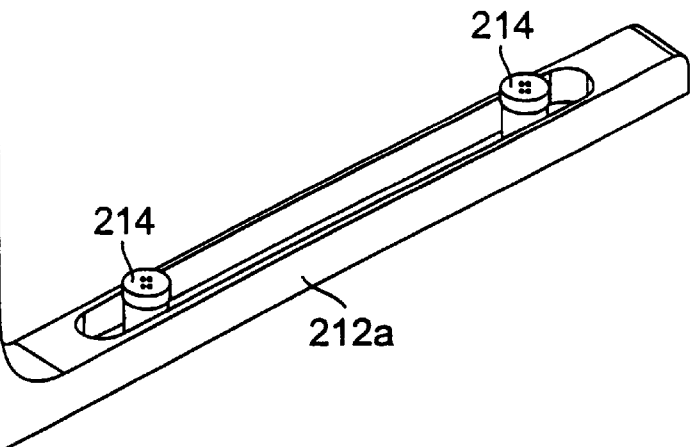
Figure 11C:
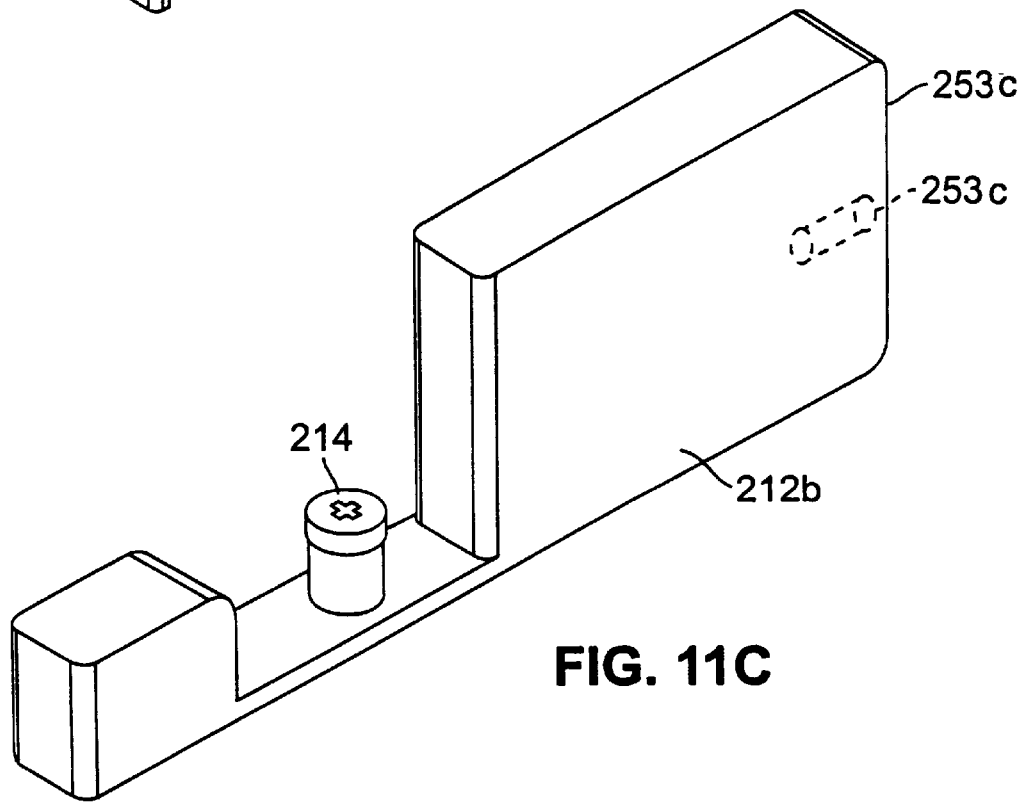
Figure 11D:
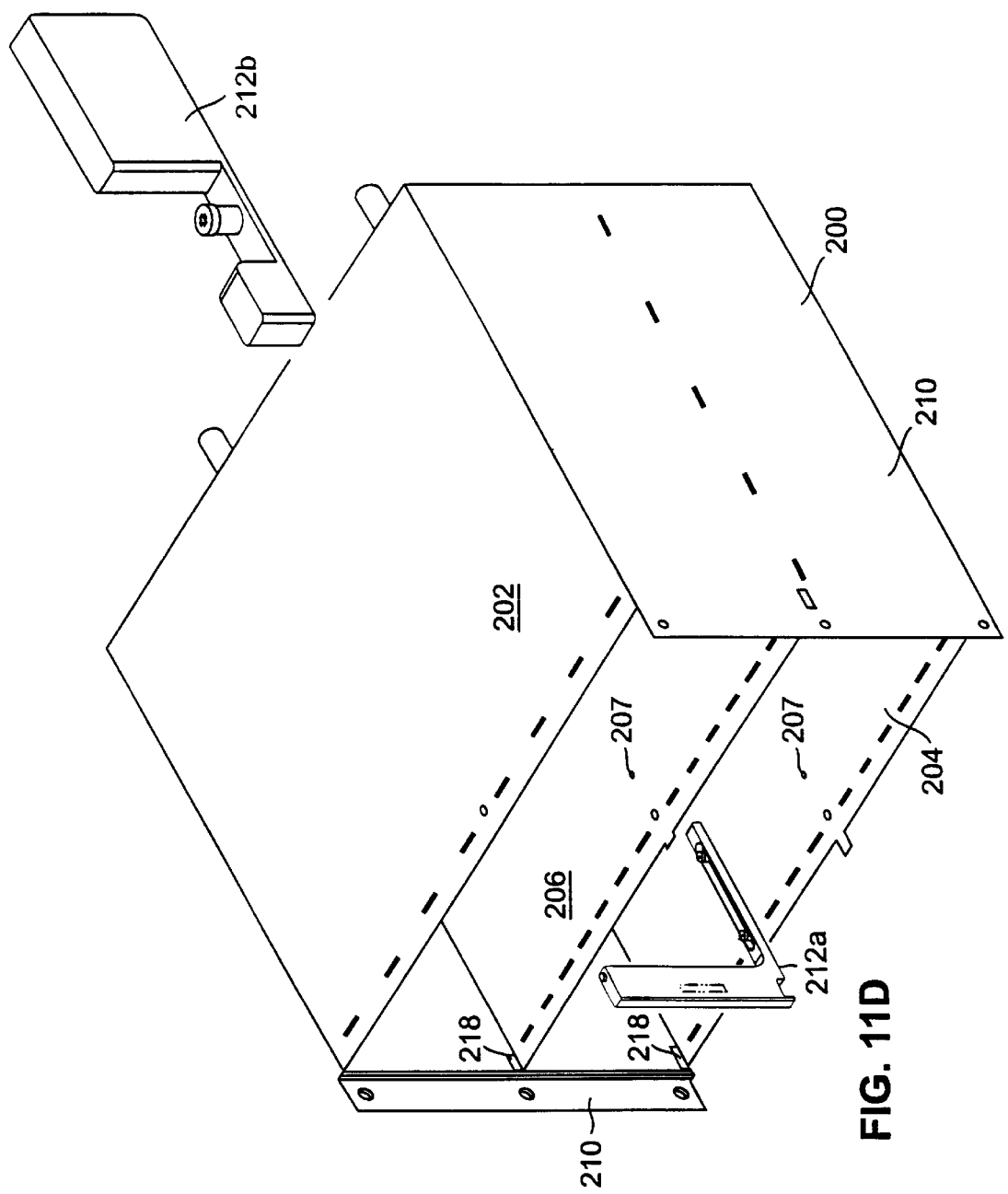
Figure 11E:
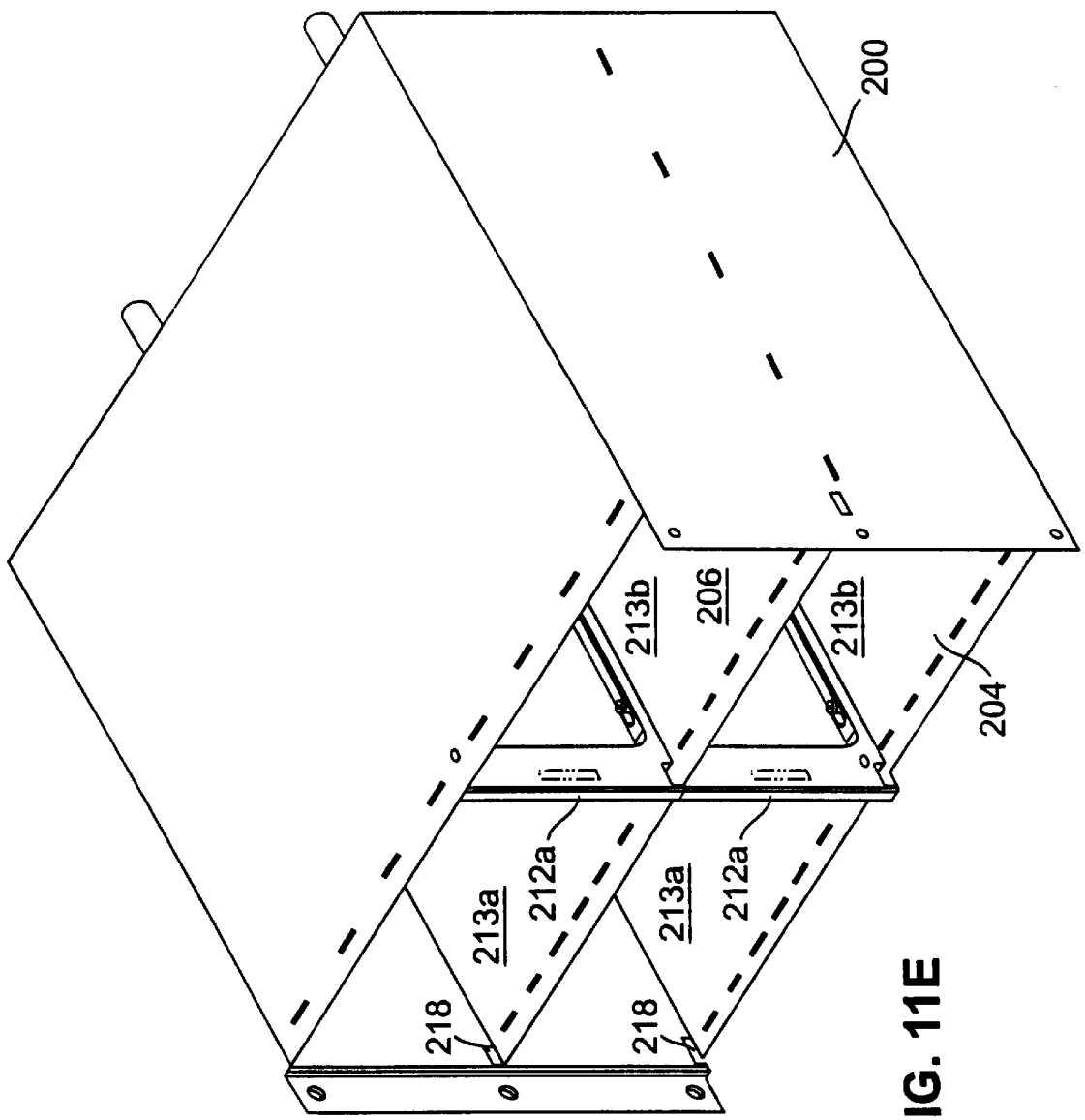
Figure 11F:
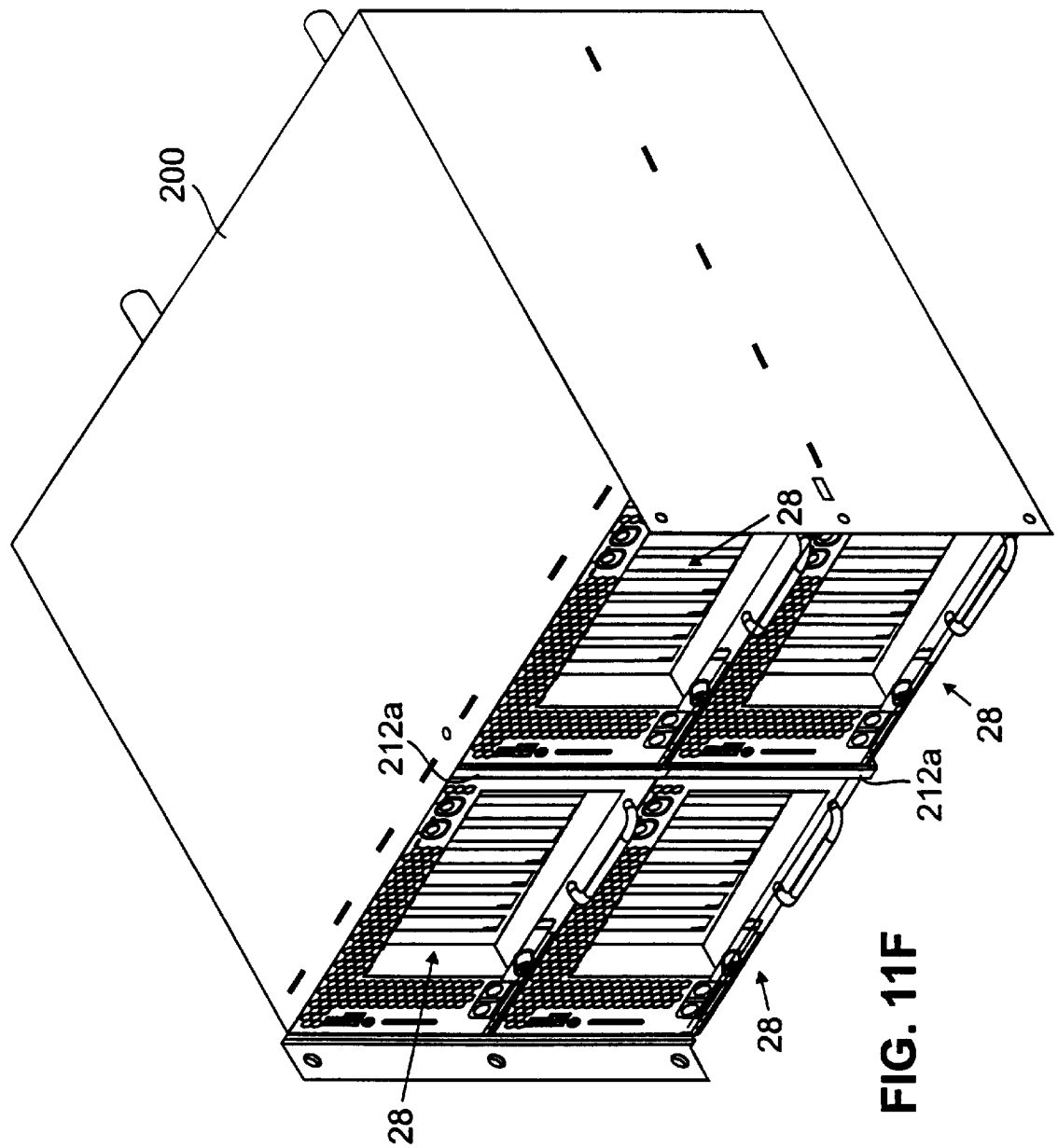
Figure 11G:
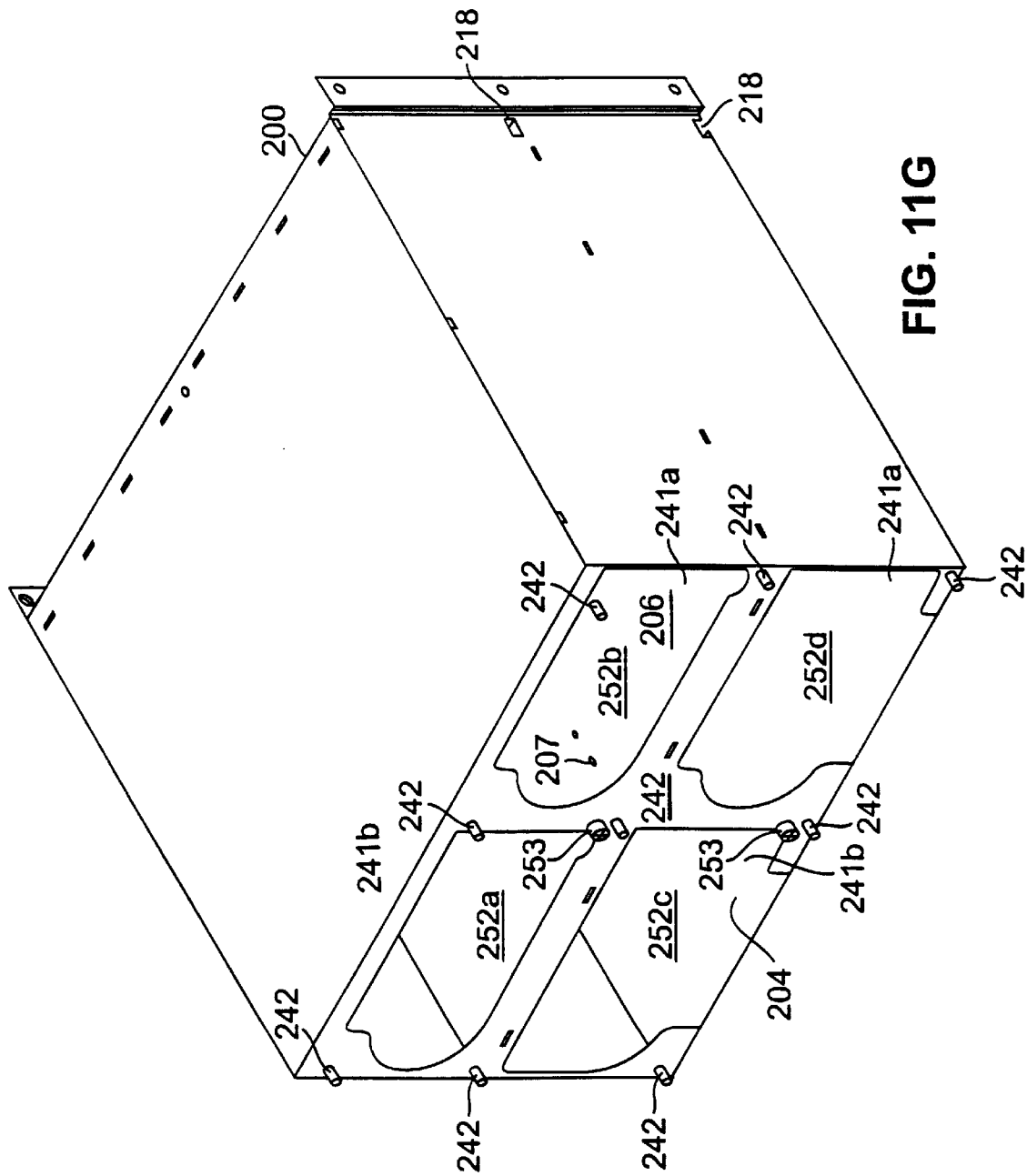

More particularly, and referring also to FIG. 11G, the back panel 240 of the chassis 200 four slots 241a, 241b to enable the connectors 93 of each of the four modules 28 to project therefrom. If a single module 28 is used on any one of the two shelves 204, 206, the connector 93 of such module 28 will project from the appropriate one of the slots 241a.

The front of the side panels 210 are provided with slots 218, as shown in FIG. 11A, 11D. As will be described, such slots 218 are adapted to engage the locking mechanism 222 (FIGS. 5G and 5H) on the module 28 to lock/unlock the module 28 in the cabinet 18.

As mentioned above, the chassis 220 has a rear panel 240 fasten to it, here welded, as shown in FIG. 11G. The rear panel 240 is provided with nine posts 242 (FIG. 11E) to receive corresponding nine holes 248 passing though a corresponding one of the four backplanes $30_1$–$30_4$, an exemplary one being shown in FIG. 12A and 12B, the chassis 200 not being shown for clarity. Further, the rear panel 240 carries captive screws 243 which are adapted to pass through holes 253a in the backplane (FIG. 13A, 13B) into a threaded rear wall 235c (FIG. 11C) in partitioning member 212b (FIG. 11C).

Figure 12A:
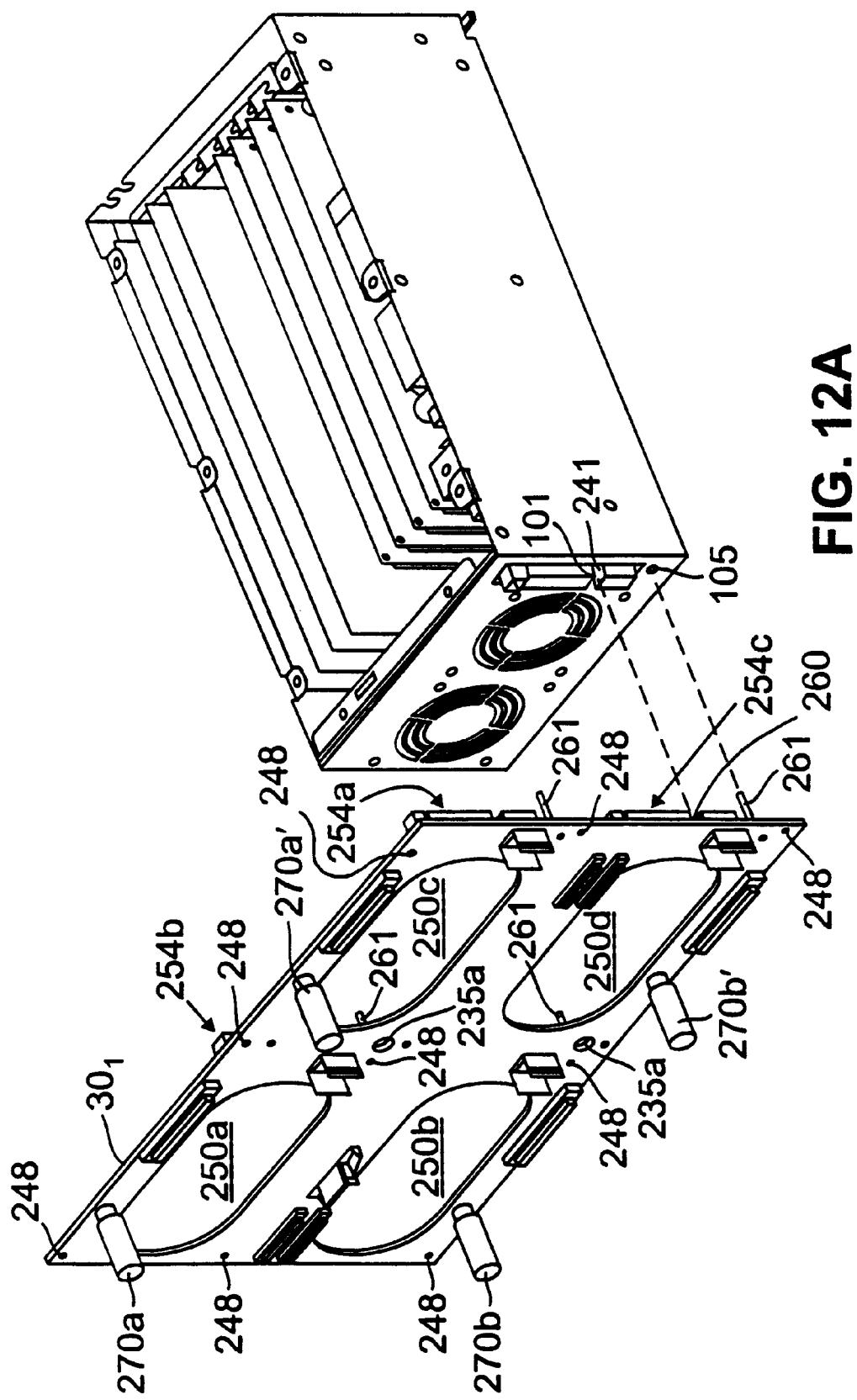
Figure 12B:
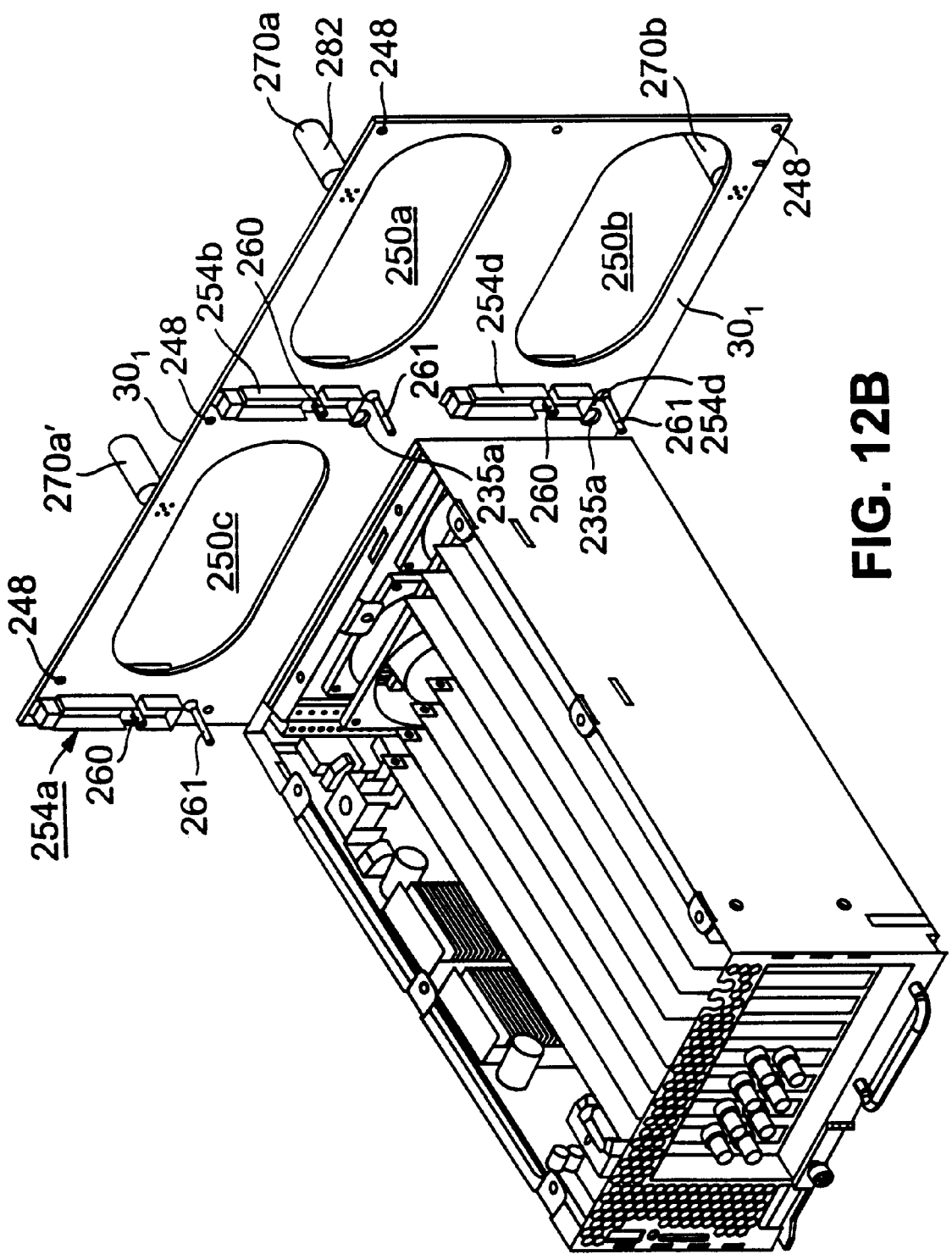

The backplanes $30_1$–$30_4$ are identical in construction, an exemplary one thereof, here backplane $30_1$ being shown in FIGS. 12A and 12B. The backplane $30_1$ is a multi-level printed circuit board. The front of the backplane $30_1$ is shown in FIG. 12A to include four oval apertures 250a–250d (FIG. 11A) adapted to align with the four oval openings 252a–252d provided in the chassis 200 rear panel 240 (FIG. 11E). Four Teradyne HDM connectors 254a–254d (FIGS. 12A, 12B) are fastened to the backplane $30_1$, as shown; one to the right of a corresponding one of the four apertures 250a–250d in FIG. 12B looking from the front of the cabinet 18. Each Teradyne HDM connector 254a–254d includes a forward projecting alignment pin 260, as shown for exemplary connector 254a in FIGS. 12C and 12D. Each backplane $30_1$–$30_4$ has fastened to it four longer alignment pins 261, as shown more clearly in FIGS. 12C and 12D.

Figure 12D:
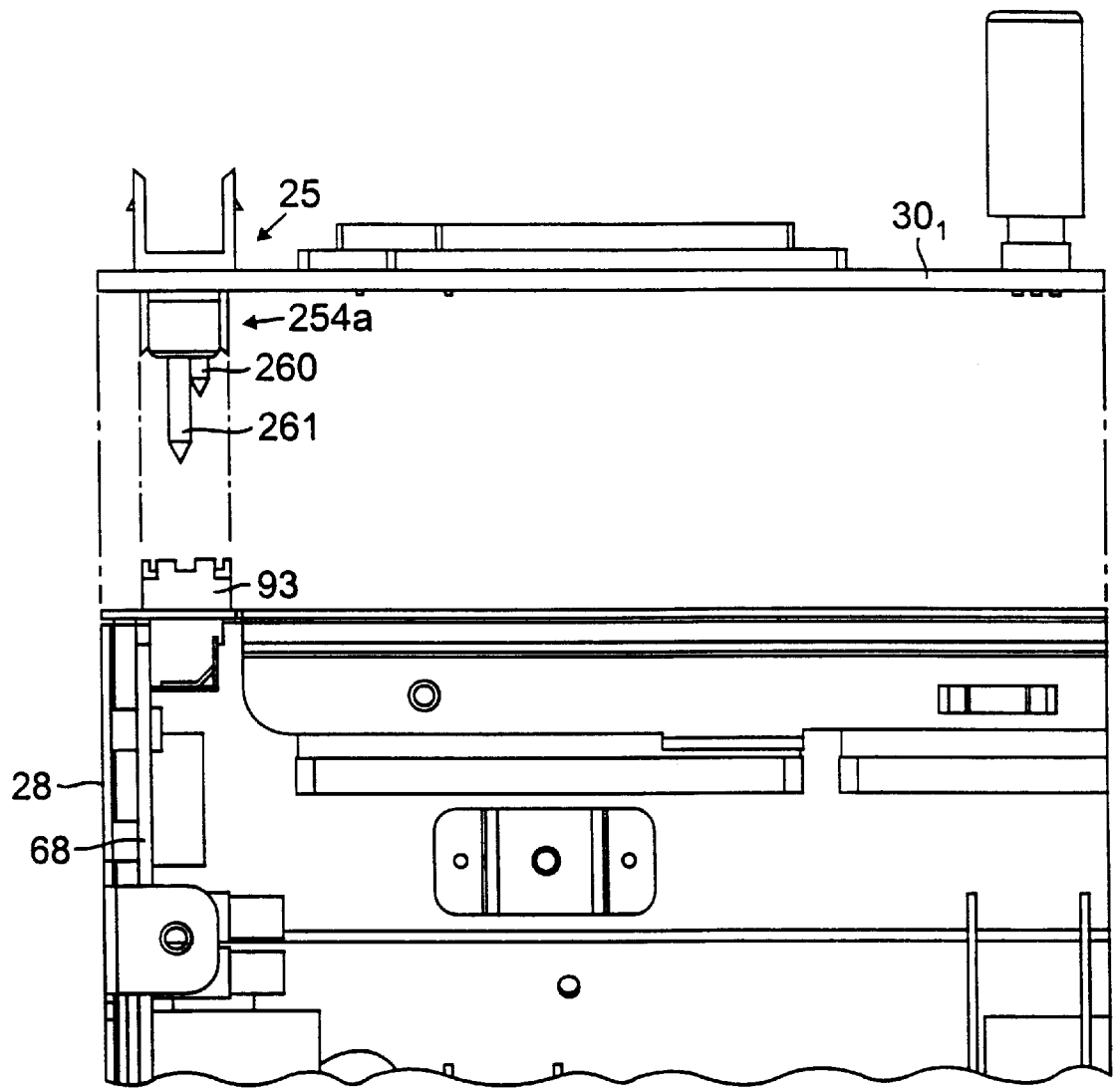

As described above in connection with FIG. 5B, a Teradyne High Density Metric (HDM) connector 93 is mounted to the rear server interconnect printed circuit board 68 (FIG. 12D). More particularly, the server interconnect printed circuit board 68 is loosely mounted to the case 28 so that it may move slightly upward if needed in mating connector 93 with connector 254a. The rear of the HDM connector 33 projects outward from a slot 94 provided in the rear of the module 28 (FIG. 5F) and in the rear panel 242 of chassis 200 (FIG. 11E); FIG. 5F showing module 28 with the interconnect printed circuit board 68 removed. The upper portion 95 of connector 93 is adapted to receive the 48 volts provided by the AC/DC supplies 38 (FIG. 6). The mid and lower portions 97, 94 of the connector 93 are adapted to receive signals. Disposed between the mid and lower portions 97, 94 of connector 93 is a hole 41, as described above in connection with FIG. 5B. The rear panel 98 of the module 28 (FIG. 5B) is provided with a hole 105, as shown, disposed below the connector 93. The HDM connectors 93 of the data movers $20_1$–$20_4$ plug into backplane $30_1$; the HDM connectors 93 of data movers $20_5$–$20_8$ plug into backplane 302; the HDM connectors 93 of data movers $20_9$–$20_{12}$ plug into backplane $30_3$; and the HDM connectors 93 of data movers $20_{13}$, $20_{14}$ and of control stations $22_1$, $22_2$ plug into backplanes $30_4$. The control stations $22_1$, $22_2$ modules 28 as well as the data movers $20_1$–$20_{14}$ modules 28 are hot replaceable directly (i.e., without any cables between the module 28 and the backplane $30_1$–$30_4$ and without any interruption to the operation and data processing of the server 10).

In operation, the plugging of a module 28 into the backplane $30_1$, for example, is a three-step process. First, as the module 28 is slid backwards toward the backplane $30_1$, the point at the end of pin 261 engages the hole 105 (FIG. 12A) in the module 28 thereby guiding (i.e., aligning) the module 28 onto the shaft of the pin 261. Next, during the second step, as the chassis 28 is further urged rearward, the tip of shorter pin 260 of HDM connector 254a engages the hole 101 in HDM connector 93 thereby guiding the connector 93 onto the shaft of the pin 260. As noted above, the server interconnect printed circuit board 68 is loosely mounted to the module 28 so that it may move slightly in the module 28 as hole 101 and pin 260 engage each other. Finally, during the third step, the plastic housings 257, 259 of the HDM connectors 93, 254a engage each other. This procedure enables "blind-mating" between the module 28 (i.e., the sheet metal case of the module 28) and the backplane $30_1$ thereby enabling the module 28 to be hot plugged into, or removed from the backplane $30_1$, and hence into the data server 10 (FIG. 1). It is noted that the module 28 is plugged into DC provided by the power supplies 38 (FIG. 6), as distinguished from AC. That is, the processing unit module 28 has its own CPU 50, I/O adapter cards 85, main memory 82a and the DC/DC converter 70, is being hot plugged into, or removed from a here 48 volt DC source; i.e., a 48 volt battery backed DC supply 38.

Once the HDM connectors 93, 254a are plugged into each other, the module 28 is locked into the cabinet 18. More particularly, as described above, the bottom of each module 28 has pivotally mounted to the front, lower left corner thereof a locking mechanism 222, as shown more clearly in FIGS. 5D and 10A–10F.

Here, the locking mechanism 222 is an arm 223 pivotally mounted at point 224 (FIG. 10C) to the bottom of the module 28. It is noted that the left side 226 of the locking mechanism arm 223 projects beyond the side 228 of module 28, as shown when the right side 229 of the arm 223 is manually urged rearward against the chassis 28; i.e., in the position shown in FIGS. 10A–10C.

Figure 10E:
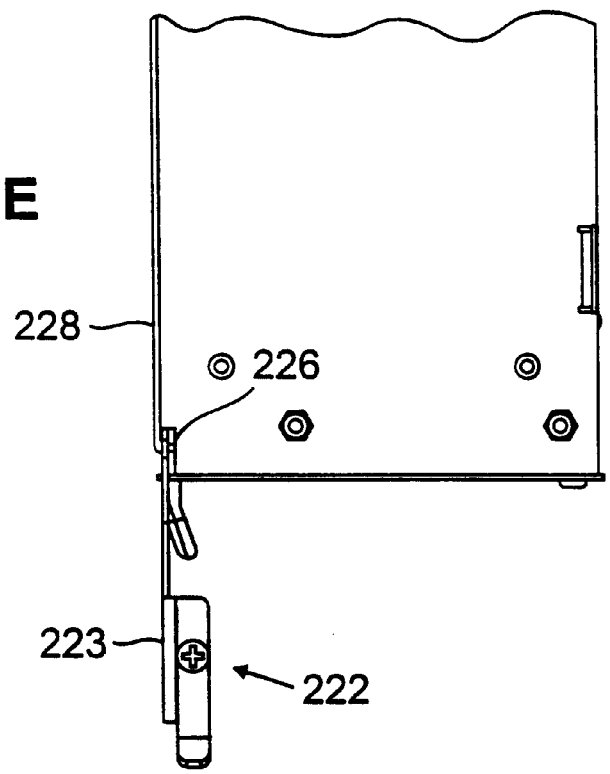
Figure 10F:
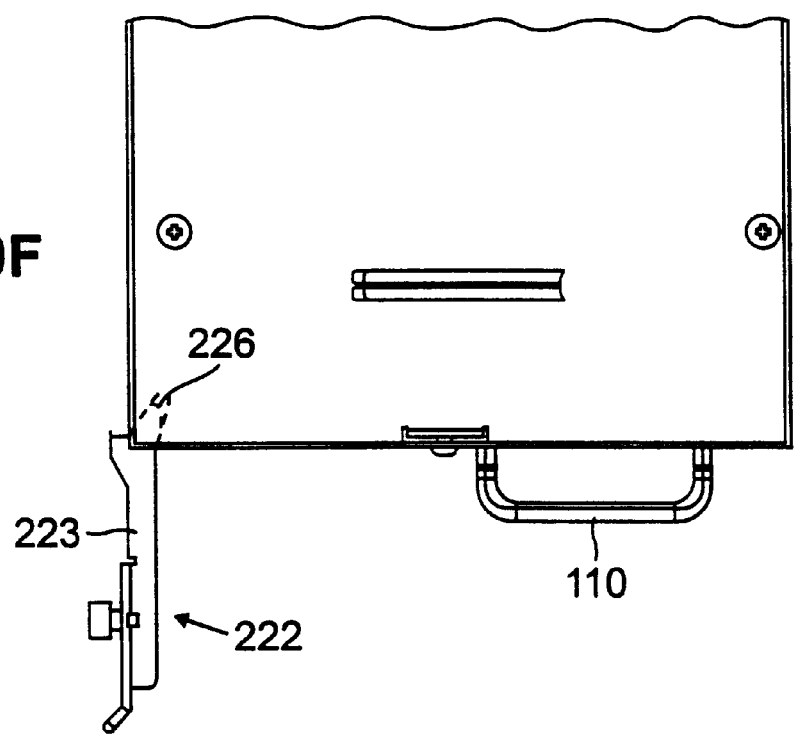

In order to insert the module 28 into the chassis 200, the technician rotates the right side 229 of the arm 223 (i.e., the handle) forward, i.e., in the direction of arrow 231 (FIG. 10C), so that the left side 226 of the arm 223 rotates rearward into a slot 230 provided in the left side 226 of the module 28, as shown in FIGS. 10D–10F. In such position, the left side 226 of arm 223 no longer projects beyond the left side 228 of the module 28 (FIG. 10F), but rather swings rearward and becomes recessed in the slot 230 provided in the left side 226 of the module 28. In this position, the module 28 is slid onto the lower panel, or shelf, as the case may be, of the chassis 200 (FIG. 11D). When fully inserted, the technician urges the right side 229 of the arm 223 forward causing the left side 226 of the arm 223 to pivot rearward (i.e., in the reverse direction of arrow 23) into the slot 218 (FIG. 1C, 1D) provided in the side 206 of the chassis thereby locking the module 220 in the chassis, i.e., preventing its removal unless the technician decides to remove the module 28 by again urging the right side 229 of the arm 223 forward, as described above. It is noted that screw 225 (FIG. 10A) in arm 223 screws into hole 225a (FIG. 10D).

BACKPLANE HAVING STRIP TRANSMISSION LINE ETHERNET

Figure 13A:
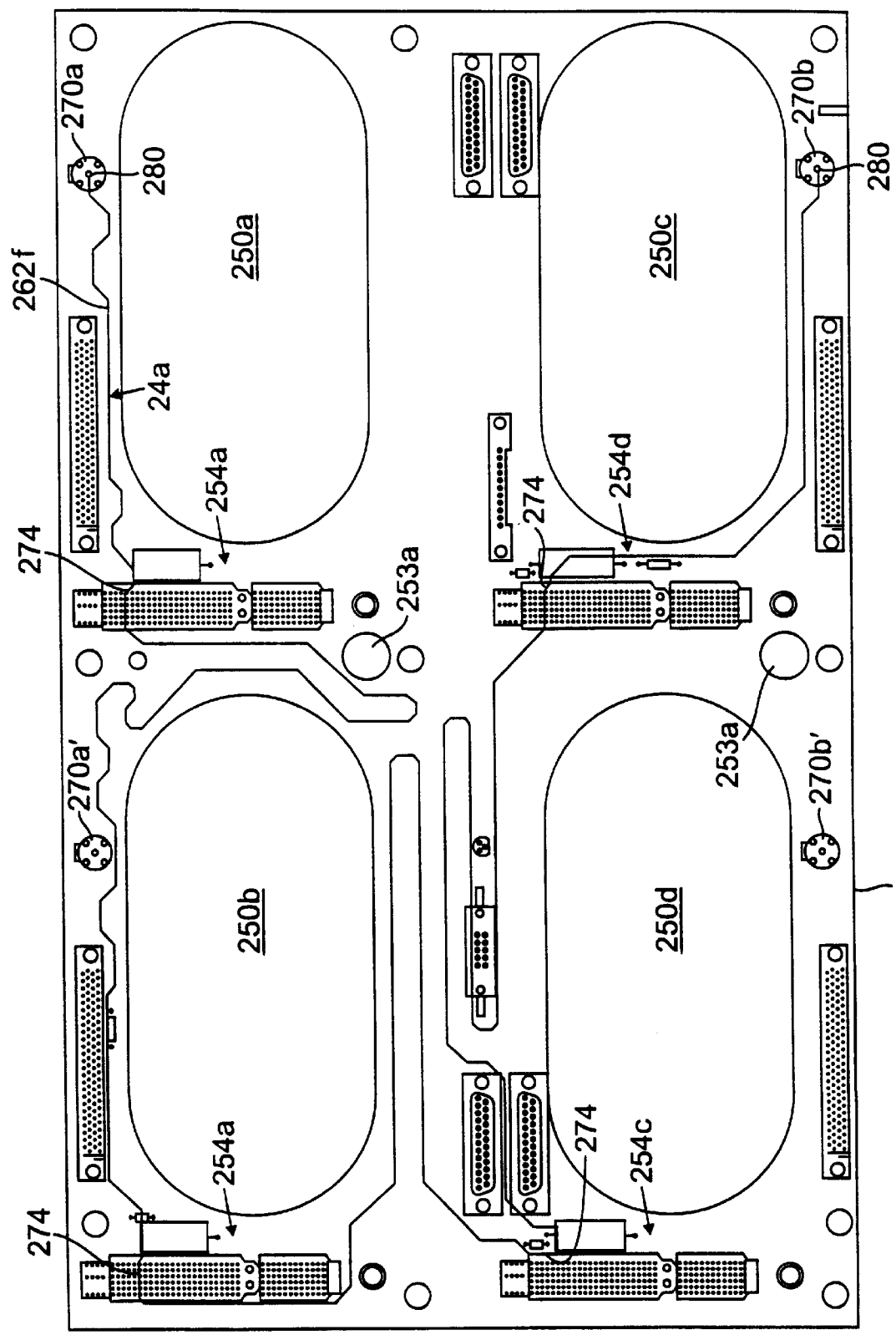
FIGS. 13A and 13B are drawings showing strip conductor circuitry disposed on a front and rear surface of a dielectric substrate used in the backplane of FIG. 4C, such strip conductors overlaying each other to form a strip transmission line Ethernet bus of FIG. 7.
Figure 13B:
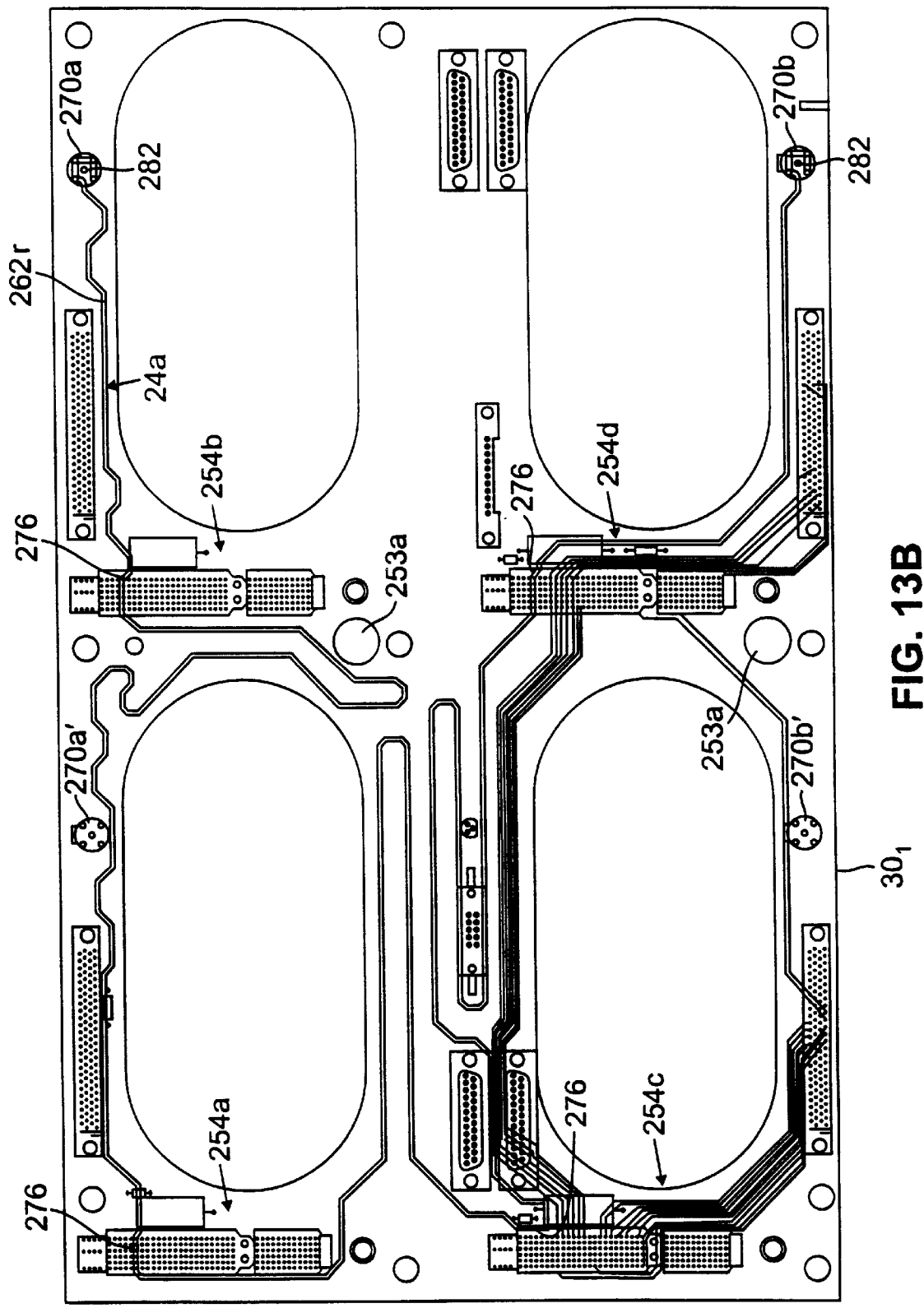

The backplanes $30_1$–$30_4$ are multi-layer printed circuit boards. Patterned into the front and back surfaces of one of the dielectric layers (referred to collectively herein as a dielectric substrate) of the printed circuit boards of the backplane $30_1$–$30_4$ are strip conductor circuitry 262F, 262R, as shown in FIGS. 13A and 13B, respectively. Patterned into the front and back surfaces of another one of the printed circuit board layer of the backplane $30_1$–$30_4$ are strip conductor circuitry, not shown for a redundant Ethernet bus. The two layers are bonded together with suitable dielectric insulation to prevent electrical short circuits developing between the redundant Ethernet busses 24. Considering one of the two Ethernet buses, here bus 24a, and recognizing that the second bus 24b (FIG. 8) is substantially identical to the first Ethernet bus 24a, the strip conductor circuitry 262F, 282B meanders, as shown, from a first Ethernet connector 270a, serially to a pair of pins 274, 276 of each of the Teradyne connectors 254a–254d to a second Ethernet connector 270b thereby providing the local Ethernet bus 24a (FIG. 1) interconnecting the four modules 28 plugged into the backplane $30_1$. (It is noted that Ethernet connectors 270'a, 270'b are used for the redundant bus 24b, not shown).

Here, four Ethernet connectors 270a, 270b, 270'a–270'd, are here BNC 10Base2 Ethernet connectors, mounted adjacent to a corresponding one of the apertures 250a–250d. Each Ethernet connector 270a–270b is a coaxial connector having a center conductor 280 (FIG. 13A) and an outer conductor 282 (FIG. 13B). The center conductors 280 of the four Ethernet coaxial connectors 270a, 270b are connected to strip conductor circuitry 262F while the outer conductor 282 is connected to strip conductor circuitry 262R. It is noted that the strip conductors 262F, 262R overlay one another as they pass from the first Ethernet connector 270a to the second Ethernet connector 270b. Further, the width of the return strip conductor 262R is wider that the width of the signal strip conductor 262F thereby providing a strip transmission line. In order to emulate a coaxial transmission line, the AC impedance and DC resistance of the overlaying strip conductor (i.e., the strip transmission line) are designed to have the substantially the same AC impedance and DC resistance of an Ethernet coaxial transmission line. More particularly, the AC impedance and DC resistance of the overlaying strip conductor (i.e., the strip transmission line) is designed to provide an AC impedance, Z, of 50 ohms and a DC resistance, R, of 1.37 milli-ohms per inch. The following equations may be used:

$$Z = \frac{87}{(e_r + 1.41)^{1/2}} \ln \frac{5.98h}{(.8\,w + t)}$$

$$R = \rho(L/A) \;\Omega/\text{inch}$$

where:
  $e_r$ is the permissivity of the dielectric layer
  w is the width of the signal strip conductor 262F
  h is the thickness of the dielectric layer
  t is the thickness of the signal conductor 262F
  p is the resistivity of the signal or return conductor 262F, 262R
  L is the length of the signal conductor 262F and
  A is the area of the signal conductor 262F By altering the geometry of the height (h), width (w), thickness (t), length (L) and area (A) the values of Z=50 ohms and R=1.37 milli-ohms per inch are obtained. It should be noted that the return conductor 262R serves as an radio frequency ground plane for the signal conductor 262F and therefore should be wider that the signal conductor 262F. That is, the signal on the Ethernet bus 24a, 24b has a frequency of 10 MHz. Thus, the overlaying signal conductor 262F and return conductor 262F (with the intermediate dielectric printed circuit board layer) provide a strip transmission line for the Ethernet 10 MHz signal. Thus, the return conductor 262R effectively serves an a non-DC ground, RF ground plane for the strip transmission line and is here 5 times greater in width than the width, w, of the signal conductor.

To put it another way, the Ethernet busses 24a, 24b on the backplane $30_1$ are formed as strip transmission lines. That is, the backplane printed circuit board is provided with a pair of overlying strip conductors forming a strip transmission line. The strip transmission line is configured to have electrical characteristics of a coaxial transmission line. More particularly, the AC impedance and DC resistance of the strip transmission line are selected to configure the strip transmission line as an Ethernet coaxial transmission line.

Figure 7:
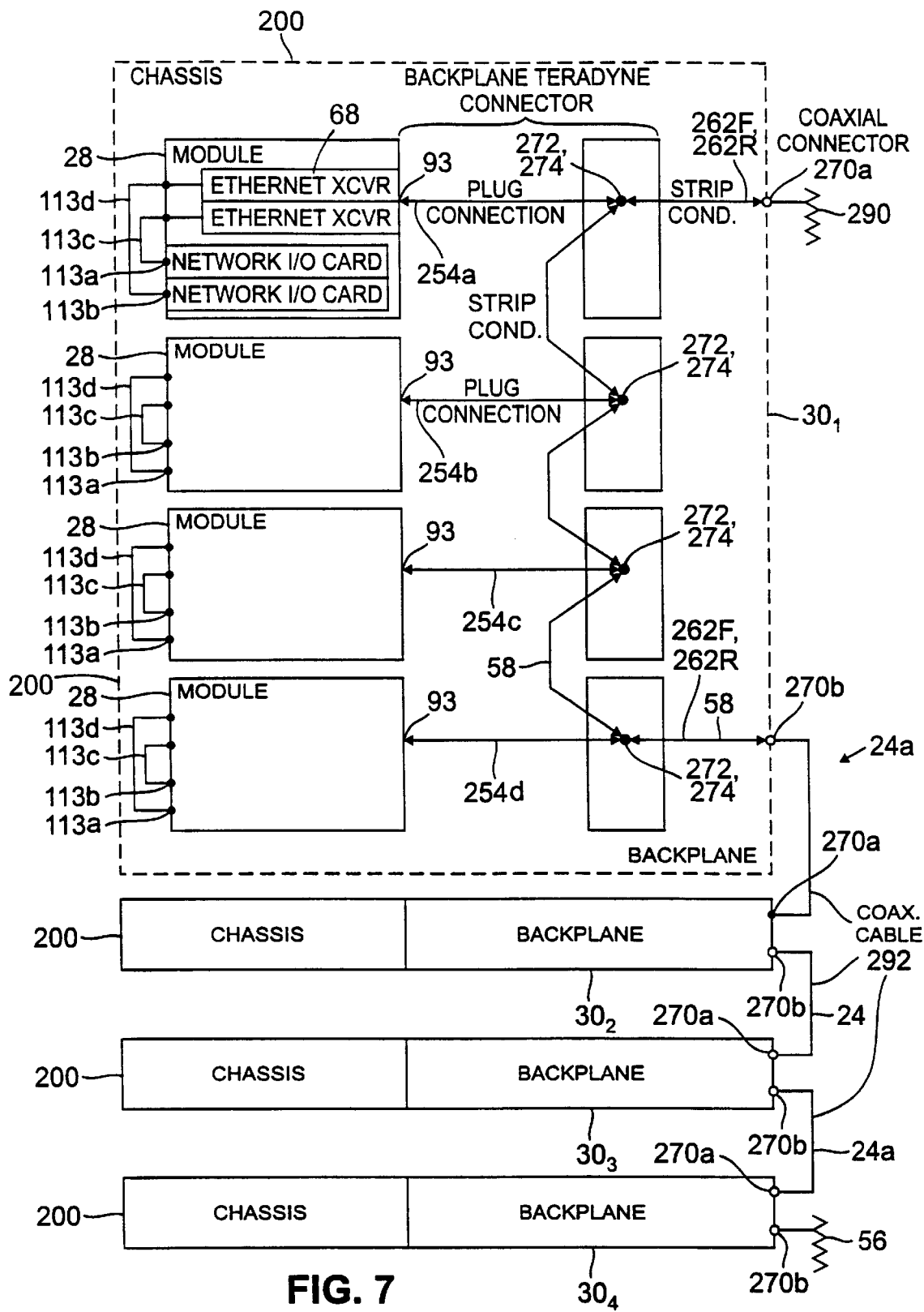
FIG. 7 is a diagrammatical sketch showing a Ethernet strip transmission line, according to the invention, formed on a backplane and used to interconnect modules plugged into the backplane and coaxial cables used to interconnect a plurality of such backplanes.

Referring now to FIG. 7, the interconnection among the modules 28 via the Ethernet buses 24a is shown. It is noted that while there are a pair of Ethernet busses 24a, 24b provided for redundancy, only one of the pair of busses, here bus 24a is shown in detail. Thus, there are four modules 28 shown for each one of the four chassis 200. Each module 28 includes a pair of Ethernet I/O adapter card (EI/O) which is can be plugged into the motherboard 67 and which is in one of the slots 84, 86, as described above in connection with FIG. 5E. Each module 28 also includes a server interconnect printed circuit board 68, as described above. The server interconnect printed circuit board 68 have a pair of redundant Ethernet transceivers (XCVRs) mounted to it and has a Teradyne HDM connector 93 adapted for plugging into a mating Teradyne HDM connector 254a–254d mounted to the backplane $30_1$–$30_4$.

The strip conductors 262F, 262R are connected to pins 272, 274 of the HDM connectors 254a–254d, as shown and as described above in connection with FIGS. 13A, 13B. The pins 272, 274 electrically connect to the corresponding mating pin of the Teradyne connector 93 mounted to the server interconnect printed circuit board 68. In this way, the modules 28 are internally interconnected through the Ethernet bus 24a (or the redundant Ethernet bus 24b). That is, the strip transmission line passes from one processing unit module 28 to another module 28 in a daisy-chain, or serial manner connecting the four modules 28 plugged into each one of the backplanes $30_1$–$30_4$. The distance between each pair of directly connected Ethernet XCVRs must be greater than 20 inches therefore, the strip transmission line meanders about the backplane as shown in FIGS. 13A, 13B. It is noted that one of the coaxial connectors, here connector 270a of backplane 30l is terminated in a matching impedance, here a 50 ohm resistor 290. The other one of the coaxial connectors 270b of backplane $30_1$ is coupled to the coaxial connector 270a of the next backplane $30_2$ by a coaxial connector 292 and coaxial jumper cable, as indicated. It is to be noted that this coaxial connector 270b is not terminated in a matched 50 resistor. The process repeats until the last coaxial connector 270b of backplane $30_4$ is terminated in a matched impedance, here 50 ohm resistor, as shown, thereby serially connecting the 14 data servers $20_1$–$20_{14}$ and two control stations $22_1$, $22_2$, as shown.

CABLE MANAGEMENT SYSTEM

Figure 14A:
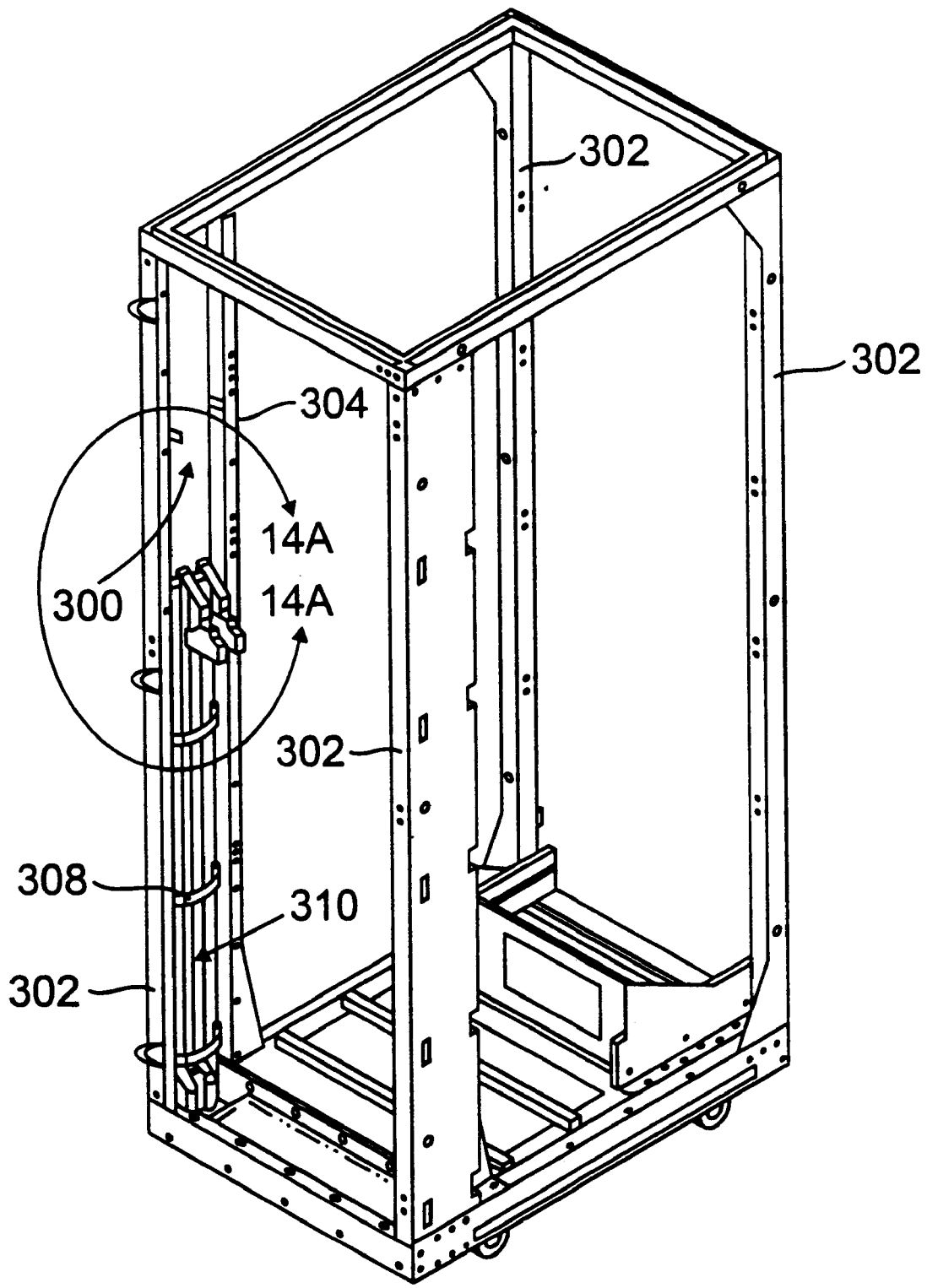
FIG. 14A is a perspective view of the cabinet shown in FIG. 2, such view showing a cable management system according to the invention.
Figure 14C:
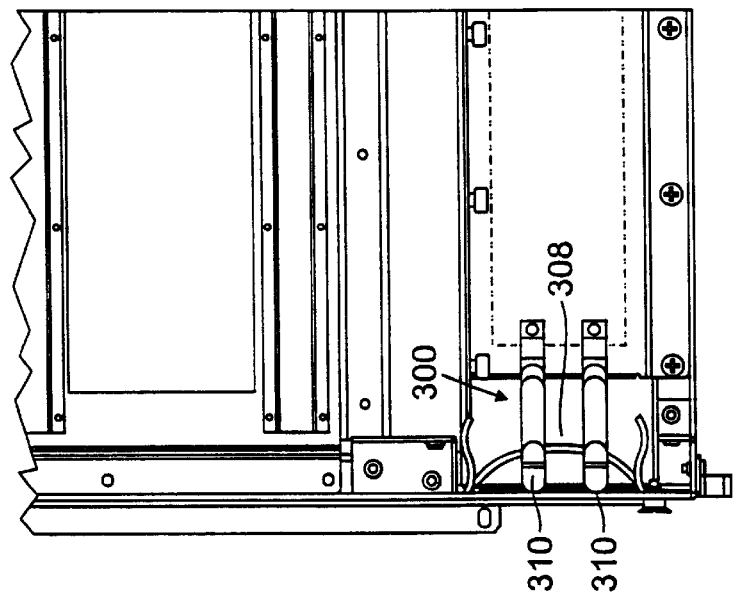
FIG. 14C is a top view of the cable management system.
Figure 14B:
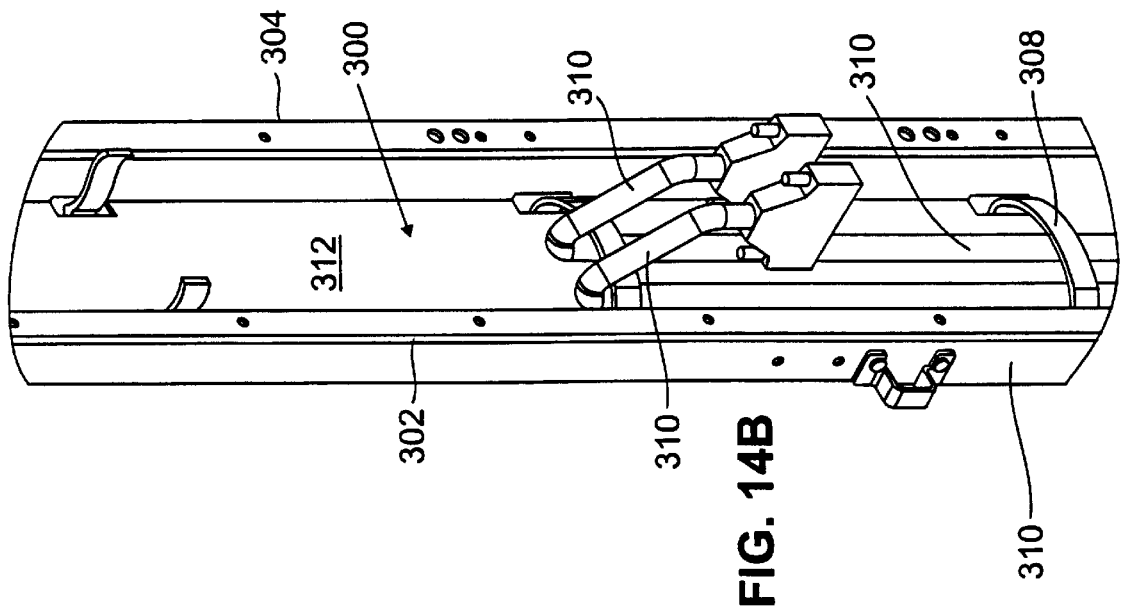
FIG. 14B is an exploded view of a portion of the drawing in FIG. 11A such portion being inclosed by a circle labelled 14B—14B in FIG. 14A.

"Front-end" (i.e. network 14, FIG. 1) and "back-end" (i.e., storage system 12) cables attached to the I/O adapter cards in slots 1–8 or 3–8, as the case may be, via the front of the data mover or control station module enclosure 28. The cabling is achieved through a cable management system. More particularly, cabling is achieved through front, side positioned cable channels 300, shown in FIG. 3B and to be described in connection with FIGS. 14A–14C. The frame of the cabinet 18, shown in FIG. 14A, has provided in the left and right front regions thereof cable channels 300. Each channel 300 includes one of four vertical edge struts 302 at each of the four corners of the cabinet 18, as shown, and an additional vertically extending strut 304. Connected to bridge the additional struts 304 and the corner strut 302 are vertically spaced straps 308, as shown. Each of the straps 308 has mating Velcro fasteners, not shown, at ends thereof. The rear portion of each strap 308 is looped through slots formed in the channel 300 to secure the strap 308 to the channel. When unfastened, the cables, such as cables 310, are manually held against the rear wall 312 of the channel 300 and then the cables 310 are secured in the channel 300 by manually fastening the ends of the straps 308 together, as shown. Such arrangement provides structure for neatly routing the cables 310 through the cabinet 18 at only the added cost of the fasteners since the frame is required anyway.

POWER MANAGEMENT SYSTEM 40 WITH REDUNDANT, EXTERNAL, HOT REPLACEABLE BATTERY CHARGERS

The power management system 40 is shown schematically in FIG. 6. The system includes dual (i.e., redundant) AC power lines 37a, 37b feeding the Emergency Power Off (EPO) box 37. The EPO 37 is electrically connected to the L-shaped printed circuit board connector 44. The L-shaped printed circuit board 44 is electrically connected to the backplanes $30_1$–$30_4$. Also electrically connected to the L-shaped printed circuit board 44 are the pair of redundant, independently, hot replaceable battery chargers 48a, 48b and six AC/DC converters 38. The AC/DC converters 38 are fed AC power from the AC lines 37a, 37b through the EPO 42. The L-shaped printed circuit board 44 distributes DC to the pair of battery chargers 48a, 48b and DC, here 48 volts to the module 28 (i.e., the server interconnect printed circuit boards 68), via the backplanes $30_1$–$30_4$ as discussed above.

It is noted that while provision has been made to provide a Faraday cage that houses six AC-to-DC converters 38 to thereby provide a 5 plus 1 redundant power supply configuration.

The system can still operate in the event of a failure of one of the AC-DC converters 38. The total number of AC-to-DC converters with the server 10 is six. Here, in FIG. 6 only four are shown; two are used for expansion purposes and four are used for a fully configured system. A minimum redundant configuration would be 1+1 AC-to-DC converters 38 and a maximum redundant configuration would be 3+1 AC-to-DC converters 38. The control stations 20 can detect the presence of all of the system components (e.g., processing unit modules 28, Ac-Dc converters 38, COMMBDs, etc.) and can algorithmically determine if there are enough AC-DC converters 38 to power the server 10 before power is actually applied to any of the other system modules 28.

A mechanical enclosure provides a Faraday cage for EMI emissions. Empty I/O adapter card slots require small filler panels to prevent the leakage EMI. The mechanical case of the module 28 also provides ESD protection to the internal printed circuit boards, SIMMs and disk drive (i.e., the control stations 22 have internal floppy and hard disk drives). Each COMMBD 54, as noted above, is adapted to sense a variety of conditions, including: which data movers are present in each data mover backplane; which backplanes are present; whether there are terminators on the backplane; how many battery chargers there are and whether the cables are plugged in; EPO presence or absence; the number of power supplies (i.e., one to six); mux board 53 presence or absence; CDROM presence or absence. The L-shaped printed circuit board 44 is, as noted above, the wiring backbone of the system. There are two facets to the L-shaped printed circuit board 44, as noted above: there are connections on the L-shaped printed circuit board 44 itself; and, there is a connector plate, not shown, behind the L-shaped printed circuit board 44 for plugging in the EPO box 42 and chargers 38 allowing for "quick-disconnect" of the batteries 47 and chargers 48a, 48b. The connector plate has mating connectors that mate to the EPO 42 and chargers 38. There are also ribbon cables 31, as noted above, that come out of the L-shaped printed circuit board 44 to electrically connect to the backplanes $30_1$–$30_4$. Logically, then, the L-shaped printed circuit board 44 connects to the EPO box 37 and the chargers 48a, 48b, but it does so through a series of cables having other ends fixed to the modules 28 (and routed through the channels 300) so that the modules 28 can be removed.

OPERATING SYSTEM SOFTWARE BOOT PROGRAM EXECUTION METHOD

Figure 2:
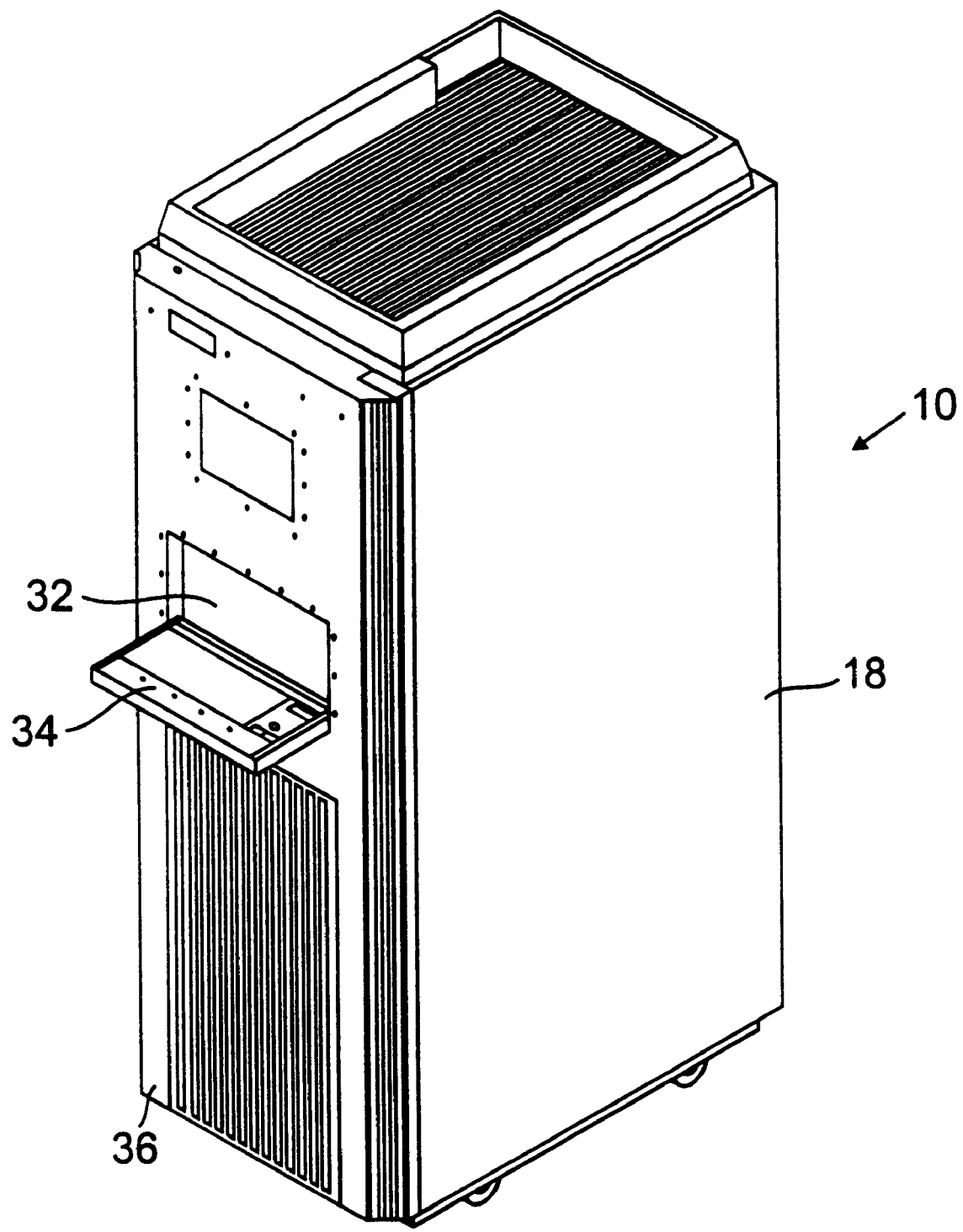
FIG. 2 is a drawing of the data server of FIG. 1.
Figure 15:
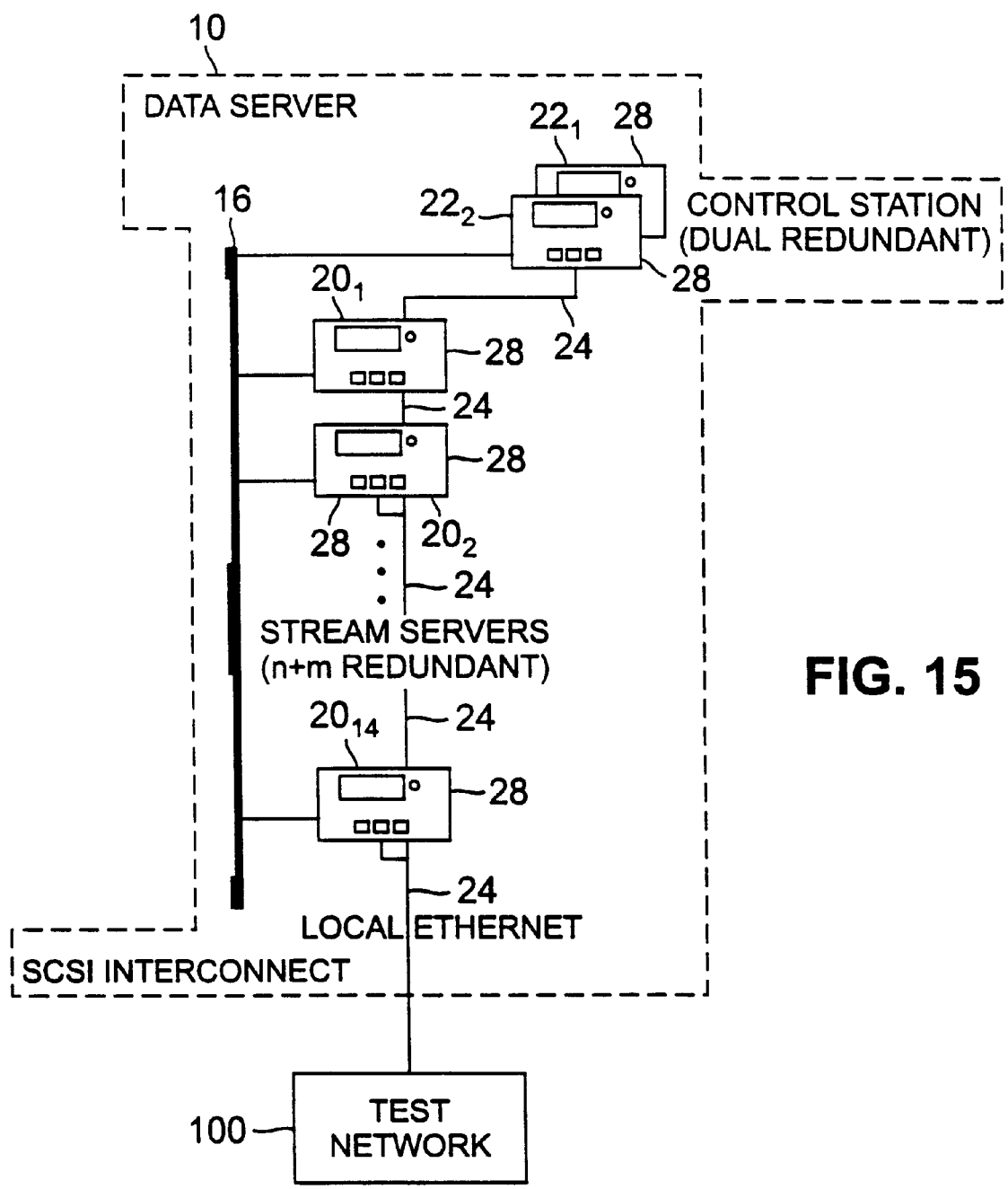
FIG. 15 is a diagram of the server of FIG. 2 connected to a test network during factory test.
Figure 16:
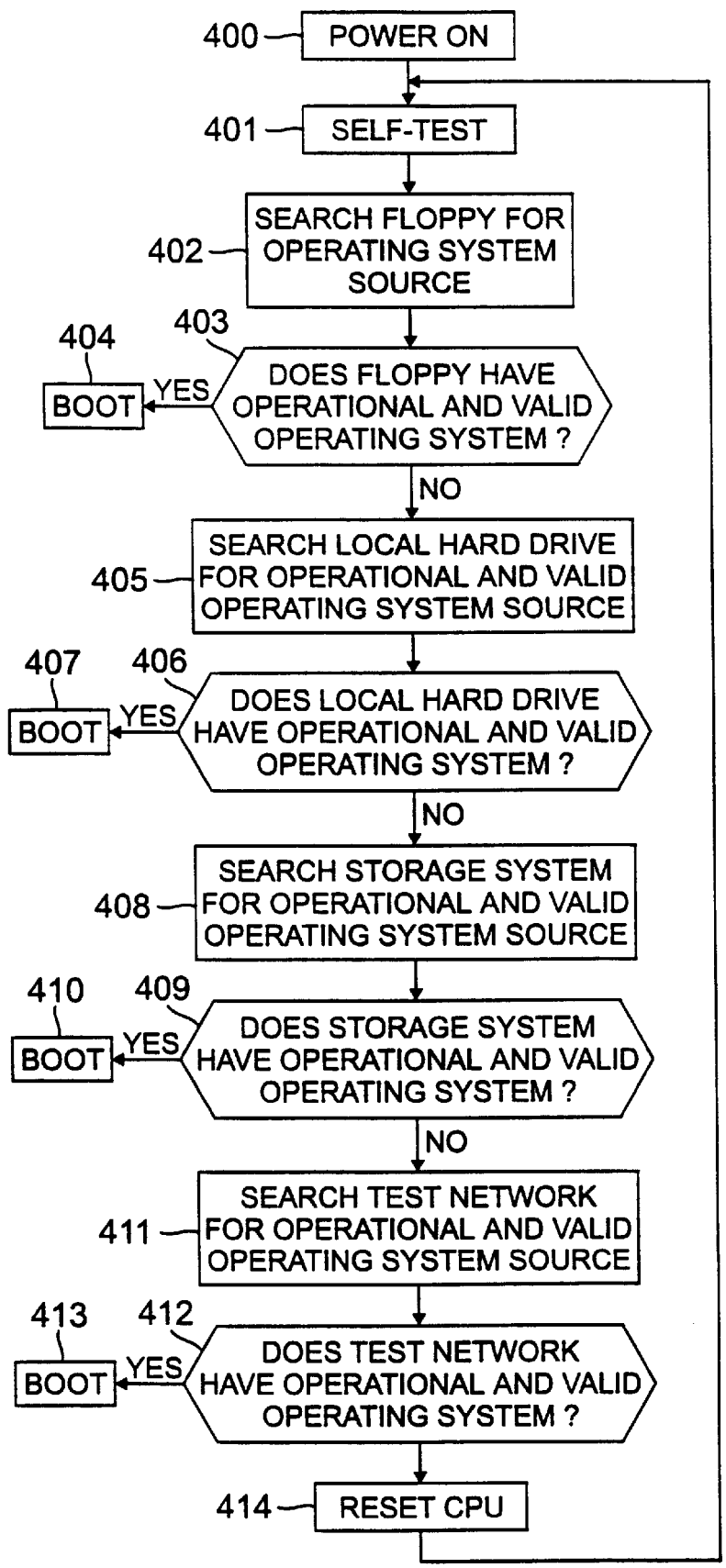
FIG. 16 is a flow diagram of a method, according to the invention, for booting an operating system software into a main memory of each of the processing unit modules used in data movers and control stations of the data server of FIG. 2 during either factory test, as in FIG. 15 or during normal operation, as in FIG. 1.

Referring now to FIG. 15, the server 10 of FIG. 2 is shown connected to a test network 100 via the Ethernet during factory test. Referring also to FIG. 16, a flow diagram of a method for booting an operating system software into the main memory 82a of each of the processing unit modules 28 used in data movers 22 and control stations 24 of the data server 10 of FIG. 2 during either factory test, as in FIG. 15 or during normal operation, as in FIG. 1. It is noted that the integrated cached disk array storage system 12 (FIG. 1) includes valid (e.g., valid format) operating system software, here DOS, which could be booted into the main memory 82a of a processing unit module 28 of the server 10. However, during normal operation (i.e., after delivery of the system to a customer), if there has been a power failure, the time to the have the storage system 12 operating system software available (i.e., valid) for use by the processing unit module 28 after power is restored is much greater than the time the processing unit module 28 CPU 80 is ready to boot such operating system software into its main memory 82a. Thus, in order to prevent the CPU 80 from getting locked into a non-bootable condition because of the unavailability of the storage system 12 operating system software, the method shown in FIG. 16 is used to sequentially restart the CPU 80 in its search for operational and valid operating system software.

In a factory environment, the server 10 may be tested without being connected to either the storage system 12 (FIG. 1) or the network 14 (another possible source of an operational and valid operating system software), as shown in FIG. 15. There, the server 10 processing unit modules 28 are booted with an operating system software stored in the test network 100.

The method may be summarized as follows: A program stored is stored in each one of the processing unit modules 28. The program is executed in parallel in each of the processing unit modules 28. More particularly, a read only memory on the motherboard 67 of each module 28, here a flash memory stores the CPU 80 self-test portion of the program and the remaining portion is stored on the Ethernet I/O adapter card in the processing unit module 28. The program is executed to sequentially search a plurality of possible sources of the operating system software during a boot-up phase. The possible sources of the operating system software are: floppy drive, local hard drive (i.e., a hard drive of the processing unit module 28), CD ROM drive, a drive on the network 14 (FIG. 1), a hard drive of the storage system 12 (FIG. 1), a tape drive, for example. When a possible source of the operating system software is detected, the CPU 80 checks to determine whether such detected source is operational and has a valid boot format. If the detected source is operational and has a valid boot format, the CPU 80 boots the detected operating system software source into the main memory 82a. If the detected source is either non-operational or does not have a valid boot format (i.e., the source is operational but the CPU 80 reports "non-system disk error", for example), the CPU 80 checks the another one of the possible operating system software sources. If all sources are checked and none are either operational nor have a valid boot format, the CPU 80 repeats the aforementioned sequentially search of the possible operating system software sources.

Referring to FIG. 16, the power to the CPU 80 in the processing unit module 28 is turned on (Step 400). The CPU 80 then starts its self-test by executing a program stored in the flash memory ROM in the processing unit module 28 to search for an operational, valid software operating system software Step 401). Here, in this example, CPU 80, in response to the executable program stored in the ROM of the processing unit module 28, sequentially searches a plurality of possible sources of the operating system software during a boot-up phase. More particularly, here the CPU 80 in this example, first searches the floppy drive for an operational and valid operating system software, for example DOS operating system software (Step 402). If, in Step 403, the CPU 80 detects that the floppy drive has an operational and valid operating system software, the CPU 80 boots such operating system software into the main memory 82a (Step 404); if either an operational system is not detected by the CPU 80 on the floppy or is found by the CPU 80 not to be a valid operating system software, the CPU 80 searches another one of the possible sources, here the local hard drive (Step 405). If, in Step 406, the CPU 80 detects that the local hard drive has an operational and valid operating system software (for example, the local hard drive has operational and valid operating system software, the CPU 80 boots such operating system software into the main memory 82a (Step 407); if either an operational system is not detected by the CPU 80 on the local hard drive or if detected is found not by the CPU 80 to be a valid operating system software, the CPU 80 searches another one of the possible sources, here the storage system 12 Step 408). If, in Step 409, the CPU 80 detects that the storage system 12 has an operational and valid operating system software, the CPU 80 boots such operating system software into the main memory 82a (Step 410); if either an operational system is not detected by the CPU 80 on the storage system 12 or if detected is found not by the CPU 80 to be a valid operating system software, the CPU 80 searches another one of the possible sources, here the test network 100 (FIG. 15) (Step 409). If, in Step 411, the test network 100 is used, as in a factory test, the system will boot; however, if the test network 100 is not used, as when the server 12 is at a customer, the program will reset the CPU (Step 414) and returns to Step 401 to again sequentially search for an operational and valid operating system software.

Other embodiments of the invention are within the spirit and scope of the appended claims. For example, the redundant, independently replaceable battery chargers may be used in the memory system 12 to charge a battery in such system 12.

What is claimed is:

1. A printed circuit board, comprising:
   an electrical connector electrically connected to the printed circuit board, the electrical connector having a pair of pins to supply signals and return to the printed circuit board;
   a coaxial connector having a center conductor and an outer conductor;
   a first strip conductor disposed on one surface of a dielectric substrate of the printed circuit board, the first strip conductor being electrically connected to the center conductor of the coaxial connector and to one of the pins of the electrical connector;
   a second strip conductor disposed on an opposite surface of the dielectric substrate of the printed circuit board, the second strip conductor being electrically connected to the outer conductor of the coaxial connector and another one of the pins of the electrical connector;
   the first and second strip conductors being in an overlaying relationship to form a transmission line between the coaxial connector and the electrical connector.

2. The printed circuit board recited in claim 1 wherein the coaxial connector and one of the strip conductors provide an Ethernet bus between the coaxial connector and the electrical connector.

3. The printed circuit board recited in claim 2 wherein the transmission line meanders about the printed circuit board.

4. The printed circuit board recited in claim 3 wherein the transmission line has an AC impedance of substantially 50 ohms and a DC resistance of substantially 1.37 milli-ohms per inch.

5. A printed circuit board, comprising:
   an electrical connector electrically connected to the printed circuit board, the electrical connector having a pair of pins to supply signals and return to the printed circuit board;

a coaxial connector having a center conductor and an outer conductor;

a first strip conductor electrically connected to the center conductor of the coaxial connector and to one of the pins of the electrical connector;

a second strip conductor electrically connected to the outer conductor of the coaxial connector and another one of the pins of the electrical connector;

the first and second strip conductors being separated by a dielectric of the printed circuit board and being disposed in an overlaying relationship to form a transmission line between the coaxial connector and the electrical connector.

* * * * *